US009530721B2

(12) United States Patent
Nishikizawa et al.

(10) Patent No.: US 9,530,721 B2
(45) Date of Patent: Dec. 27, 2016

(54) SEMICONDUCTOR DEVICE

(71) Applicant: Renesas Electronics Corporation, Koutou-ku, Tokyo (JP)

(72) Inventors: Atsushi Nishikizawa, Tokyo (JP); Tadatoshi Danno, Tokyo (JP); Hiroyuki Nakamura, Tokyo (JP); Osamu Soma, Tokyo (JP); Akira Uemura, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/871,769

(22) Filed: Sep. 30, 2015

(65) Prior Publication Data
US 2016/0093557 A1 Mar. 31, 2016

(30) Foreign Application Priority Data

Sep. 30, 2014 (JP) .................................. 2014-202416

(51) Int. Cl.
*H01L 23/48* (2006.01)
*H01L 23/495* (2006.01)
(Continued)

(52) U.S. Cl.
CPC ..... *H01L 23/49503* (2013.01); *H01L 23/3114* (2013.01); *H01L 23/4952* (2013.01);
(Continued)

(58) Field of Classification Search
CPC H01L 23/585; H01L 23/3114; H01L 23/4952; H01L 23/49503; H01L 23/49575
(Continued)

(56) References Cited

U.S. PATENT DOCUMENTS 8,368,192 B1 * 2/2013 Chen ................. H01L 23/49531
257/676
2003/0141579 A1 * 7/2003 Oda .................. H01L 23/49575
257/678
(Continued)

FOREIGN PATENT DOCUMENTS

| EP | 0 952 613 A1 | 10/1999 |
|---|---|---|
| GB | 2 219 435 A | 12/1989 |
| JP | H03-50842 A | 3/1991 |
| JP | H06-232196 A | 8/1994 |
| JP | H07-193186 A | 7/1995 |
| JP | 2009-054850 A | 3/2009 |

(Continued)

OTHER PUBLICATIONS

Extended European Search Report issued Feb. 15, in European Application No. 15186686.0.

*Primary Examiner* — Nitin Parekh
(74) *Attorney, Agent, or Firm* — Shapiro, Gabor and Rosenberger, PLLC

(57) ABSTRACT

A semiconductor device includes first and second semiconductor chips, a plurality of leads, a plurality of wires, and a sealing body sealing those components. A first pad electrode, a second pad electrode, and an internal wiring electrically connected to the first and second electrode pads are formed on a main surface of the first semiconductor chip. A third pad electrode of the second semiconductor chip is electrically connected to the first electrode pad of the first semiconductor chip via a first wire, and the second electrode pad of the first semiconductor chip is electrically connected to a first lead via a second wire. A distance between the first lead and the first semiconductor chip is smaller than a distance between the first lead and the second semiconductor chip. The first electrode pad, the second electrode pad and the internal wiring are not connected to any circuit formed in the first semiconductor chip.

10 Claims, 36 Drawing Sheets

(51) Int. Cl.
*H01L 23/31* (2006.01)
*H01L 23/58* (2006.01)
*H01L 25/065* (2006.01)

(52) U.S. Cl.
CPC .. *H01L 23/49562* (2013.01); *H01L 23/49575* (2013.01); *H01L 23/585* (2013.01); *H01L 25/0655* (2013.01); *H01L 2224/05554* (2013.01); *H01L 2224/32245* (2013.01); *H01L 2224/33505* (2013.01); *H01L 2224/45144* (2013.01); *H01L 2224/45147* (2013.01); *H01L 2224/48111* (2013.01); *H01L 2224/48137* (2013.01); *H01L 2224/48247* (2013.01); *H01L 2224/4903* (2013.01); *H01L 2224/73265* (2013.01); *H01L 2224/92247* (2013.01); *H01L 2924/181* (2013.01)

(58) Field of Classification Search
USPC .................................. 257/784, 723, 773, 786
See application file for complete search history.

(56) References Cited

U.S. PATENT DOCUMENTS

| | | | |
|---|---|---|---|
| 2005/0287701 A1* | 12/2005 | Huang | H01L 23/49575 438/106 |
| 2006/0006432 A1 | 1/2006 | Shiraishi et al. | |
| 2007/0222086 A1 | 9/2007 | Briggs | |
| 2009/0057915 A1 | 3/2009 | Koike et al. | |
| 2010/0052125 A1 | 3/2010 | Sasaki et al. | |
| 2013/0082334 A1* | 4/2013 | Nakamura | H01L 23/49524 257/401 |
| 2014/0145318 A1* | 5/2014 | Otremba | H01L 23/49503 257/670 |

FOREIGN PATENT DOCUMENTS

| | | |
|---|---|---|
| JP | 2010-080914 A | 4/2010 |
| JP | 2012-080118 A | 4/2012 |

* cited by examiner

US 9,530,721 B2

SEMICONDUCTOR DEVICE

CROSS-REFERENCE TO RELATED APPLICATION

The present application claims priority from Japanese Patent Application No. 2014-202416 filed on Sep. 30, 2014, the content of which is hereby incorporated by reference into this application.

TECHNICAL FIELD OF THE INVENTION

The present invention relates to a semiconductor device and is preferably used, for example, in a semiconductor device including a plurality of semiconductor chips arranged side by side in a packaged structure.

BACKGROUND OF THE INVENTION

A semiconductor device in the form of a package structure can be manufactured by mounting a semiconductor chip on a die pad, electrically connecting pad electrodes and leads of the semiconductor chip via wires, and sealing the pad electrodes and leads with a resin.

Japanese Laid-Open Patent Publication No. 2012-80118 (Patent Document 1) describes a technique related to a semiconductor device including a microcomputer chip and a SDRAM chip that are arranged side by side in a packaged structure.

Japanese Laid-Open Patent Publication No. 2010-80914 (Patent Document 2) describes a technique related to a semiconductor device including a power semiconductor chip and a semiconductor chip for controllers that are arranged side by side in a packaged structure.

Japanese Laid-Open Patent Publication No. 2009-54850 (Patent Document 3) describes a technique related to a stack-mounting type semiconductor device in which a microcomputer IC chip is mounted on a driver IC chip.

SUMMARY OF THE INVENTION

Improving the reliability of a semiconductor device including a plurality of semiconductor chips arranged side by side in a packaged structure as much as possible has been in demand.

The above and other objects and novel characteristics of the present invention will be apparent from the description of the present specification and the accompanying drawings.

According to one embodiment of the present invention, a semiconductor device includes a first semiconductor chip having a main surface and a back surface opposite the main surface, a second semiconductor chip having a main surface and a back surface opposite the main surface, a plurality of leads, a plurality of wires, and a sealing body sealing those components. A first pad, a second pad, and a first wiring electrically connected to the first and second pads are formed on the main surface of the first semiconductor chip, and a third pad is formed on the main surface of the second semiconductor chip. The third pad of the second semiconductor chip is electrically connected to the first pad of the first semiconductor chip via a first wire, and the second pad of the first semiconductor chip is electrically connected to a first lead via a second wire. A distance between the first lead and the first semiconductor chip is smaller than a distance between the first lead and the second semiconductor chip. The first pad, the second pad, and the first wiring are not connected to any circuit formed in the first semiconductor chip.

According to one embodiment of the present invention, the reliability of the semiconductor device can be improved.

BRIEF DESCRIPTIONS OF THE DRAWINGS

DESCRIPTIONS OF THE PREFERRED EMBODIMENTS

In the following embodiment, when there is the necessity for convenience, the explanation will be divided into plural sections or plural embodiments. However, unless otherwise specified, they are not irrelevant with each other but they have a relationship that one is a modified example, an application, detailed explanation, and supplementary explanation of a part or all of the other. In the following embodiment, when the number of elements, etc. (including the number, a numeric value, quantity, a range, etc.) is referred to, the number of elements may be not restricted to a specific number but may be more than or less than the specific number, except for the case where it is specified in particular or clearly restricted to the specific number in principle. In the following embodiment, a component (including an element step etc.) referred to is not always essential, except for the case where it is specified in particular or clearly considered to be essential in principle. Similarly, in the following embodiment, when referring to the shape, positional relationship, etc. of a component etc, what is analogous or similar substantially to the shape, positional relationship etc. shall be included, except for the case where it is specified in particular or clearly not considered to be so in principle. The same goes for the numerical value and the range described above.

Hereinafter, embodiments of the present invention will be described in detail with reference to the accompanying drawings. Note that members having the same function are denoted by the same reference symbols throughout all drawings for describing the embodiments, and the repetitive description thereof will be omitted. In addition, the description of the same or similar portions is not repeated in principle unless particularly required in the following embodiments.

Further, in some drawings used in the embodiments, hatching is omitted in some cases even in a cross-sectional view so as to make the drawings easy to see. Still further, hatching is used in some cases even in a plan view so as to make the drawings easy to see.

Embodiments

A semiconductor device according to one embodiment of the present invention will be described with reference to drawings.

<Structure of Semiconductor Device (Semiconductor Package)>

Figure 1:
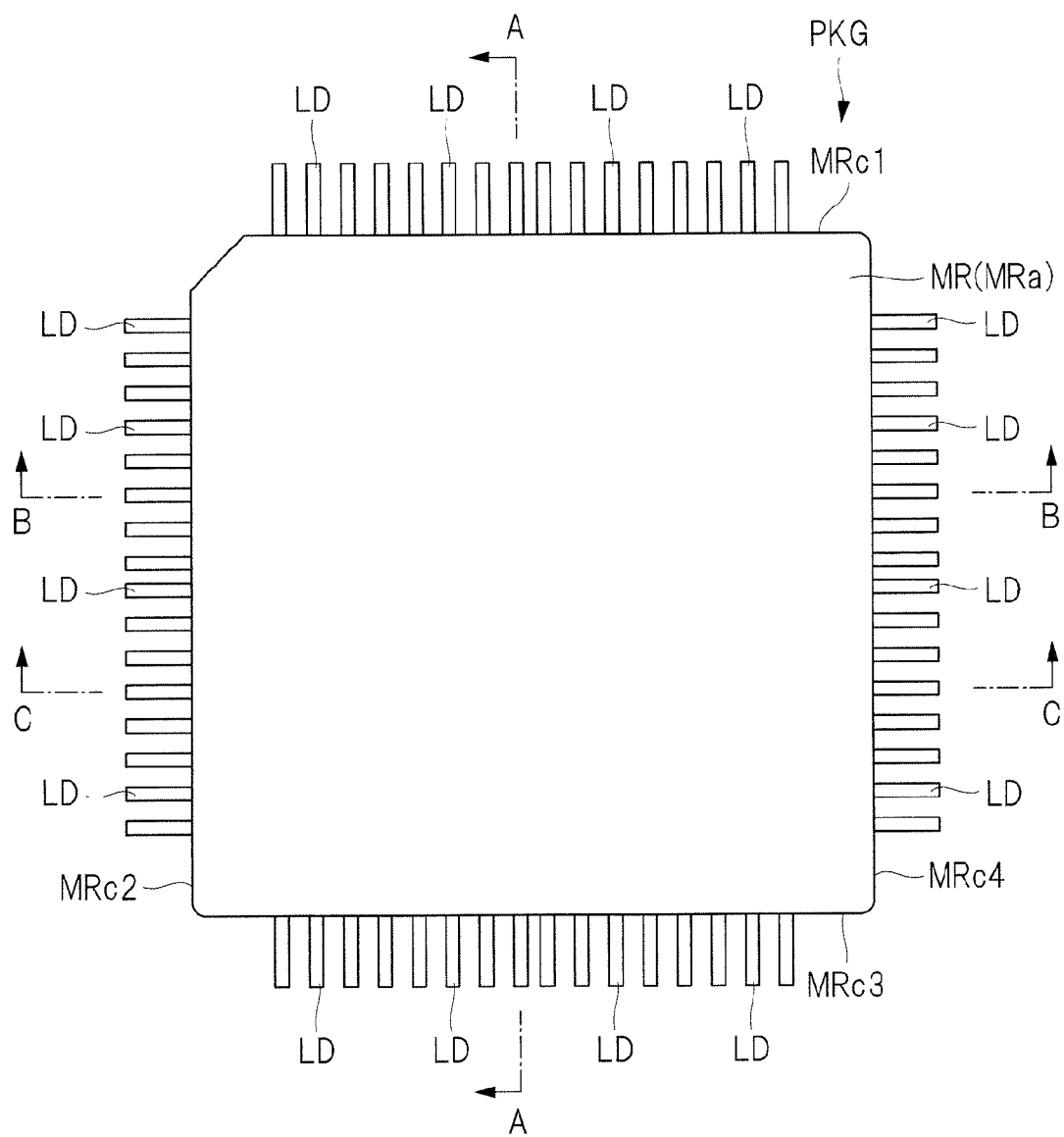
FIG. 1 is a top view of a semiconductor device according to one embodiment of the present invention.
Figure 2:
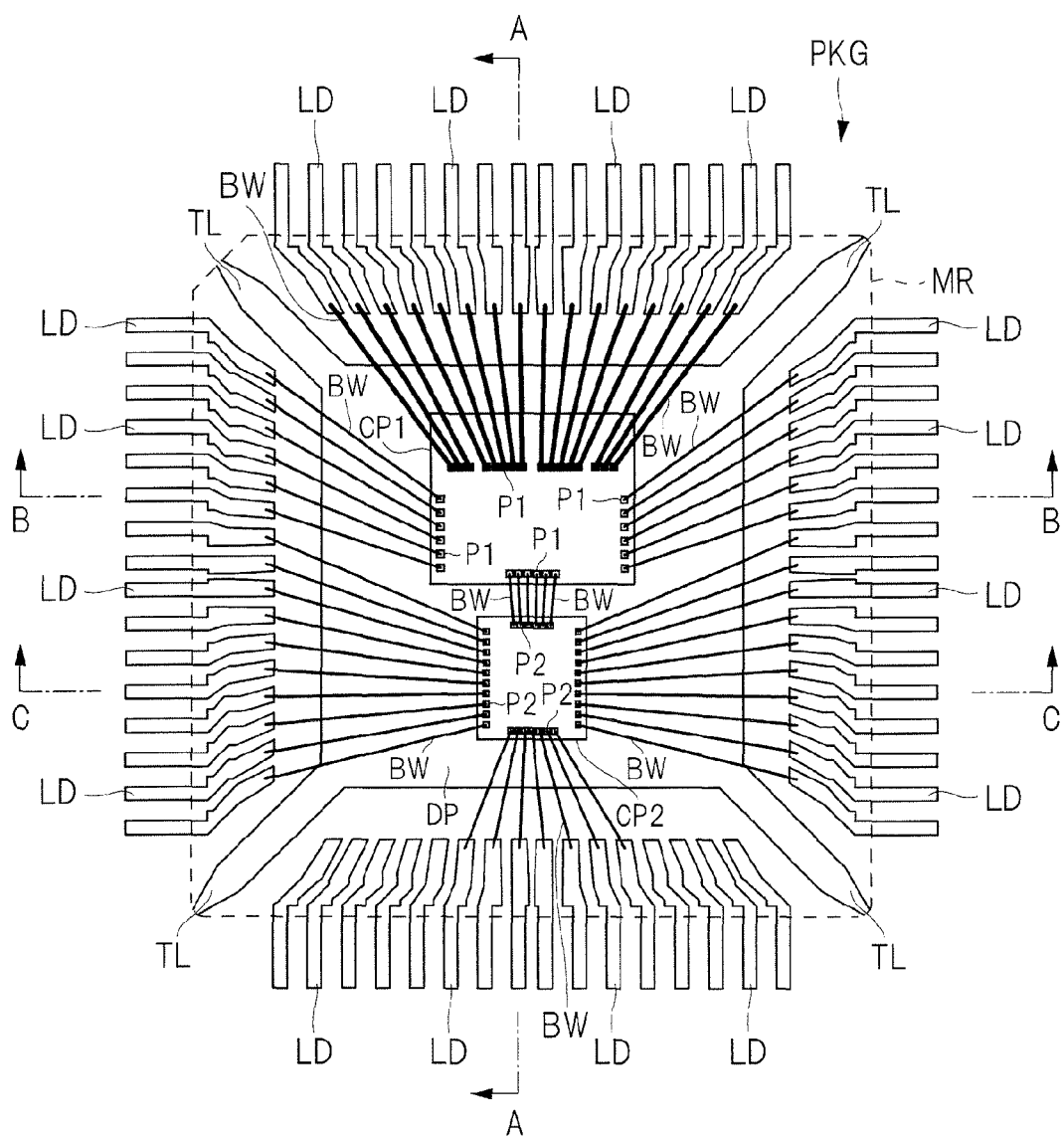
FIG. 2 is a plan perspective view of the semiconductor device according to one embodiment of the present invention.
Figure 3:
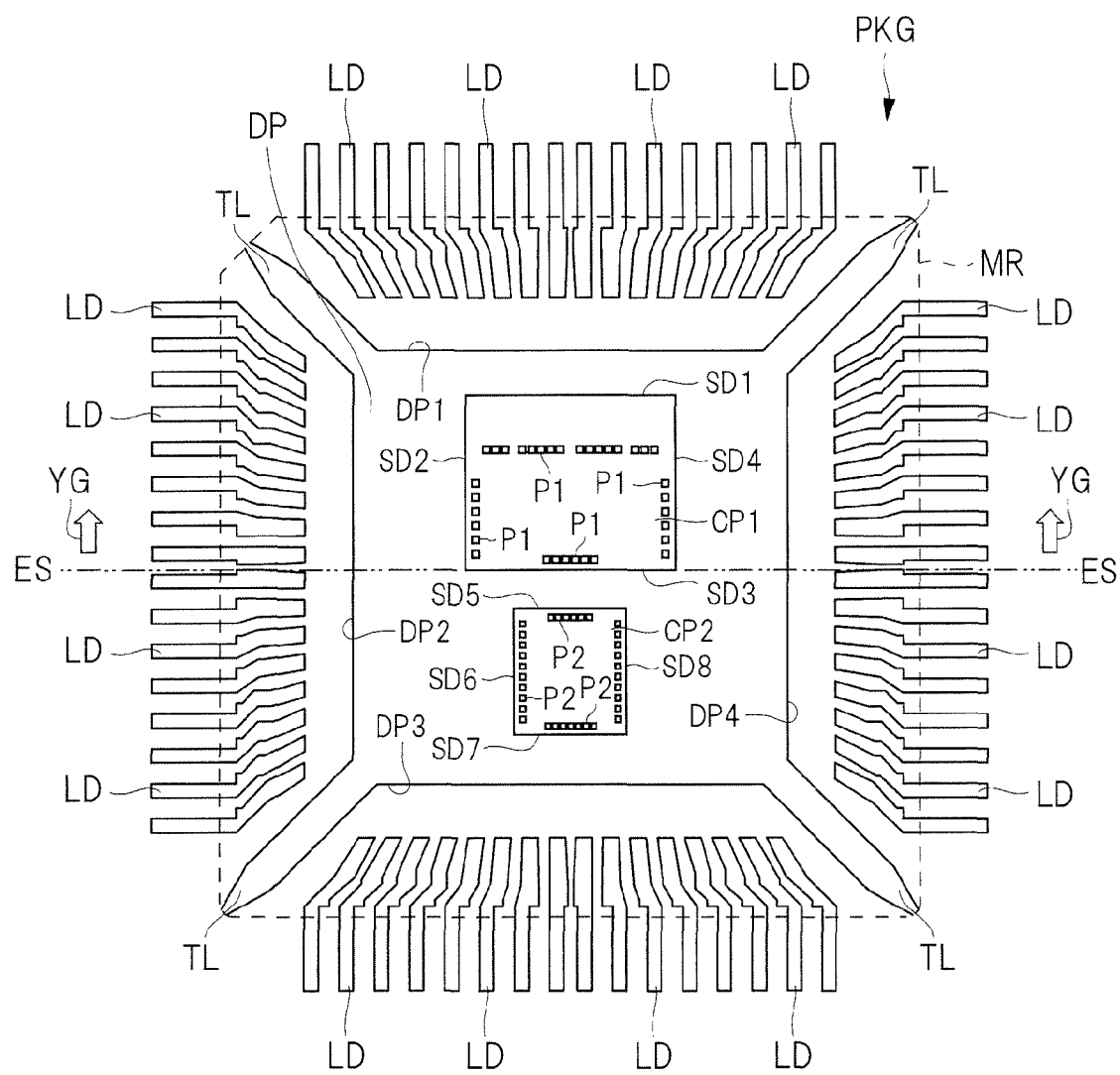
FIG. 3 is a plan perspective view of the semiconductor device according to one embodiment of the present invention.
Figure 4:
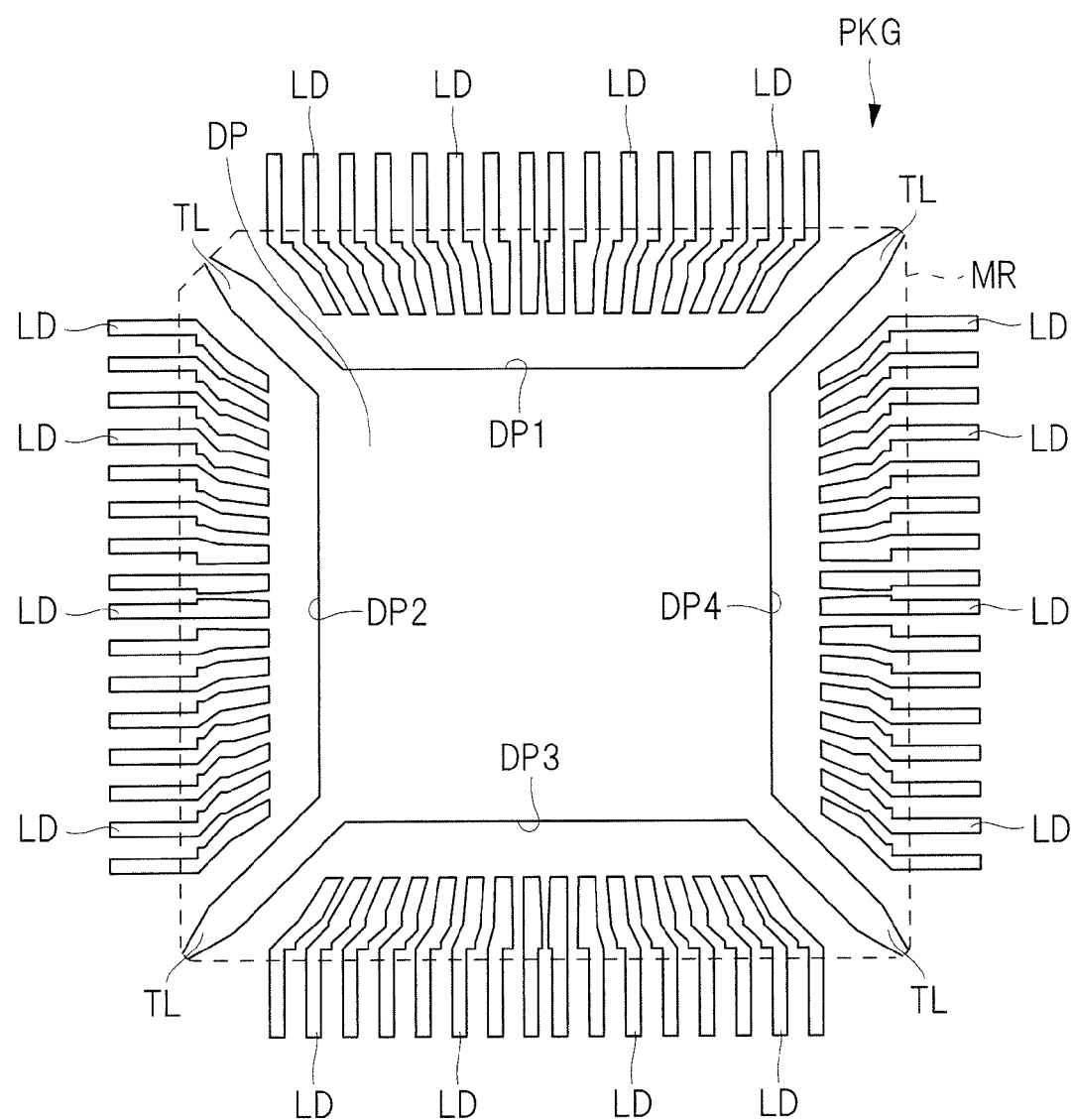
FIG. 4 is a plan perspective view of the semiconductor device according to one embodiment of the present invention.
Figure 5:
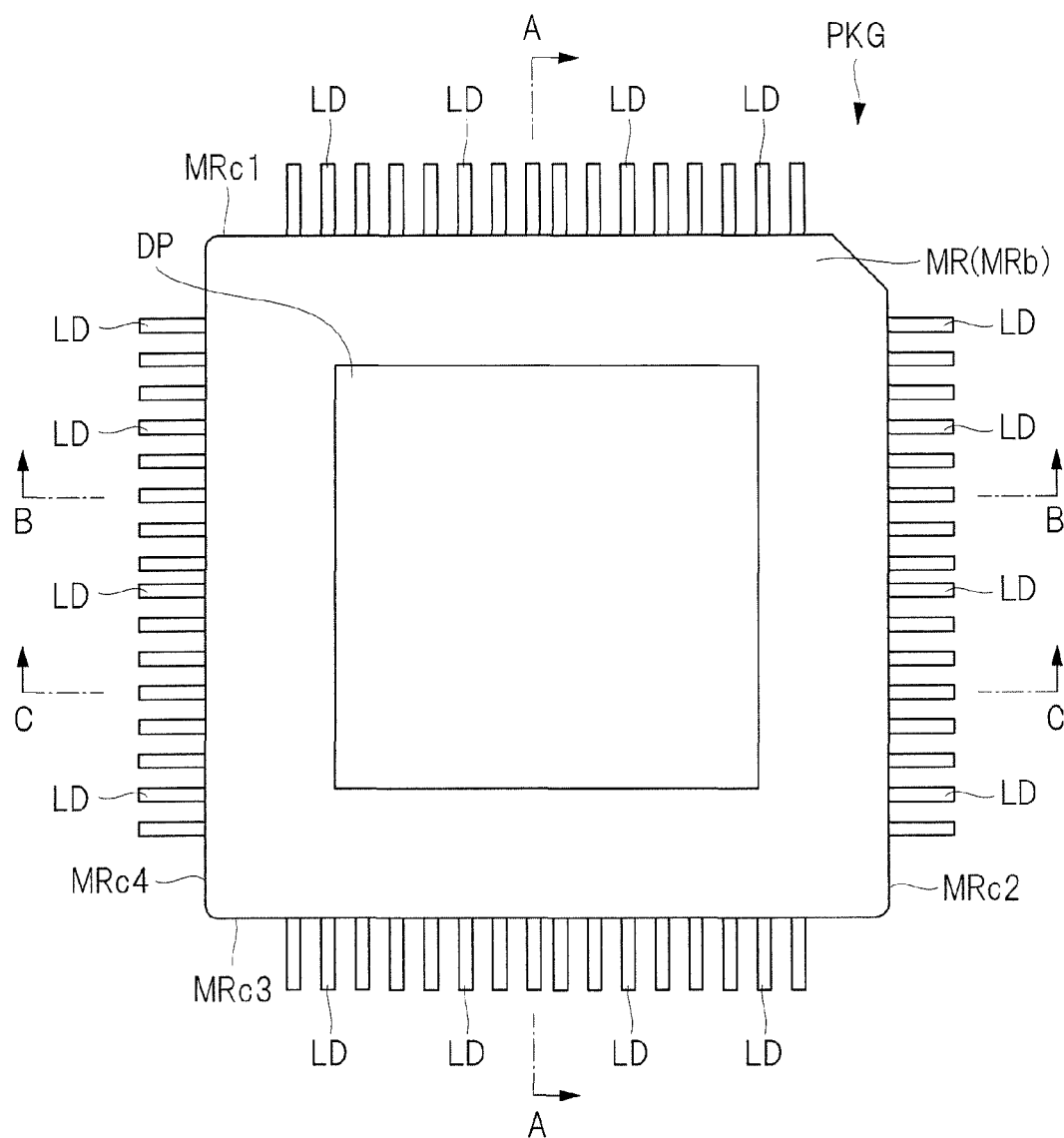
FIG. 5 is a bottom view of the semiconductor device according to one embodiment of the present invention.
Figure 6:
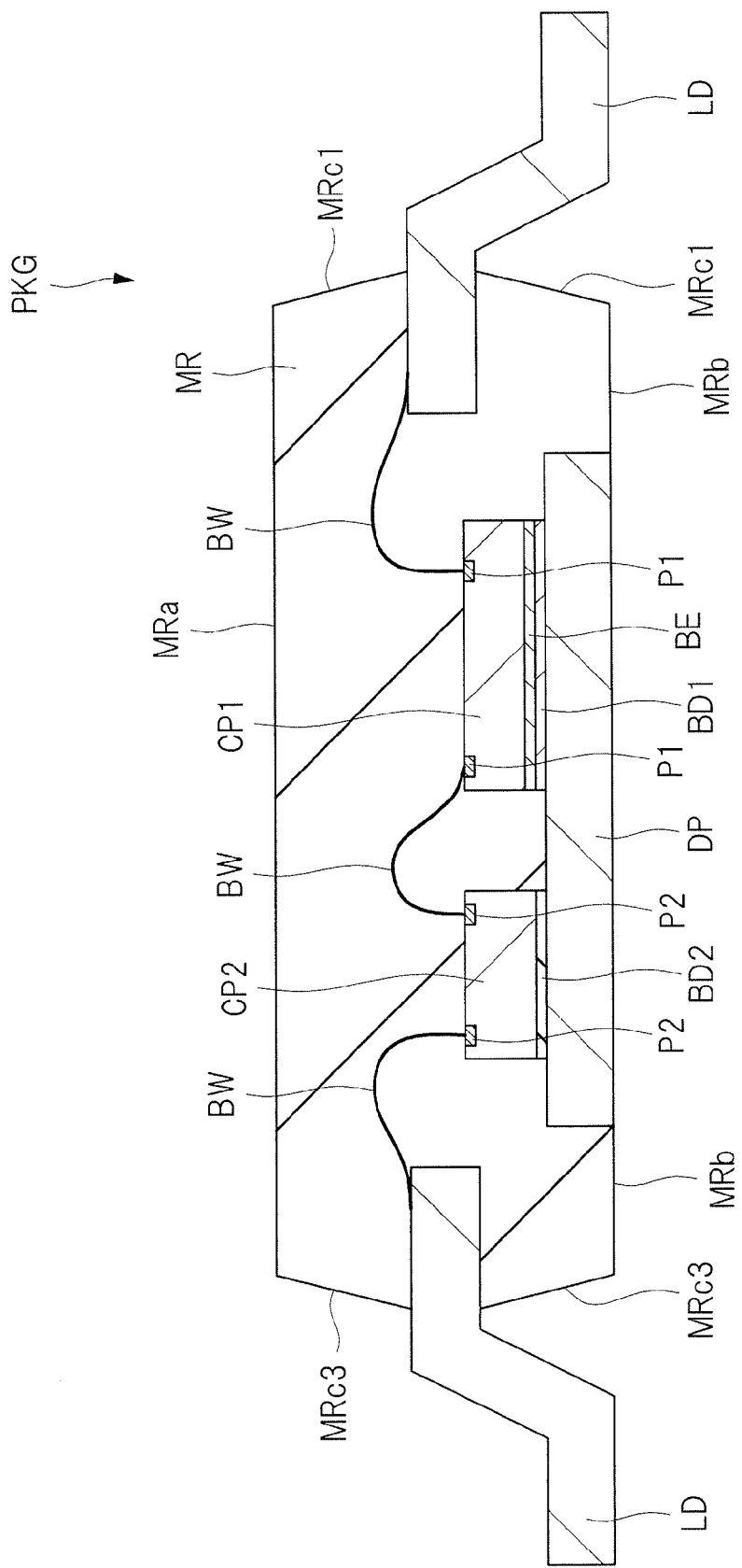
FIG. 6 is a cross-sectional view of the semiconductor device according to one embodiment of the present invention.
Figure 7:
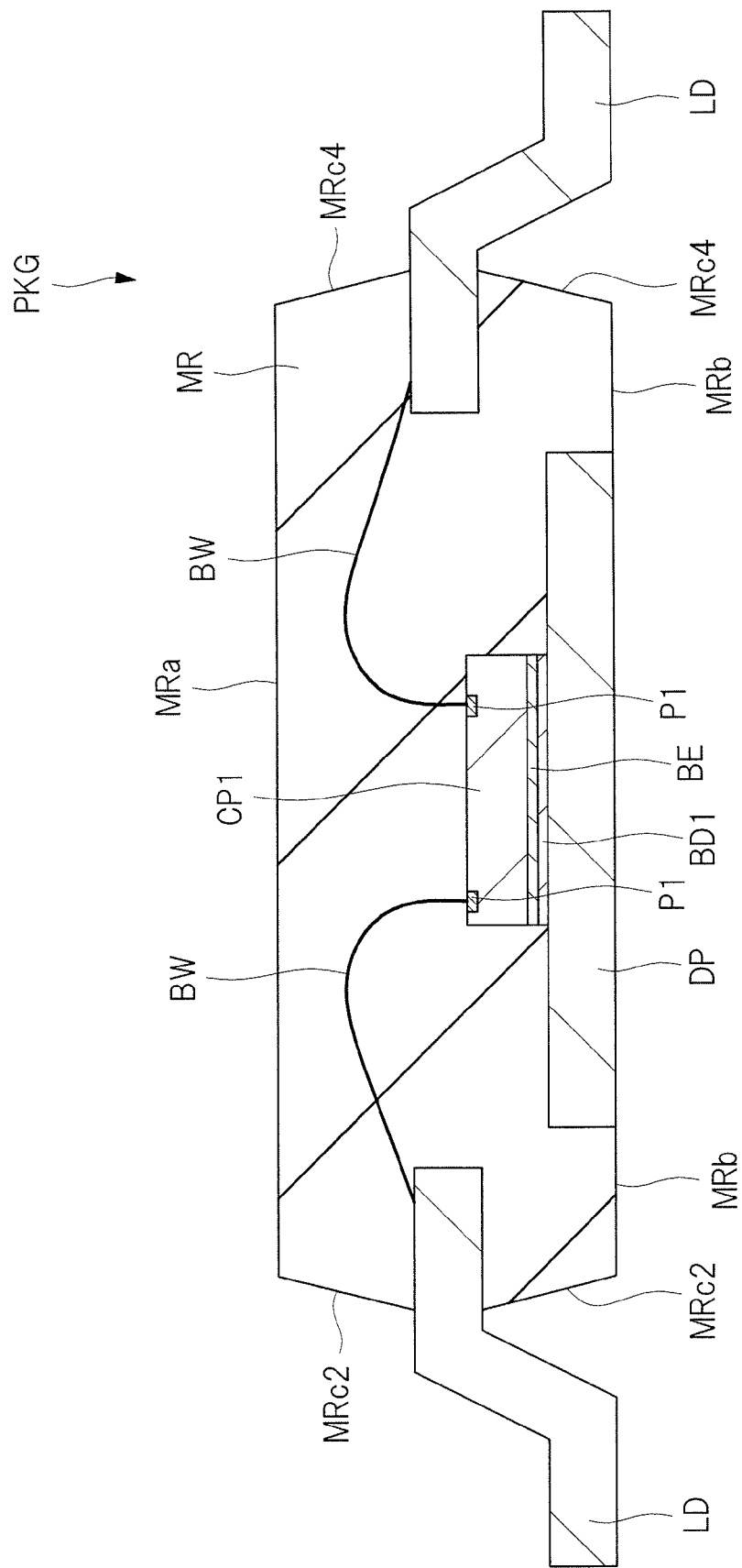
FIG. 7 is a cross-sectional view of the semiconductor device according to one embodiment of the present invention.
Figure 8:
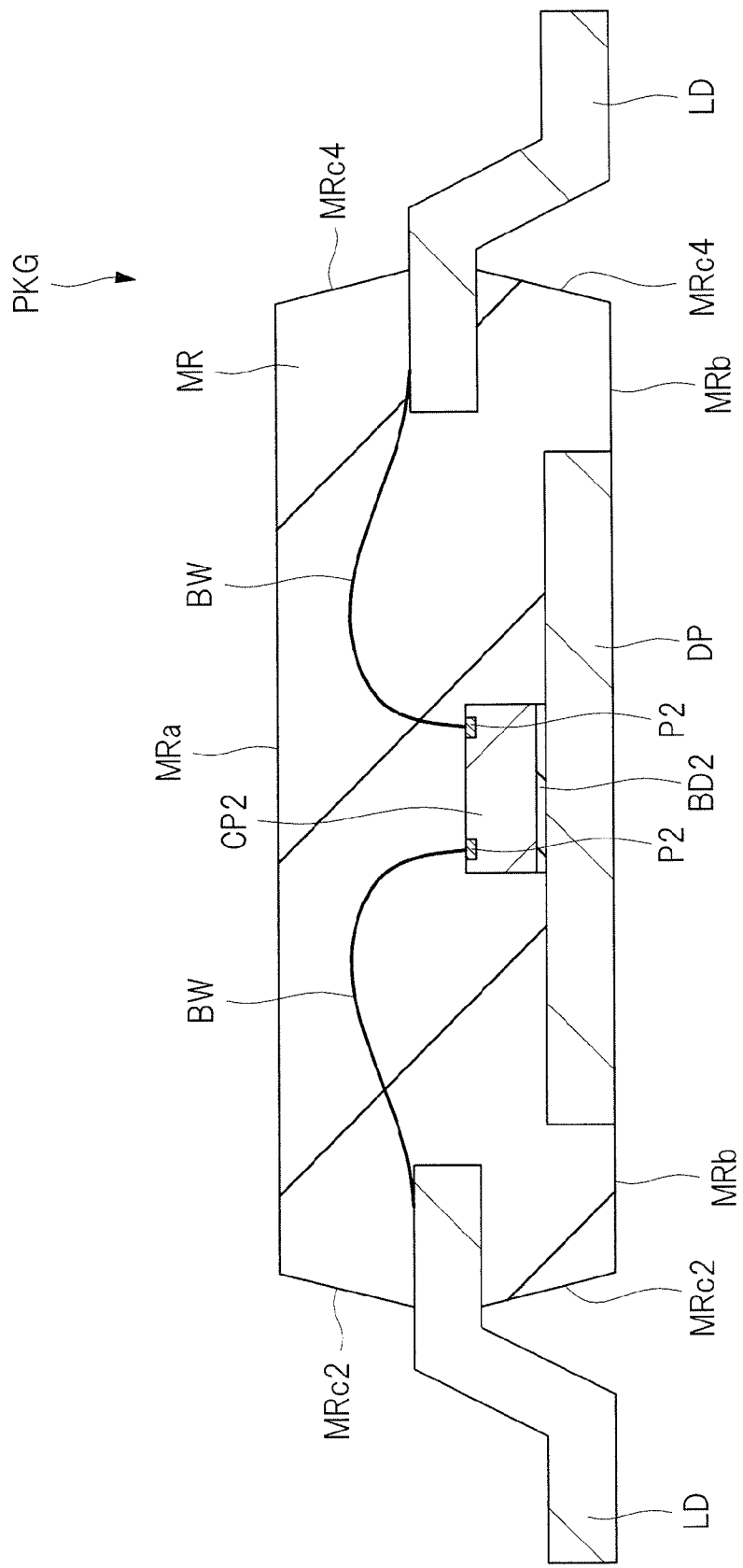
FIG. 8 is a cross-sectional view of the semiconductor device according to one embodiment of the present invention.
Figure 9:
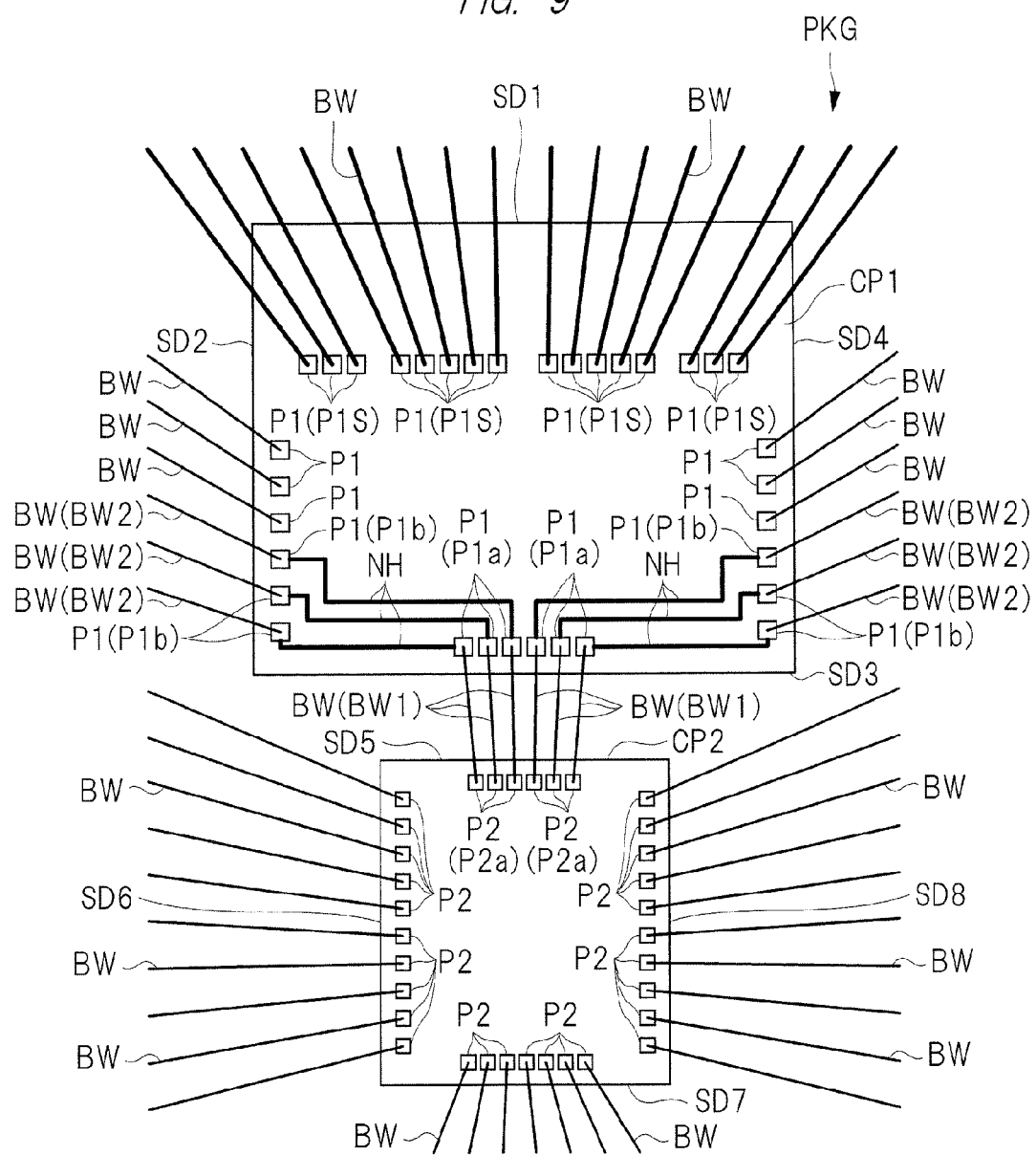
FIG. 9 is a partially enlarged plan perspective view of the semiconductor device according to one embodiment of the present invention.

FIG. 1 is a top view of a semiconductor device PKG according to one embodiment of the present invention, FIGS. 2 to 4 are plan perspective views of the semiconductor device PKG, FIG. 5 is a bottom view (rear view) of the semiconductor device PKG, and FIGS. 6 to 8 are cross-sectional views of the semiconductor device PKG. FIG. 2 is a plan perspective view of an upper surface side of the semiconductor device PKG seeing through a sealing portion MR. FIG. 3 is a plan perspective view of the upper surface side of the semiconductor device PKG seeing through (omitting) wires BW of FIG. 2. FIG. 4 is a plan perspective view of the upper surface side of the semiconductor device PKG seeing through (omitting) semiconductor chips CP1 and CP2 of FIG. 3. In FIGS. 1 to 4, the semiconductor device PKG is set in the same direction. In FIGS. 2 to 4, the location of the outer periphery of the sealing portion MR is indicated by a dotted line. A cross-section of the semiconductor device PKG that is taken along an A-A line of each of FIGS. 1 and 2 to 5 roughly corresponds to FIG. 6, a cross-section of the semiconductor device PKG that is taken along a B-B line of each of FIGS. 1 and 2 to 5 roughly corresponds to FIG. 7, and a cross-section of the semiconductor device PKG that is taken along a C-C line of each of FIGS. 1 and 2 to 5 roughly corresponds to FIG. 8. FIG. 9 is a partially enlarged plan perspective view showing a part of FIG. 2 in an enlarged manner. In FIG. 3, an extension line ES of a side SD3 of the semiconductor chip CP1 is indicated by a two-dot chain line.

The semiconductor device (semiconductor package) PKG of this embodiment shown in FIGS. 1 to 9 is a resin-sealed semiconductor device in the form of a semiconductor package, being shown as a semiconductor device in the form of a QFP (Quad Flat Package) structure. A configuration of the semiconductor device PKG will hereinafter be described, referring to FIGS. 1 to 9.

The semiconductor device PEG of this embodiment shown in FIGS. 1 to 9 includes the semiconductor chips CP1 and CP2, a die pad DP mounting the semiconductor chips CP1 and CP2 thereon, a plurality of leads LD made of a conductor, a plurality of wires BW electrically connecting a plurality of pad electrodes P1 and P2 of the semiconductor chips CP1 and CP2 to the plurality of leads LD, and the sealing portion MR sealing these pad electrodes P1 and P2 and leads LD.

The sealing portion (sealing resin portion or sealing body) MR, which is a sealing body, is made of, for example, a resin material such as thermosetting resin material, and may contain a filler. For example, the sealing portion MR may be formed using an epoxy resin containing a filler. To reduce a stress applied to the sealing portion MR, a material other than the epoxy-based resin, e.g., a biphenyl-based thermosetting resin containing a phenol-based hardener, silicone rubber, filler, etc., may be used as the material of the sealing portion MR.

The sealing portion MR has an upper surface (surface) MRa, which is one main surface, a lower surface (back surface or bottom face) MRb, which is a main surface opposite to the upper surface MRa, and side surfaces MRc1, MRc2, MRc3, and MRc4 intersecting the upper surface MRa and lower surface MRb (see FIGS. 1 and 5 to 8). That is, the sealing portion MR has an outer appearance as a thin plate surrounded by the upper surface MRa, the lower surface MRb, and the side surfaces MRc1, MRc2, MRc3, and MRc4. When seen in a plan view, the side surfaces MRc1, MRc2, MRc3, and MRc4 of the sealing portion MR may be regarded as the sides of the sealing portion MR.

The upper surface MRa and lower surface MRb of the sealing portion MR each have a plane shape of, for example, rectangular, and this rectangular (plane rectangular) may have its corners rounded or may have any one of its four corners removed. When the upper surface MRa and lower surface MRb of the sealing portion MR are rectangular in their plane shape, the sealing portion MR has a rectangular (square) plane shape (outer shape) intersecting a direction of its thickness. The side surfaces MRc1, MRc2, MRc3, and MRc4 of the sealing portion MR are positioned such that the side surfaces MRc1 and MRc3 are opposite to each other, the side surfaces MRc2 and MRc4 are opposite to each other, the side surface MRc1 intersects the side surfaces MRc2 and MRc4, and the side surface MRc3 intersects the side surfaces MRc2 and MRc4.

The plurality of leads (lead portions) LD are made of a conductor and should preferably be made of a metal material, such as copper (Cu) or copper alloy. Each of the leads LD has one part sealed in the sealing portion MR and the other part projecting out from a side surface of the sealing portion MR to its outside. In the following description, the part of lead LD that is located in the sealing portion MR is referred to as an inner lead, while the part of lead LD that is located out of the sealing portion MR is referred to as an outer lead.

The semiconductor device PKG of this embodiment has a structure in which a part (outer lead) of each lead LD projects out from a side surface of the sealing portion MR, and the following description will be made based on this structure. The structure of the semiconductor device PKG, however, is not limited to this structure. For example, a structure (QFN structure) in which each lead LD hardly projects from a side surface of the sealing portion MR and a part of each lead LD is exposed on the lower surface MRb of the sealing portion MR may be adopted as the structure of the semiconductor device PKG.

The plurality of leads LD are made up of a plurality of leads LD arranged on the side surface MRc1 of the sealing portion MR, a plurality of leads LD arranged on the side surface MRc2 of the sealing portion MR, a plurality of leads LD arranged on the side surface MRc3 of the sealing portion MR, and a plurality of leads LD arranged on the side surface MRc4 of the sealing portion MR.

The outer leads of the leads LD arranged on the side surface MRc1 of the sealing portion MR project out from the side surface MRc1 to the outside of the sealing portion MR. The outer leads of the leads LD arranged on the side surface MRc2 of the sealing portion MR project out from the side surface MRc2 to the outside of the sealing portion MR. The outer leads of the leads LD arranged on the side surface MRc3 of the sealing portion MR project out from the side surface MRc3 to the outside of the sealing portion MR. The outer leads of the leads LD arranged on the side surface MRc4 of the sealing portion MR project out from the side surface MRc4 to the outside of the sealing portion MR.

The outer lead of each lead LD is bent such that the outer lead's lower surface near its end is set to be almost flush with the lower surface MRb of the sealing portion MR. The outer lead of the lead LD functions as an external connection terminal (external terminal) of the semiconductor device PKG.

The die pad (chip mounting portion or tab) DP is a chip mounting portion mounting the semiconductor chips CP1 and CP2 thereon. The die pad DP has a plane shape of, for example, rectangular. The semiconductor chips CP1 and CP2 are arranged side by side on the die pad DP, part of which is sealed with the sealing portion MR. The leads LID are arranged along the periphery of the die pad DP.

The die pad DP has a side (side surface) DP1 on the side surface MRc1, a side (side surface) DP2 on the side surface MRc2, a side (side surface) DP3 on the side surface MRc3, and a side (side surface) DP4 on the side surface MRc4 (see FIGS. 1, 3, and 4). The side (side surface) DP1 of the die pad DP is the side (side surface) along the side surface MRc1 of the sealing portion MR, the side (side surface) DP2 of the die pad DP is the side (side surface) along the side surface MRc2 of the sealing portion MR, the side (side surface) DP3 of the die pad DP is the side (side surface) along the side surface MRc3 of the sealing portion MR, and the side (side surface) DP4 of the die pad DP is the side (side surface) along the side surface MRc4 of the sealing portion MR.

The leads LID arranged on the side surface MRc1 of the sealing portion MR are arranged (lined up) along the side (side surface) DP1 of the die pad DP, and the leads LD arranged on the side surface MRc2 of the sealing portion MR are arranged (lined up) along the side (side surface) DP2 of the die pad DP. The leads LD arranged on the side surface MRc3 of the sealing portion MR are arranged (lined up) along the side (side surface) DP3 of the die pad DP, and the leads LD arranged on the side surface MRc4 of the sealing portion MR are arranged (lined up) along the side (side surface) DP4 of the die pad DP.

Thus, between the side (side surface) DP1 of the die pad DP and the side surface MRc1 of the sealing portion MR, the leads LD (inner leads of the leads LD) are arranged (lined up) along the side surface MRc1 of the sealing portion MR, and between the side (side surface) DP2 of the die pad DP and the side surface MRc2 of the sealing portion MR, the leads LD (inner leads of the leads LD) are arranged (lined up) along the side surface MRc2 of the sealing portion MR. Likewise, between the side (side surface) DP3 of the die pad DP and the side surface MRc3 of the sealing portion MR, the leads LD (inner leads of the leads LD) are arranged (lined up) along the side surface MRc3 of the sealing portion MR, and between the side (side surface) DP4 of the die pad DP and the side surface MRc4 of the sealing portion MR, the leads LD (inner leads of the leads LD) are arranged (lined up) along the side surface MRc4 of the sealing portion MR.

On the lower surface MRb of the sealing portion MR, the lower surface (back surface) of the die pad DP is exposed. On the upper surface MRa of the sealing portion MR, however, the die pad DP is not exposed.

The die pad DP is made of a conductor, and should preferably be made of a metal material, such as copper (Cu) or copper alloy. It is more preferable that the die pad DP and leads LD making up the semiconductor device PKG be made of the same (metal) material. This facilitates manufacturing of a lead frame in which the die pad DP and the leads LD are connected, thereby facilitating manufacturing of the semiconductor device PKG using the lead frame.

On four corners having the rectangular plane shape of the die pad DP, suspending leads TL are integrally and respectively formed. Each suspending lead TL is formed integrally with the die pad DP and is made of the same material making up the die pad DP. The suspending lead TL is formed integrally on each of four corners of the outer edge of the die pad DP, so that the suspending lead TL extends in the sealing portion MR until the end of suspending lead TL that is opposite to its end connected to the die pad DP of each suspending lead TL reaches the side surface of the corner (having the rectangular plane shape) of the sealing portion MR. The suspending lead TL has its projecting part cut away, the projecting part projecting out from the sealing portion MR after its formation. A cutting face (end face) left by cutting away the projecting part of the suspending lead TL is exposed on the side surface of each corner of the sealing portion MR.

On the upper surface (main surface) of the die pad DP, the semiconductor chip CP1 is mounted with its surface (main surface or upper surface) directed upward and back surface (lower surface) directed to the die pad DP (see FIGS. 2, 3, 6, 7, and 9). On the upper surface (main surface) of the die pad DP, the semiconductor chip CP2 is also mounted with its surface (main surface or upper surface) directed upward and back surface (lower surface) directed to the die pad DP (see FIGS. 2, 3, 6, 8, and 9). On the upper surface of the die pad DP, an area in which the semiconductor chip CP1 is mounted and an area in which the semiconductor chip CP2 is mounted are separated from each other, and therefore the semiconductor chip CP1 and the semiconductor chip CP2 are separated from each other when seen in a plan view.

In other words, the semiconductor chip CP1 and the semiconductor chip CP2 are arranged side by side on the upper surface of the die pad DP, which means that the semiconductor chip CP1 and the semiconductor chip CP2 are not stacked on each other but are arranged side by side to be separated from each other on the upper surface of the die pad DP. The plane dimension (plane area) of the die pad DP is larger than the plane dimension (plane area) of each of the semiconductor chips CP1 and CP2. The semiconductor chips CP1 and CP2 are included in the upper surface of the die pad DP but are not stacked on each other when seen in a plan view.

The back surface of the semiconductor chip CP1 is glued (bonded) and fixed to the upper surface of the die pad DP via a bond (bond layer or adhesive layer) BD1, and the back surface of the semiconductor chip CP2 is glued (bonded) and fixed to the upper surface of the die pad DP via a bond (bond layer or adhesive layer) BD2 (see FIGS. 6 to 8). The semiconductor chips CP1 and CP2 are sealed in the sealing portion MR and are not exposed therefrom.

The semiconductor chip CP1 is provided with a back surface electrode BE formed on its back surface (main surface bonded to the die pad DP) (see FIGS. 6 and 7). The bond BD1 for bonding the semiconductor chip CP1 is conductive, and using this conductive bond BD1, the back surface electrode BE of the semiconductor chip CP1 is bonded and fixed to the die pad DP and is electrically connected thereto. This allows a desired voltage to be supplied from the die pad DP to the back surface electrode BE of the semiconductor chip CP1 via the conductive bond BD1. The back surface electrode BE of the semiconductor chip CP1 is electrically connected to the drain of a power MOSFET (i.e., power MOSFETQ1 that will be described later) formed in the semiconductor chip CP1. The bond BD1 is made of, for example, a conductive paste-type adhesive, such as silver (Ag) paste adhesive, or solder.

No back surface electrode BE is formed on the back surface of the semiconductor chip CP2 (see FIGS. 6 and 7). It is preferable that a bond BD2 for bonding the semiconductor chip CP2 have an insulation property, that is, the bond BD2 be made of an insulating adhesive. In such a case, the die pad DP is insulated from the semiconductor chip CP2 via the insulating bond BD2, as a result of which the desired voltage supplied from the die pad DP to the back surface electrode BE of the semiconductor chip CP1 via the conductive bond BD1 is not supplied to the back surface of the semiconductor chip CP2.

The die pad DP also functions as a heat sink that dissipates heat generated by the semiconductor chip CP1. Heat generated by the semiconductor chip CP1 is transmitted through the bond BD1 to the die pad DP and is dissipated from the lower surface (back surface) of the die pad DP exposed from the sealing portion MR to outside of the semiconductor device PKG. Having conductivity, the conductive bond BD1 interposed between the semiconductor chip CP1 and the die pad DP shows heat conductivity higher than that of the insulating bond BD2 interposed between the semiconductor chip CP2 and the die pad DP. The fact that the conductive bond BD1 interposed between the semiconductor chip CP1 and the die pad DP shows high heat conductivity works advantageously in a process of dissipating heat generated by the semiconductor chip CP1 to outside of the semiconductor device PKG via the bond BD1 and die pad DP.

The amount of heat generated by the semiconductor chip CP2 is smaller than the amount of heat generated by the semiconductor chip CP1. This is because that, as it will be described later, the semiconductor chip CP1 has a built-in power transistor that generates a large current flow while the semiconductor chip CP2 does not have such a built-in power transistor and therefore a current flowing through the semiconductor chip CP2 turns out to be smaller than a current flowing through the semiconductor chip CP1. For this reason, even if the insulating bond BD2 interposed between the semiconductor chip CP2 and the die pad DP shows low heat conductivity because of its insulating property, a problem related to heat generation from the semiconductor chip CP2 hardly arises.

The semiconductor chips CP1 and CP2 are manufactured by, for example, forming various semiconductor elements or semiconductor integrated circuits on a main surface of a semiconductor substrate (semiconductor wafer) made of single-crystal silicon, etc., and dicing the semiconductor substrate into individual semiconductor chips. Each of the semiconductor chips CP1 and CP2 has a rectangular (square) plane shape intersecting a direction of its thickness.

The semiconductor chip CP1 is an IPD (Intelligent Power Device) chip. The semiconductor chip CP1, therefore, has the power transistor (i.e., power MOSFETQ1 that will be described later) and a control circuit (i.e., control circuit CLC that will be described later) that controls the power transistor. The semiconductor chip CP2 is a microcomputer chip. The semiconductor chip CP2, therefore, has circuits that control the semiconductor chip CP1 (especially, the control circuit CLC of the semiconductor chip CP1), such as an arithmetic processing circuit (CPU) and a memory circuit. The semiconductor chip CP2 can be used as a control chip (control semiconductor chip) that controls the semiconductor chip CP1. The semiconductor chip CP2 thus serves as the semiconductor chip for controlling the semiconductor chip CP1.

The semiconductor chip CP1 is larger in plane area than the semiconductor chip CP2. The semiconductor chips CP1 and CP2 are thus different in plane area from each other for the following reasons. When a reduction in the overall size of the semiconductor device PKG is taken into consideration, it leads to a demand that the outer dimension of the semiconductor chip CP2 be kept as small as possible. Meanwhile, the semiconductor chip CP1 has the power transistor, whose on-resistance should desirably be reduced as much as possible. A reduction in this on-resistance can be realized by increasing the channel width of a plurality of unit transistor cells making up the power transistor. Hence the semiconductor chip CP1 is made larger in outer dimension than the semiconductor chip CP2.

The plurality of pad electrodes (pads, bonding pads, or terminals) P1 are formed on the surface (main surface or upper surface) of the semiconductor chip CP1 (see FIGS. 2, 3, 6, 7, and 9). Hereinafter, "pad electrode" may be simply referred to as "pad". The plurality of pad electrodes (pads, bonding pads, or terminals) P2 are formed on the surface (main surface or upper surface) of the semiconductor chip CP2 (see FIGS. 2, 3, 6, 8, and 9).

Of two main surfaces of the semiconductor chip CP1 that are arranged opposite to each other, one main surface having the pad electrodes P1 formed thereon is referred to as "surface of the semiconductor chip CP1" and the other main surface opposite to the one main surface and facing the die pad DP is referred to as "back surface of the semiconductor chip CP1". Likewise, of two main surfaces of semiconductor chip CP2 that are arranged opposite to each other, one main surface having the pad electrodes P2 formed thereon is referred to as "surface of the semiconductor chip CP2" and the other main surface opposite to the one main surface and facing the die pad DP is referred to as "back surface of the semiconductor chip CP2".

The surface of the semiconductor chip CP1 is of a rectangular plane shape, which has sides (chip sides) SD1, SD2, SD3, and SD4 (see FIGS. 3 and 9). On the surface of the semiconductor chip CP1, the sides SD1 and SD3 face each other and are parallel to each other, the sides SD2 and SD4 face each other and are parallel to each other, the side SD1 is perpendicular to the sides SD2 and SD4, and the side SD3 is perpendicular to the sides SD2 and SD4.

The surface of the semiconductor chip CP2 is of a rectangular plane shape, which has sides (chip sides) SD5, SD6, SD7, and SD8 (see FIGS. 3 and 9). On the surface of the semiconductor chip CP2, the sides SD5 and SD7 face each other and are parallel to each other, the sides SD6 and SD8 face each other and parallel to each other, the side SD5 is perpendicular to the sides SD6 and SD8, and the side SD7 is perpendicular to the sides SD6 and SD8.

The semiconductor chips CP1 and CP2 are mounted on the upper surface of the die pad DP such that the side SD3 of the semiconductor chip CP1 faces the side SD5 of the semiconductor chip CP2 (see FIGS. 3 and 9). The side SD3 of the semiconductor chip CP1 and the side SD5 of the semiconductor chip CP2 face each other and are almost parallel to each other as well.

The side SD1 of the semiconductor chip CP1 is the side along the side surface MRc1 of the sealing portion MR and is also the side along the side (side surface) DP1 of the die pad DP (see FIGS. 1, 3 and 9). The side SD2 of the semiconductor chip CP1 is the side along the side surface MRc2 of the sealing portion MR and is also the side along the side (side surface) DP2 of the die pad DP. The side SD3 of the semiconductor chip CP1 is the side along the side surface MRc3 of the sealing portion MR and is also the side along the side (side surface) DP3 of the die pad DP. The side SD4 of the semiconductor chip CP1 is the side along the side surface MRc4 of the sealing portion MR and is also the side along the side (side surface) DP4 of the die pad DP. The side SD5 of the semiconductor chip CP2 is the side along the side surface MRc1 of the sealing portion MR and is also the side along the side (side surface) DP1 of the die pad DP. The side SD6 of the semiconductor chip CP2 is the side along the side surface MRc2 of the sealing portion MR and is also the side along the side (side surface) DP2 of the die pad DP. The side SD7 of the semiconductor chip CP2 is the side along the side surface MRc3 of the sealing portion MR and is also the side along the side (side surface) DP3 of the die pad DP. The side SD8 of the semiconductor chip CP2 is the side along the side surface MRc4 of the sealing portion MR and is also the side along the side (side surface) DP4 of the die pad DP.

On the upper surface of the die pad DP, the semiconductor chips CP1 and CP2 are arranged such that the semiconductor chip CP1 is located closer to the side surface MRc1 of the sealing portion MR while the semiconductor chip CP2 is located closer to the side surface MRc3 of the sealing portion MR. On the upper surface of the die pad DP, therefore, the semiconductor chips CP1 and CP2 are arranged such that the semiconductor chip CP1 is located closer to the side (side surface) DP1 of the die pad DP while the semiconductor chip CP2 is located closer to the side (side surface) DP3 of the die pad DP. In other words, when seen in a plan view, the semiconductor chip CP1 is arranged between the side surface MRc1 of the sealing portion MR and the semiconductor chip CP2, while the semiconductor chip CP2 is arranged between the side surface MRc3 of the sealing portion MR and the semiconductor chip CP1. To put it another way, when seen in a plan view, the semiconductor chip CP1 is arranged between the side DP1 of the die pad DP and the semiconductor chip CP2, while the semiconductor chip CP2 is arranged between the side DP3 of the die pad DP and the semiconductor chip CP1.

When seen in a plan view, the side SD1 of the semiconductor chip CP1 faces the leads LD (inner leads of the leads LD) arranged on the side surface MRc1 of the sealing portion MR, and the side SD2 of the semiconductor chip CP1 faces the leads LD (inner leads of the leads LD) arranged on the side surface MRc2 of the sealing portion MR. The side SD3 of the semiconductor chip CP1 faces the side SD5 of the semiconductor chip CP2, and the side SD4 of the semiconductor chip CP1 faces the leads LD (inner leads of the leads LD) arranged on the side surface MRc4 of the sealing portion MR. When seen in a plan view, the side SD5 of the semiconductor chip CP2 faces the side SD3 of the semiconductor chip CP1, and the side SD6 of the semiconductor chip CP2 faces the leads LD (inner leads of the leads LD) arranged on the side surface MRc2 of the sealing portion MR. The side SD7 of the semiconductor chip CP2 faces the leads LD (inner leads of the leads LD) arranged on the side surface MRc3 of the sealing portion MR, and the side SD8 of the semiconductor chip CP2 faces the leads LD (inner leads of the leads LD) arranged on the side surface MRc4 of the sealing portion MR.

Of the sides SD1, SD2, SD3, and SD4 of the semiconductor chip CP1, therefore, the side SD1 is the side that faces the leads LD arranged on the side surface MRc1 of the sealing portion MR, and the side SD2 is the side that faces the leads LD arranged on the side surface MRc2 of the sealing portion MR. Of the sides SD1, SD2, SD3, and SD4 of the semiconductor chip CP1, the side SD3 is the side that faces the semiconductor chip CP2 (side SD5 of the semiconductor chip CP2), and the side SD4 is the side that faces the leads LD arranged on the side surface MRc4 of the sealing portion MR. Of the sides SD5, SD6, SD7, and SD8 of the semiconductor chip CP2, the side SD5 is the side that faces the semiconductor chip CP1 (side SD3 of the semiconductor chip CP1), and the side SD6 is the side that faces the leads LD arranged on the side surface MRc2 of the sealing portion MR. Of the sides SD5, SD6, SD7, and SD8 of the semiconductor chip CP2, the side SD7 is the side that faces the leads LD arranged on the side surface MRc3 of the sealing portion MR, and the side SD8 is the side that faces the leads LD arranged on the side surface MRc4 of the sealing portion MR.

A plurality of pad electrodes P1 and P2 of the semiconductor chips CP1 and CP2 are electrically connected to the plurality of leads LD via a plurality of wires (bonding wires) BW, respectively. A plurality of pad electrodes P1 of the semiconductor chip CP1 are electrically connected to a plurality of pad electrodes P2 of the semiconductor chip CP2 via a plurality of wires BW, respectively.

The pad electrodes P1 of the semiconductor chip CP1 are, therefore, made up of a group of the pad electrodes P1 electrically connected to the leads LD via the wires BW and a group of the pad electrodes P1 electrically connected to the pad electrodes P2 of the semiconductor chip CP2 via the wires BW. The pad electrodes P2 of the semiconductor chip CP2 are made up of a group of the pad electrodes P2 electrically connected to the leads LD via the wires BW and a group of the pad electrodes P2 electrically connected to the pad electrodes P1 of the semiconductor chip CP1 via the wires BW. The semiconductor device PKG includes the wires BW, which are made up of a group of the wires BW electrically connecting the pad electrodes P1 of the semiconductor chip CP1 to the leads LD, a group of the wires BW electrically connecting the pad electrodes P2 of the semiconductor chip CP2 to the leads LD, and a group of the wires BW electrically connecting the pad electrodes P1 of the semiconductor chip CP1 to the pad electrodes P2 of the semiconductor chip CP2.

Each of the wires BW electrically connecting the pad electrodes P1 of the semiconductor chip CP1 to the leads LD, therefore, has one end connected to each pad electrode P1 of the semiconductor chip CP1 and the other end connected to each lead LD. Hence the pad electrode P1 of the semiconductor chip CP1 is electrically connected to the lead LD via the wire BW. Each of the wires BW electrically connecting the pad electrodes P2 of the semiconductor chip CP2 to the leads LD has one end connected to each pad electrode P2 of the semiconductor chip CP2 and the other end connected to each lead LD. Hence the pad electrode P2 of the semiconductor chip CP2 is electrically connected to the lead LD via the wire BW. Each of the wires BW electrically connecting the pad electrodes P1 of the semiconductor chip CP1 to the pad electrodes P2 of the semiconductor chip CP2 has one end connected to each pad electrode P1 of the semiconductor chip CP1 and the other end connected to each pad electrode P2 of the semiconductor chip CP2. Hence the pad electrode P1 is electrically connected to the pad electrode P2 via the wire BW.

Of the entire pad electrodes P1 formed on the surface of the semiconductor chip CP1, the pad electrodes P1 arranged along the side SD1 are electrically connected to the leads LD arranged on the side surface MRc1 of the sealing portion MR, via the wires BW, respectively. Of the entire pad electrodes P1 formed on the surface of the semiconductor chip CP1, the pad electrodes P1 arranged along the side SD2 are electrically connected to the leads LD arranged on the side surface MRc2 of the sealing portion MR, via the wires BW, respectively. Of the entire pad electrodes P1 formed on the surface of the semiconductor chip CP1, the pad electrodes P1 arranged along the side SD4 are electrically connected to the leads LD arranged on the side surface MRc4 of the sealing portion MR, via the wires BW, respectively. Of the entire pad electrodes P2 formed on the surface of the semiconductor chip CP2, the pad electrodes P2 arranged along the side SD6 are electrically connected to the leads LD arranged on the side surface MRc2 of the sealing portion MR, via the wires BW, respectively. Of the entire pad electrodes P2 formed on the surface of the semiconductor chip CP2, the pad electrodes P2 arranged along the side SD7 are electrically connected to the leads LD located on the side surface MRc3 of the sealing portion MR, via the wires BW, respectively. Of the entire pad electrodes P2 formed on the surface of the semiconductor chip CP2, the pad electrodes P2 arranged along the side SD8 are electrically connected to the leads LD arranged on the side surface MRc4 of the sealing portion MR, via the wires BW, respectively. The pad electrodes P1 arranged along the side SD3 among the entire pad electrodes P1 formed on the surface of the semiconductor chip CP1 are electrically connected to the pad electrodes P2 arranged along the side SD5 among the entire pad electrodes P2 formed on the surface of the semiconductor chip CP2, via the wires BW, respectively.

The pad electrodes P1 formed on the surface of the semiconductor chip CP1 include a plurality of source pad electrodes P1S (see FIG. 9). On the surface of the semiconductor chip CP1, the plurality of source pad electrodes P1S are arranged along the side SD1 and are electrically connected to the leads DL arranged on the side surface MRc1 of the sealing portion MR, via the wires BW, respectively. In this manner, the source pad electrodes P1S are included in the pad electrodes P1 electrically connected to the leads LD via the wires BW. The source pad electrodes P1S are source pad electrodes (pads or bonding pads), and are electrically connected to the source of the power transistor (i.e., power MOSFETQ1 that will be described later) formed in the semiconductor chip CP1. On the surface of the semiconductor chip CP1, the plurality of source pad electrodes P1S can be arranged along the side SD1 and may be arranged to be separated from the side SD1 across a certain distance.

Each wire (bonding wire) BW is a conductive connection member and, more specifically, is a conductive wire. The wire BW is made of a metal, and therefore can be regarded as a metal wire (metal thin wire). The wire BW is sealed in the sealing portion MR and is not exposed therefrom. At each lead LD, the wire BW is connected to the inner lead sealed in the sealing portion MR.

As described above, the wires BW include the group of wires BW electrically connecting the pad electrodes P1 of the semiconductor chip CP1 to the leads LD, the group of wires BW electrically connecting the pad electrodes P2 of the semiconductor chip CP2 to the leads LD, and the group of wires BW electrically connecting the pad electrodes P1 of the semiconductor chip CP1 to the pad electrodes P2 of the semiconductor chip CP2.

The entire wires BW (i.e., wires BW shown in FIG. 2) included in the semiconductor device PKG may be made identical in thickness (diameter). It is preferable, however, that out of the entire wires BW (i.e., wires BW shown in FIG. 2) included in the semiconductor device PKG, the wires BW (i.e., wires BW shown in FIG. 10) connecting the source pad electrodes P1S of the semiconductor chip CP1 to the leads LD be given a thickness (diameter) larger than the thickness (diameter) of the other wires BW (i.e., wires BW shown in FIG. 11). It is preferable, specifically, that out of the entire wires BW (i.e., wires BW shown in FIG. 2) included in the semiconductor device PKG, the wires BW (i.e., wires BW shown in FIG. 10) connected to the source pad electrodes P1S be given a thickness (diameter) larger than the thickness (diameter) of the wires BW (i.e., wires BW shown in FIG. 11) connected to the pad electrodes P1 and P2 other than the source pad electrodes P1S.

Figure 10:
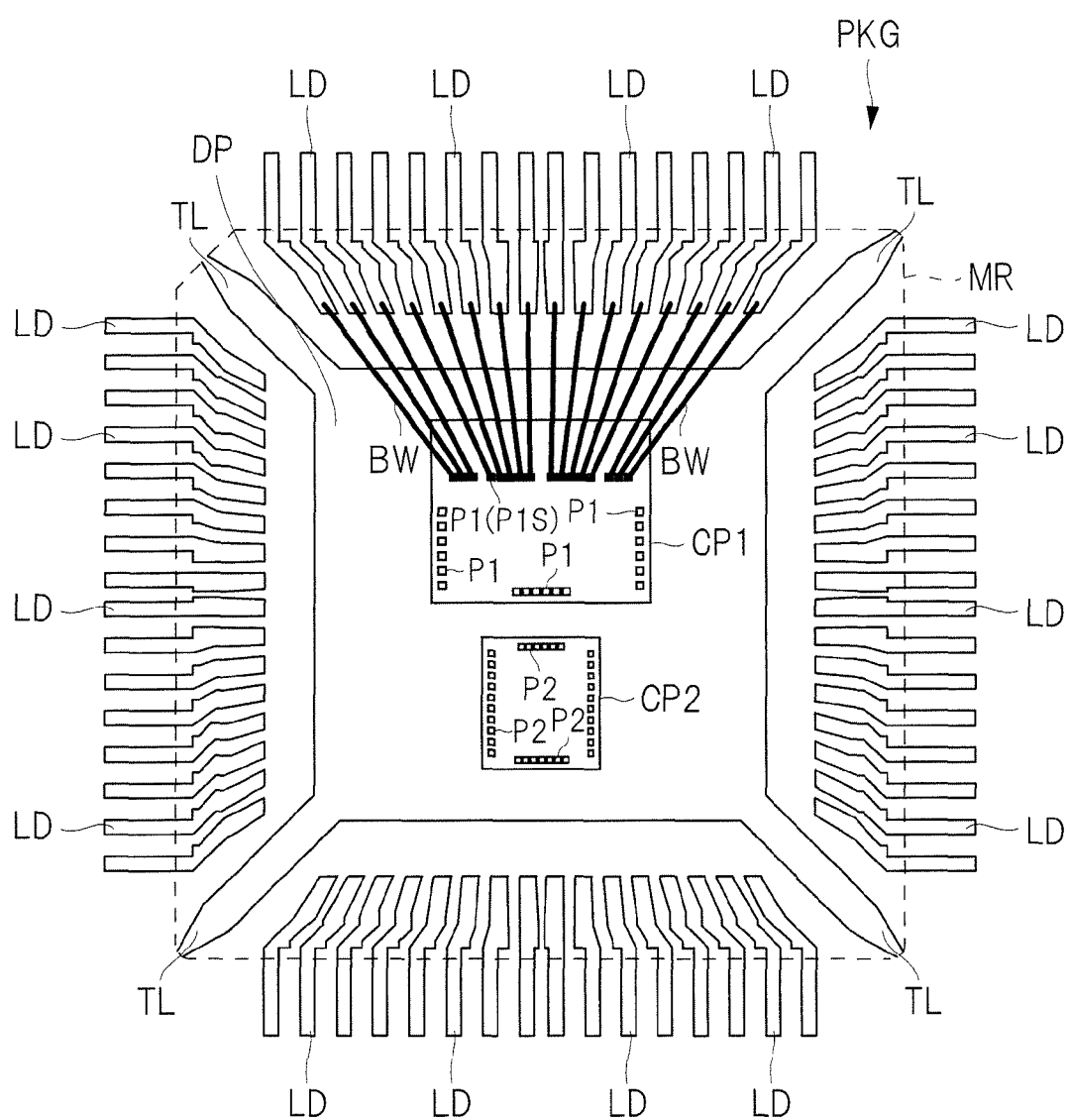
FIG. 10 is an explanatory diagram of the semiconductor device according to one embodiment of the present invention.
Figure 11:
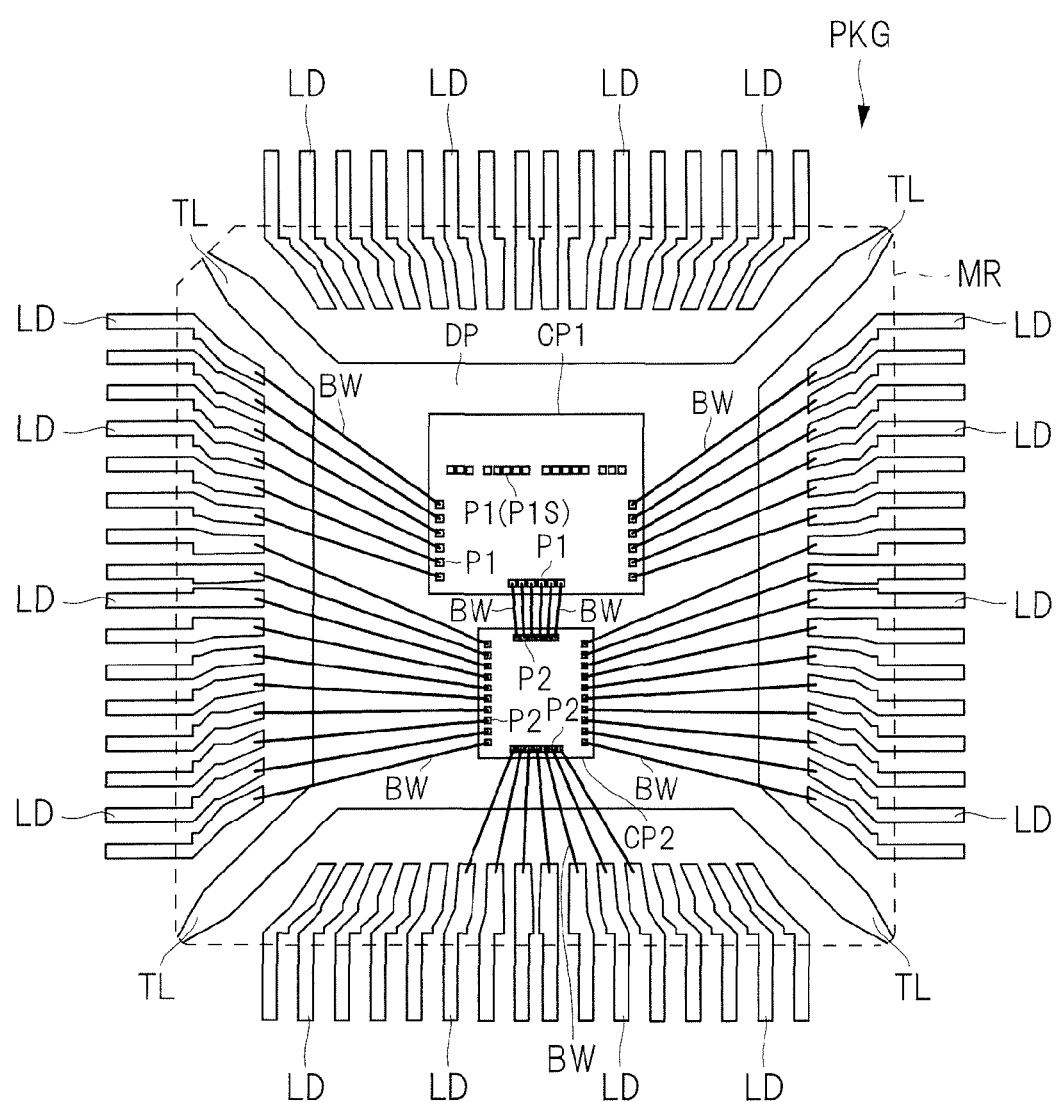
FIG. 11 is an explanatory diagram of the semiconductor device according to one embodiment of the present invention.

FIGS. 10 and 11 are explanatory diagrams of the semiconductor device PKG of this embodiment. FIG. 10 shows the wires BW larger in thickness (diameter) among the wires BW of FIG. 2 but does not show the wires BW smaller in thickness (diameter). FIG. 11, in contrast, does not show the wires BW larger in thickness (diameter) among the wires BW of FIG. 2 but shows the wires BW smaller in thickness (diameter). In other words, among the wires SW of FIG. 2, the wires BW larger in thickness (diameter) are shown in FIG. 10 and the wires BW smaller in thickness (diameter) are shown in FIG. 11. The wires BW shown in FIG. 10 among the wires BW of FIG. 2 are, therefore, larger in thickness (diameter) than the wires shown in FIG. 11. This thickness (diameter) difference is made for the following reasons.

The wires BW (i.e., wires BW shown in FIG. 10) connecting the source pad electrodes P1S of the semiconductor chip CP1 to the leads LD carry large current, compared to the other wires BW (i.e., wires BW shown in FIG. 11), in which case, by increasing the thickness (diameter) of the wires BW shown in FIG. 10, their resistance is reduced, thereby reducing power loss. In contrast, the wires BW (i.e., wires BW shown in FIG. 11) other than the wires BW connecting the source pad electrodes P1S of the semiconductor chip CP1 to the leads LD do not carry such larger current, in which case, by decreasing the thickness (diameter) of the wires BW shown in FIG. 11, the size of the pad electrodes P1 and P2 connected to the wires BW is reduced, which is advantageous for a reduction in the size of the semiconductor chips CP1 and CP2. For example, the diameter of each of the wires BW (i.e., wires BW shown in FIG. 10) connected to the source pad electrodes P1S is determined to be about 35 μm, while the diameter of each of the wires BW (i.e., wires BW shown in FIG. 11) connected to the pad electrodes P1 and P2 other than the source pad electrodes P1S is determined to be about 20 μm.

A gold (Au) wire, copper (Cu) wire, or aluminum (Al) wire is used preferably as the wire BW.

It is possible that the wires BW (i.e., wires BW shown in FIG. 10) connected to the source pad electrodes P1S are given a larger thickness (diameter) as described above and are provided as copper wires, while the wires BW (i.e., wires BW shown in FIG. 11) connected to the pad electrodes P1 and P2 other than the source pad electrodes P1S are given a smaller thickness (diameter) as described above and are provided as gold wires. In other words, the wires BW (i.e., wires BW shown in FIG. 10) connected to the source pad electrodes P1S and the wires BW (i.e., wires BW shown in FIG. 11) connected to the pad electrodes P1 and P2 other than the source pad electrodes P1S are made of different materials, respectively, such that the former wires BW are provided as copper (Cu) wires with a large diameter while the latter wires BW are provided as gold (Au) wires with a small diameter. By using copper (Cu) wires as the wires BW with a large diameter (i.e., wires BW connected to the source pad electrodes P1S), the manufacturing cost of the semiconductor device PKG can be reduced. By using gold (Au) wires as the wires BW with a small diameter (i.e., wires connected to the pad electrodes P1 and P2 other than the source pad electrodes P1S), even if the pad electrodes P1 and P2, to which the wires BW are connected, are reduced in size, the wires BW can be connected easily and accurately to the pad electrodes P1 and P2 reduced in size. This is because that a gold wire is connected more easily to a small pad than a copper wire is. In this manner, the connection reliability of the wires BW can be improved as the manufacturing cost is reduced.

If connecting copper wires to the pad electrodes P1 and P2 poses no problem in terms of the size of the pad electrodes P1 and P2, copper (Cu) wires may be used not only as the wires SW connected to the source pad electrodes P1S but also as the wires BW connected to the pad electrodes P1 and P2 other than the source pad electrodes P1S, which means that the entire wires BW included in the semiconductor device PKG may be provided as copper (Cu) wires. This further reduces the manufacturing cost of the semiconductor device PKG.

According to this embodiment, on the semiconductor chip CP1, a plurality of pad electrodes P1a among the pad electrodes P1 included in the semiconductor chip CP1 are electrically connected to a plurality of pad electrodes P1b among the pad electrodes P1 included in the semiconductor chip CP1 via internal wirings NH of the semiconductor chip CP1, respectively, as shown in FIG. 9. The pad electrodes P1a of the semiconductor chip CP1 are electrically connected to a plurality of pad electrodes P2a among the pad electrodes P2 of the semiconductor chip CP2 via the wires BW (BW1), respectively, while the pad electrodes P1b of the semiconductor chip CP1 are electrically connected to the leads LD via the wires BW (BW2), respectively.

Of the entire wires BW included in the semiconductor device PKG, the wires BW electrically connecting the pad electrodes P1a of the semiconductor chip CP1 to the pad electrodes P2a of the semiconductor chip CP2 are denoted as BW1 and are therefore referred to as wire BW1, and the wires BW electrically connecting the pad electrodes P1b of the semiconductor chip CP1 to the leads LD are denoted as BW2 and are therefore referred to as wire BW2. Each wire BW1 has one end connected to each pad electrode P1a of the semiconductor chip CP1 and the other end connected to each pad electrode P2a of the semiconductor chip CP2. Each wire BW2 has one end connected to each pad electrode P1b of the semiconductor chip CP1 and the other end connected to each lead LD (lead LD1 that will be described later).

The internal wirings NH are formed in the semiconductor chip CP1 and serve as the wirings electrically connecting the pad electrodes P1a to the pad electrodes P1b. The internal wirings NH are not wirings that connect the pad electrodes P1a to a circuit in the semiconductor chip CP1 and are not wirings that connect the pad electrodes P1b to a circuit in the semiconductor chip CP1, either. In the semiconductor chip CP1, therefore, the internal wirings NH electrically connecting the pad electrodes P1a to the pad electrodes P1b are not electrically connected to any circuit in the semiconductor chip CP1. Thus, in the semiconductor chip CP1, the pad electrodes P1a, the pad electrodes P1b, and the internal wirings NH connecting the pad electrodes P1a to the pad electrodes P1b are not electrically connected to any circuit in the semiconductor chip CP1. In the semiconductor chip CP1, the internal wirings NH are covered with a protective film 13 (which will be described later) and are therefore not exposed from the semiconductor chip CP1.

Of the pad electrodes P1a and P1b electrically connected via the internal wirings NH, the pad electrodes P1a are electrically connected to the pad electrodes P2a of the semiconductor chip CP2 via the wires BW1, and the pad electrodes P1b are electrically connected to the leads LD (leads LD1 that will be described later) via the wires BW2. As a result, each pad electrode P2a of the semiconductor chip CP2 is electrically connected to each pad electrode P1a of the semiconductor chip CP1 via the wire BW1, and to each pad electrode P1b of the semiconductor chip CP1 via the internal wiring NH of the semiconductor chip CP1, and also to each lead LD (lead LD1 that will be described later) via the wire BW2. The pad electrode P2a of the semiconductor chip CP2 is thus electrically connected to the lead LD (lead LD1 that will be described later) of the semiconductor device PKG via the wire BW1, pad electrode P1a, internal wiring NH, pad electrode P1b of the semiconductor chip CP1, and wire BW2.

On the semiconductor chip CP2, the pad electrodes P2a are arranged on the side SD5 facing the semiconductor chip CP1. On the semiconductor chip CP1, on the other hand, the pad electrodes P1a are arranged on the side SD3 facing the semiconductor chip CP2. As for the side SD3 of the semiconductor chip CP1 along which the pad electrodes P1a are arranged, and the side SD5 of the semiconductor chip CP2 along which the pad electrodes P2a are arranged, the side SD3 and the side SD5 face each other. Because of this configuration, each pad electrode P1a of the semiconductor chip CP1 can be connected easily and accurately to each pad electrode P2a of the semiconductor chip CP2 via the wire BW1.

On the semiconductor chip CP1, the side (side D3) along which the pad electrodes P1a are arranged is different from the sides (sides SD2 and SD4) along which the pad electrodes P1b are arranged. In other words, on the semiconductor chip CP1, the pad electrodes P1a are arranged on the side SD3 facing the semiconductor chip CP2, while the pad electrodes P1b are arranged on the side (sides SD2 and SD4) other than the side SD3 facing the semiconductor chip CP1.

On the semiconductor chip CP1, the pad electrodes P1b arranged on the side SD2 are connected to the leads LD arranged on the side surface MRc2 of the sealing portion MR (i.e., leads LD arranged facing the side SD2), via the wires BW. The pad electrodes P1b arranged on the side SD4 are connected to the leads LD arranged on the side surface MRc4 of the sealing portion MR (i.e., leads LD arranged facing the side SD4), via the wires BW2. As a result, each pad electrode P1b of the semiconductor chip CP1 is connected easily and accurately to the lead LD via the wire BW2.

In the case of FIG. 9, six pad electrodes P1a are electrically connected to six pad electrodes P1b via the internal wirings NH, respectively, on the semiconductor chip CP1. Six pad electrodes P1b of the semiconductor chip CP1 are electrically connected to six leads LD1 via the wires BW2, respectively, while six pad electrodes P1a of the semiconductor chip CP1 are electrically connected to six pad electrodes P2a of the semiconductor chip CP2 via the wires BW1, respectively. Six sets of pad electrodes P1a, pad electrodes P1b, and internal wirings electrically connecting the pad electrodes P1a to the pad electrodes P1b are therefore formed on the semiconductor chip CP1.

It is necessary to form one or more sets of pad electrodes P1a, pad electrodes P1b, and internal wirings NH electrically connecting the pad electrodes P1a to the pad electrodes P1b on the semiconductor chip CP1. The number of these sets of pad electrodes P1a, pad electrodes P1b, and internal wirings NH, however, is not limited to six. In the case of FIGS. 2 and 9, the semiconductor device PKG includes six conduction paths each made up of the pad electrode P2a, wire BW1, pad electrode P1a, internal wiring NH, pad electrode P1b, wire BW2, and lead LD1. The number of the conduction paths, however, is not limited to six and is merely required to be one or more.

<Manufacturing Processes for Semiconductor Device>

Figure 12:
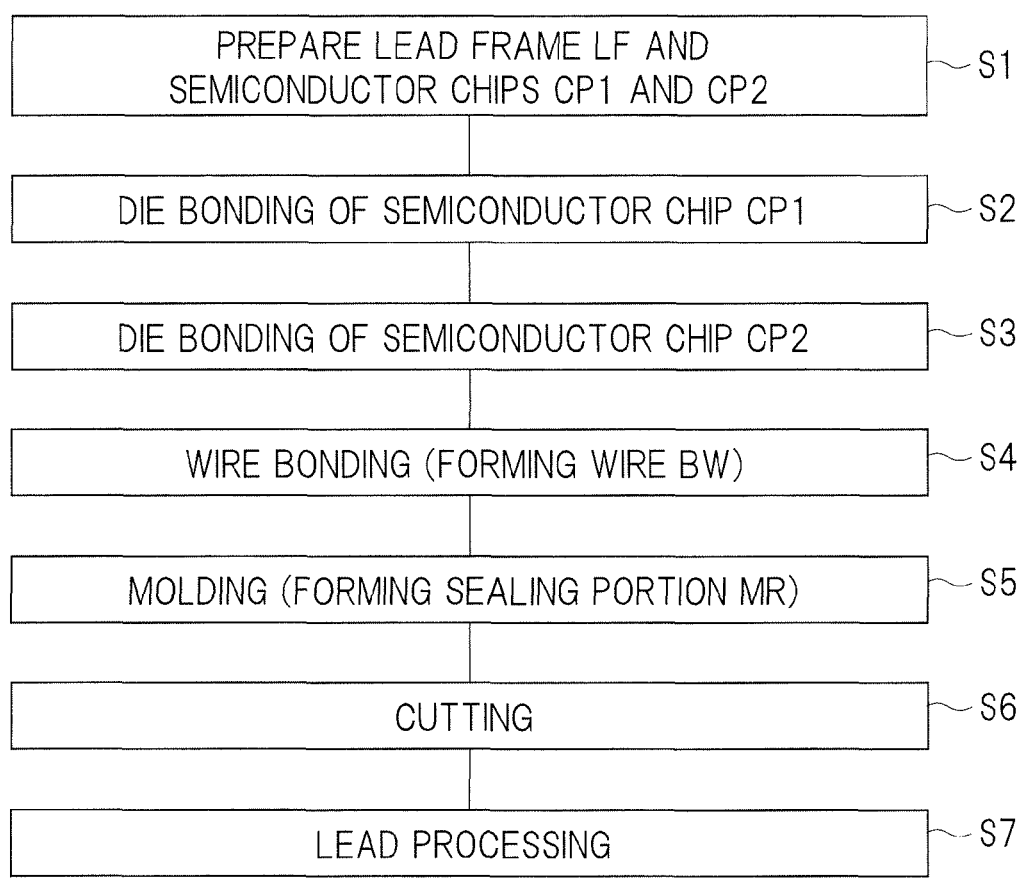
FIG. 12 is process flow chart showing manufacturing processes for the semiconductor device according to one embodiment of the present invention.

Manufacturing processes for the semiconductor device PKG shown in FIGS. 1 to 9 will then be described. FIG. 12 is a process flow chart showing the manufacturing processes for the semiconductor device PKG shown in FIGS. 1 to 9. FIGS. 13 to 18 are cross-sectional views of the semiconductor device PKG during the manufacturing processes. The cross-sectional views of FIGS. 13 to 18 correspond to the cross-sectional view of FIG. 6.

At the start of manufacturing of the semiconductor device PKG, a lead frame LF and the semiconductor chips CP1 and CP2 are prepared (step S1 of FIG. 12).

Figure 13:
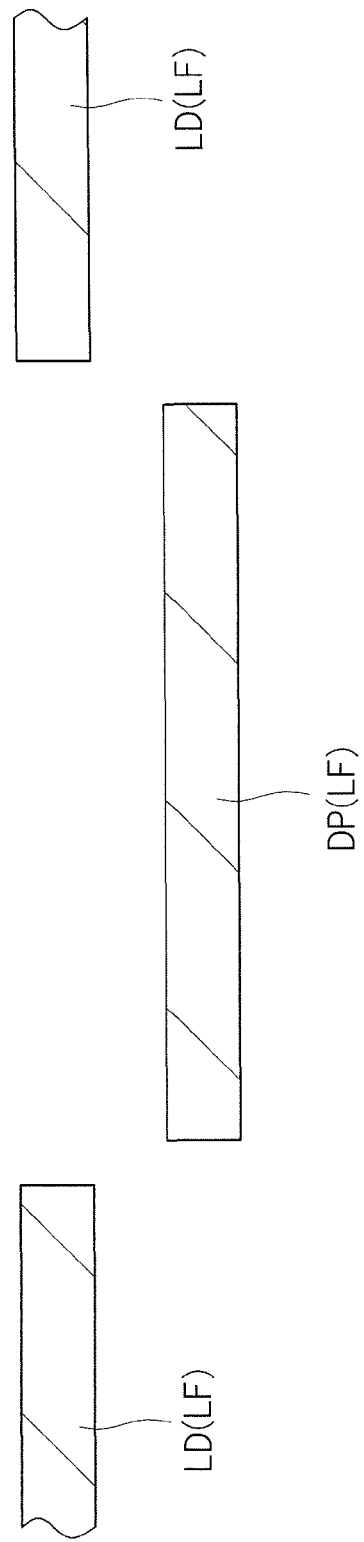
FIG. 13 is a cross-sectional view of the semiconductor device according to one embodiment of the present invention during the manufacturing processes.

As shown in FIG. 13, the lead frame LF includes a frame casing (not shown), the plurality of leads LD connected to the frame casing, and the die pad DP connected to the frame casing via the plurality of suspending leads TL (not shown), and the frame casing, the leads LD, and the die pad DP are integrally formed together.

At step S1, the lead frame LF, the semiconductor chip CP1, and the semiconductor chip CP2 are prepared in any order or may be prepared simultaneously.

Figure 14:
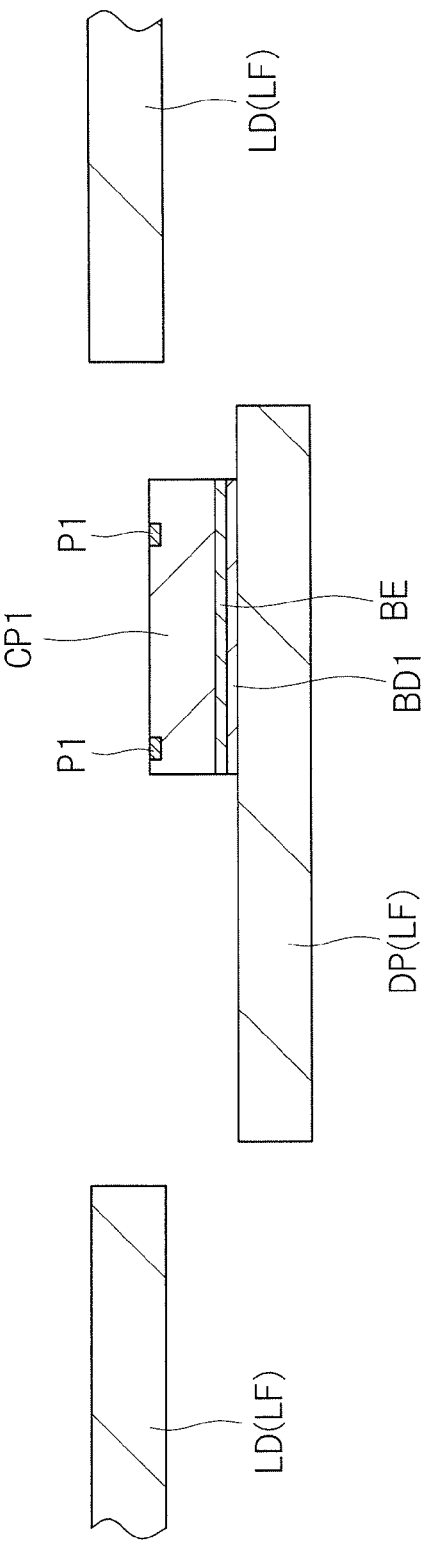
FIG. 14 is a cross-sectional view of the semiconductor device following FIG. 13 during the manufacturing processes.

Subsequently, a die bonding process of the semiconductor chip CP1 is carried out to bond the semiconductor chip CP1 on the die pad DP of the lead frame via the conductive bond BD1, as shown in FIG. 14 (step S2 of FIG. 12). At step S2, the back surface electrode BE of the semiconductor chip CP1 is bonded to the die pad DP via the conductive bond BD1.

Step S2 is carried out, for example, in the following manner. First, the conductive bond BD1 is supplied to a semiconductor chip CP1 mounting area on the upper surface of the die pad DP. The conductive bond BD1 is made of, for example, a conductive paste adhesive, such as silver (Ag) paste adhesive. On the upper surface of the die pad DP, the semiconductor chip CP1 is then mounted via the bond BD1. Subsequently, the bond BD1 is subjected to heat treatment, etc., to be cured. The semiconductor chip CP1 is thus mounted and fixed on the die pad DP of the lead frame via the bond BD1. Solder may be used as the bond BD1, in which case a solder reflow process is carried out following the mounting of the semiconductor chip CP1.

Figure 15:
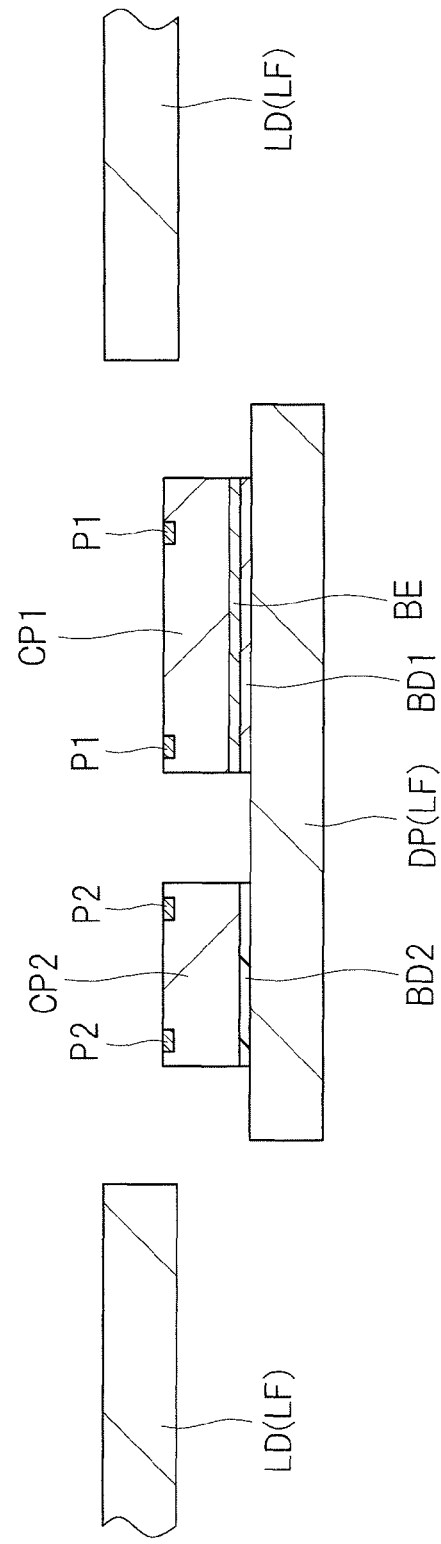
FIG. 15 is a cross-sectional view of the semiconductor device following FIG. 14 during the manufacturing processes.

Subsequently, a die bonding process of the semiconductor chip CP2 is carried out to bond the semiconductor chip CP2 on the die pad DP of the lead frame via the insulating bond BD2, as shown in FIG. 15 (step S3 of FIG. 12). At step S3, the back surface of the semiconductor chip CP2 is bonded to the die pad DP via the insulating bond BD2.

Step S3 is carried out, for example, in the following manner. First, the insulating bond BD2 is supplied to a semiconductor chip CP2 mounting area on the upper surface of the die pad DP. The conductive bond BD2 is made of, for example, an insulating paste adhesive. On the upper surface of the die pad DP, the semiconductor chip CP2 is then mounted via the bond BD2. Subsequently, the bond BD2 is subjected to heat treatment, etc., to be cured. The semiconductor chip CP2 is thus mounted and fixed on the die pad DP of the lead frame via the bond BD2.

Either the die bonding process of the semiconductor chip CP1 at step S2 or the die bonding process of the semiconductor chip CP2 at step S3 may be carried out first. However, it is preferable to first carry out the die bonding process of the semiconductor chip CP1 at step S2 and then carry out the die bonding process of the semiconductor chip CP2 at step S3. The die bonding process of the semiconductor chip CP1 is carried out first for the following reasons.

The semiconductor chip CP1 has the back surface electrode BE, which must be electrically connected to the die pad DP. The semiconductor chip CP2, on the other hand, has no back surface electrode, which means that the semiconductor chip CP2 does not need to be electrically connected to the die pad DP. For this reason, the level of reliability of bonding of the semiconductor chip CP1 to the die pad DP is required to be higher than the level of reliability of bonding of the semiconductor chip CP2 to the die pad DP. When two semiconductor chips (CP1 and CP2) are bonded on the die pad DP by die bonding, the surface of the die pad DP may be oxidized or contaminated during the die bonding process to be carried out first. The reliability of bonding of the semiconductor chip, therefore, tends to become lower in the die bonding process to be carried out later than in the die bonding process to be carried out first. Of the semiconductor chips CP1 and CP2, therefore, the semiconductor chip CP1 required to have higher bonding reliability is bonded first on the die pad DP via the conductive bond BD1 and then the semiconductor chip CP2 is bonded on the die pad DP via the insulating bond BD2. Through such processes, the reliability of electrical connection between the back surface electrode BE of the semiconductor chip CP1 and the die pad DP is improved and therefore the reliability of the semiconductor device PKG is further improved. It is therefore preferable that step S2 be carried out first to be followed by step S3.

Figure 16:
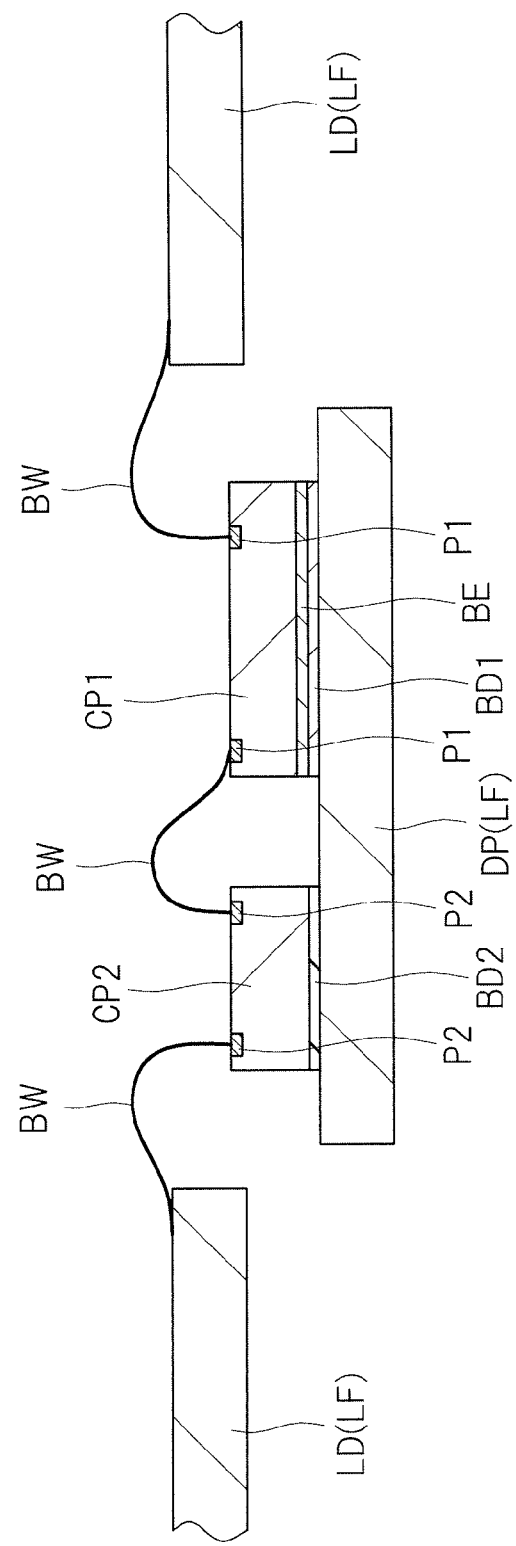
FIG. 16 is a cross-sectional view of the semiconductor device following FIG. 15 during the manufacturing processes.

Subsequently, as shown in FIG. 16, a wire bonding process is carried out (step S4 of FIG. 12).

At step S4, through respective groups of wires BW, the pad electrodes P1 of the semiconductor chip CP1 are electrically connected to the leads LD of the lead frame LF, the pad electrodes P2 of the semiconductor chip CP2 are electrically connected to the leads LD of the lead frame LF, and the pad electrodes P1 of the semiconductor chip CP1 are connected to the pad electrodes P2 of the semiconductor chip CP2, respectively.

When the wires BW connecting the source pad electrodes P1S of the semiconductor chip CP1 to the leads LD are made larger in thickness (diameter) than the other wires BW, as described above, it is preferable to carry out the wire bonding process in two stages at step S4. Specifically, wire bonding using the wires BW larger in diameter is carried out first in the first stage and then wire bonding using the wires BW smaller in diameter is carried out in the second stage.

In the first stage, specifically, wire bonding using the wires BW shown in FIG. 10 is carried out. By this wire bonding, the source pad electrodes P1S of the semiconductor chip CP1 are electrically connected to the leads LD via the wires larger in diameter, respectively. Subsequently, wire bonding of the wires BW shown in FIG. 11 is carried out. As a result, through respective groups of wires BW smaller in diameter, the pad electrodes P1 of the semiconductor chip CP1 other than the source pad electrodes P1S are electrically connected to the leads LD, the pad electrodes P2 of the semiconductor chip CP2 are electrically connected to the leads LD, and the pad electrodes P1 of the semiconductor chip CP1 are connected to the pad electrodes P2 of the semiconductor chip CP2, respectively.

A wire smaller in diameter is more apt to deform than a wire larger in diameter. Because of this fact, at step S4, wire bonding using the wires BW larger in diameter is carried out first and then wire bonding using the wires BW smaller in diameter is carried out. This reduces a possibility that the wires BW deform during the wire bonding process at step S4.

Figure 17:
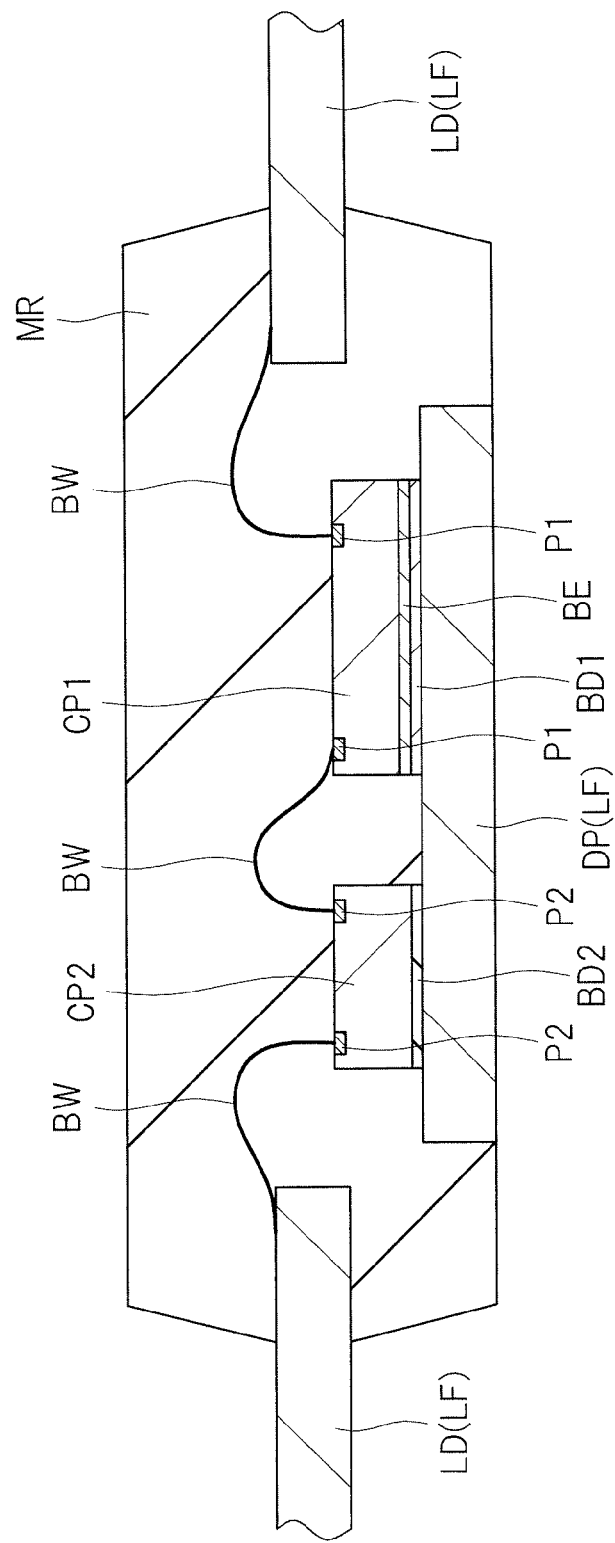
FIG. 17 is a cross-sectional view of the semiconductor device following FIG. 16 during the manufacturing processes.

Subsequently, resin-sealing is carried out during a molding process (resin forming process). As a result, as shown in FIG. 17, the semiconductor chips CP1 and CP2 and the wires BW connected thereto are sealed with the sealing portion (sealing body or sealing resin portion) MR (step S5 of FIG. 12). By the molding process at step S5, the sealing portion MR sealing therein the semiconductor chips CP1 and CP2, the die pad DP, the inner leads of the leads LD, the wires BW, and the suspending leads TL is formed.

Subsequently, the outer leads of leads LD that are exposed from the sealing portions MR are plated when necessary, after which, outside the sealing portion MR, the leads LD and the suspending leads TL are cut at a given position to separate them from the frame casing of the lead frame LF (step S6 of FIG. 12).

Figure 18:
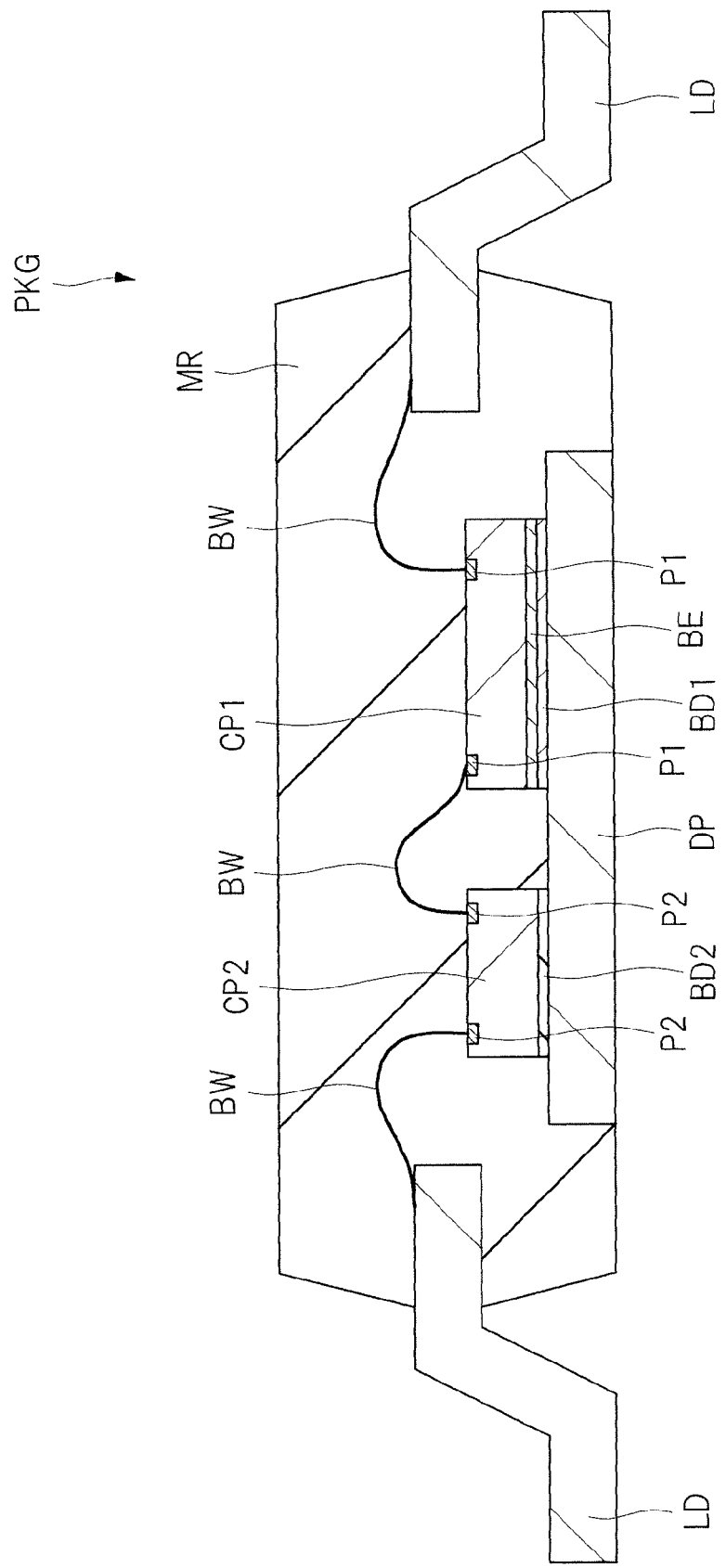
FIG. 18 is a cross-sectional view of the semiconductor device following FIG. 17 during the manufacturing processes.

Subsequently, as shown in FIG. 18, the outer leads of leads LD that project out from the sealing portion MR are bent (lead processing or lead formation) (step S7 of FIG. 12).

In the above manner, the semiconductor device PKG shown in FIGS. 1 to 9 is manufactured.

<Circuit Configuration of Semiconductor Device>

Figure 19:
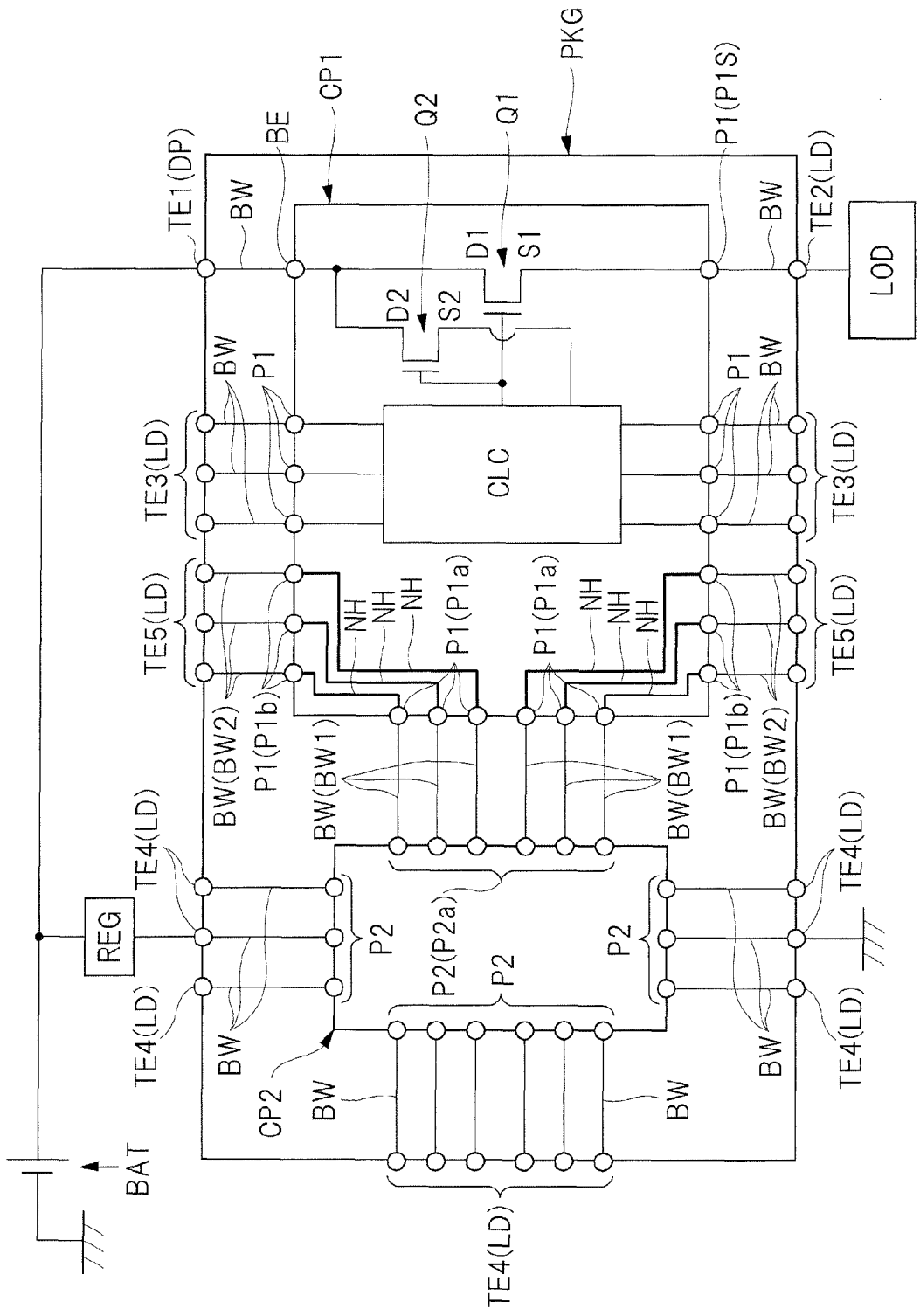
FIG. 19 is a circuit diagram of the semiconductor device according to one embodiment of the present invention.

A circuit configuration of the semiconductor device PKG will then be described, referring to FIG. 19. FIG. 19 is a circuit diagram (circuit block diagram) of the semiconductor device PKG.

As described above, the semiconductor device PKG of this embodiment includes the semiconductor chips CP1 and CP2 built therein. The semiconductor chip CP1 has a power MOSFETQ1 (Metal Oxide Semiconductor Field Effect Transistor), which is a power transistor, a sense MOSFETQ2 that detects current flowing through the power MOSFETQ1, and a control circuit CL formed therein. The power MOSFETQ1 functions as a switching power transistor.

In this specification, MOSFET refers not only to a MISFET (Metal Insulator Semiconductor Field Effect Transistor) having a gate insulating film made of an oxide film (silicon oxide film) but also to a MISFET having a gate insulating film made of an insulating film other than the oxide film (silicon oxide film).

The control circuit CLC includes a driver circuit that drives the power MOSFETQ1 and sense MOSFETQ2. In response to an external signal input to the semiconductor chip CP1 and transferred to the control circuit CLC, therefore, the control circuit CLC controls a voltage at the gate terminal (i.e., gate electrode 8 that will be described later) of the power MOSFETQ1, thereby controls the operation of the power MOSFETQ1. The gate (i.e., gate electrode 8 that will be described later) of the power MOSFETQ1 is connected to the control circuit CLC, which supplies an on-signal (gate voltage that switches the power MOSFETQ1 on) to the gate of the power MOSFETQ1 to put the power MOSFETQ1 in on-state.

When the power MOSFETQ1 is shifted to on-state by the on-signal supplied from the control signal CLC to the gate of the power MOSFETQ1, a voltage from a power supply BAT is output from the power MOSFETQ1 and supplied to a load LOD. When the control signal CLC supplies an off-signal to the gate of the power MOSFETQ1 (or stops supplying the on-signal to the gate) to put the power MOSFETQ1 in off-state, voltage supply from the power supply BAT to the load LOD is stopped. Such on-off control of the power MOSFETQ1 of the semiconductor chip CP1 is carried out by the control circuit CLC of the semiconductor chip CP1.

In this manner, the semiconductor device PKG functions as a switching semiconductor device that carries out on-off switching of application of a voltage from the power supply BAT to the load LOD. The power MOSFETQ1 of the semiconductor chip CP1 functions as a switch element (switching element). Because output from the power MOSFETQ1 is supplied to the load LOD, the power MOSFETQ1 may be regarded as an output circuit. The load LOD is provided as an optionally chosen electronic device (or electronic component) that should desirably be connected to the power supply BAT via the switching semiconductor device PKG. For example, a motor, lamp, or heater, etc., may be used as the load LOD.

In the semiconductor chip CP1 of the semiconductor device PKG, the sense MOSFETQ2 for current detection is provided. A current flowing through the power MOSFETQ1 is detected by the sense MOSFETQ2, and the power MOSFETQ1 is controlled according to a current flowing through the sense MOSFETQ2. For example, when determining (detecting) that an overcurrent (current larger than a given current value) is flowing through the power MOSFETQ1, based on a current flowing through the sense MOSFETQ2, the control circuit CLC controls the gate voltage of the power MOSFETQ1, thereby reduces the current flowing through the power MOSFETQ1 to a current of the given value or smaller value or forcibly switches the power MOSFETQ1 off. This prevents an overcurrent from flowing through the power MOSFETQ1, and it is therefore possible to protect the semiconductor device PKG and the electronic device using the semiconductor device PKG.

The sense MOSFETQ2 has a drain and a gate that are shared by the power MOSFETQ1. Both of the drains of the power MOSFETQ1 and sense MOSFETQ2 formed in the semiconductor chip CP1 are electrically connected to the back surface electrode BE of the semiconductor chip CP1 and are therefore electrically connected with each other. The back surface electrode BE of the semiconductor chip CP1 thus serves as the drain back surface electrode for the power MOSFETQ1 and sense MOSFETQ2.

The back surface electrode BE of the semiconductor chip CP1, to which the drains of the power MOSFETQ1 and sense MOSFETQ2 are connected, is connected to a terminal TE1 of the semiconductor device PKG. The die pad DP corresponds to this terminal TE1. From the terminal TE1 (i.e., die pad DP) of the semiconductor device PKG, the same voltage is supplied to the drain of the sense MOSFETQ2 and to the drain of the power MOSFETQ1 via the bond BD1 and back surface electrode BE of the semiconductor chip CP1. Because the terminal TE1 (die pad DP) is connected to the power supply (battery) BAT arranged outside the semiconductor device PKG, a voltage from the power supply BAT is supplied from the terminal TE1 (i.e., die pad DP) of the semiconductor device PKG to the drain of the power MOSFETQ1 and to the drain of the sense MOSFETQ2 via the bond BD1 and back surface electrode BE of the semiconductor chip CP1.

The sense MOSFETQ2 and power MOSFETQ1 have their gates electrically connected to each other, which therefore make up as a common gate. This common gate is connected to the control circuit CLC, so that the control circuit CLC outputs the same gate signal (gate voltage) to the gate of the sense MOSFETQ2 and to the gate of the power MOSFETQ1. Specifically, respective gates (gate electrodes) of the sense MOSFETQ2 and power MOSFETQ1 formed in the semiconductor chip CP1 are electrically connected to the control circuit CLC in the semiconductor chip CP1 via an internal wiring of the semiconductor chip CP1.

The source of the sense MOSFETQ2 and the source of the power MOSFETQ1 do not make up a common source, which means that the source of the sense MOSFETQ2 and the source of the power MOSFETQ1 are not short-circuited.

The source of the power MOSFETQ1 is connected to a terminal TE2 of the semiconductor device PKG, and the terminal TE2 is connected to the load LOD arranged outside the semiconductor device PKG. The source of the power MOSFETQ1 is, therefore connected to the load LOD. Of the entire leads LD included in the semiconductor device PKG, the leads electrically connected to the source pad electrodes P1S of the semiconductor chip CP1 via the wires BW correspond to the terminal TE2. Specifically, the source of the power MOSFETQ1 formed in the semiconductor chip CP1 is electrically connected to the source pad electrodes P1S of the semiconductor chip CP1 via an internal wiring of the semiconductor chip CP1. The source pad electrodes P1S are electrically connected to the terminal TE2 (leads LD) via the wires BW, to which terminal TE2 (leads LD) the load LOD is connected. As a result, when the power MOSFETQ1 is shifted to an on-state (conductive state) by supplying an on-signal from the control circuit CLC to the gate of the power MOSFETQ1, a voltage from the power supply BAT is supplied to the load LOD via the power MOSFETQ1 in its on-state (conductive state).

The source of the sense MOSFETQ2 is connected to the control circuit CLC. Specifically, the source of the sense MOSFETQ2 formed in the semiconductor chip CP1 is electrically connected to the control circuit CLC in the semiconductor chip CP1 via an internal wiring of the semiconductor chip CP1.

In FIG. 19, D1 denotes the drain of the power MOSFETQ1, S1 denotes the source of the power MOSFETQ1, D2 denotes the drain of the sense MOSFETQ2, and S2 denotes the source of the sense MOSFETQ2.

The sense MOSFETQ2, as well as the power MOSFETQ1, is formed in the semiconductor chip CP1. The sense MOSFETQ2 is combined with the power MOSFETQ1 to make up a current-mirror circuit in the semiconductor chip CP1. The size of the sense MOSFETQ2 is, for example, 1/20000 of that of the power MOSFETQ1. This size ratio can be changed when necessary.

The control circuit CLC formed in the semiconductor chip CP1 is connected to a plurality of terminals TE3 of the semiconductor device PKG. Some of the leads LD included in the semiconductor device PKG correspond to the plurality of terminals TE3. Specifically, the pad electrodes P1 that are electrically connected to the control circuit CLC formed in the semiconductor chip CP1 via internal wirings in the semiconductor chip CP1 are electrically connected to the terminals TE3 (leads LD) via the wires BW. The terminals TE3 (leads LD) of the semiconductor device PKG include an input terminal, an output terminal, and a ground terminal. These terminals making up the terminal TE3 supply or input a signal (input signal) and a ground voltage to the control circuit CLC, and outputs a signal (output signal) that is output from the control circuit CLC to the terminal TE3.

The semiconductor chip CP2 is a microcomputer chip (control chip), and functions as a control semiconductor chip that controls the operation of the semiconductor chip CP1.

Although no circuit in the semiconductor chip CP2 is shown in FIG. 19, the semiconductor chip CP2 actually includes a circuit that controls the semiconductor chip CP1 (circuits in the semiconductor chip CP1), which means that a circuit that controls the control circuit CLC formed in the semiconductor chip CP1 is formed in the semiconductor chip CP2.

Of the entire pad electrodes P2 of the semiconductor chip CP2, the pads P2 other than the pads P2a are connected to the terminals TE4 of the semiconductor device PKG, respectively. Some of the leads LD included in the semiconductor device PKG correspond to these terminals TE4. Specifically, the pad electrodes P2 that are electrically connected to a circuit (internal circuit) formed in the semiconductor chip CP2 via internal wirings in the semiconductor chip CP2 are electrically connected to the terminals TE4 (leads LD) via the wires BW.

The terminals TE4 (leads LD) of the semiconductor device PKG include an input terminal, an output terminal, and a ground terminal. These terminals making up the terminal TE4 supply or input a signal (input signal) and a ground voltage to the circuit (internal circuit) in the semiconductor chip CP2, and outputs a signal (output signal) that is output from the circuit (internal circuit) in the semiconductor chip CP2 to the terminals TE4.

Any one of the terminals TE4 (leads LD) of the semiconductor device PKG is connected to the power supply (battery) BAT arranged outside the semiconductor device PKG, via a regulator REG. A voltage from the power supply BAT is converted by the regulator REG into an adequate voltage as a power supply voltage for the semiconductor chip CP2, and the converted voltage is supplied to the terminal TE4 connected to the regulator REG and is finally supplied to the semiconductor chip CP2 via the wire BW connected to the terminal TE4.

The pad electrodes P2a among the pad electrodes P2 of the semiconductor chip CP2 are electrically connected to the pad electrodes P1a among the pad electrodes P1 of the semiconductor chip CP1 via the wires BW (BW1), respectively. The pad electrodes P1a among the pad electrodes P1 of the semiconductor chip CP1 are electrically connected to the pad electrodes P1b among the pad electrodes P1 of the semiconductor chip CP1 via the internal wirings NH of the semiconductor chip CP1, respectively. The pad electrodes P1b among the pad electrodes P1 of the semiconductor chip CP1 are electrically connected to a plurality of terminals TE5 of the semiconductor device PKG via the wires BW (BW2), respectively. Some (leads LD1) of the leads LD included in the semiconductor device PKG correspond to these terminals TE5.

Specifically, each pad electrode P2a of the semiconductor chip CP2 is electrically connected to each pad electrode P1a of the semiconductor chip CP1 via the wire BW (BW1), to each pad electrode P1b of the semiconductor chip CP1 via the internal wiring NH of the semiconductor chip CP1, and also to the terminal TE5 (lead LD) via the wire BW (BW2).

The semiconductor chip CP1 includes at least one circuit formed therein, and preferably includes a plurality of circuits (control circuit CLC, power MOSFETQ1, sense MOSFETQ2, etc.). The internal wirings NH, however, are not electrically connected to any one of those circuits formed in the semiconductor chip CP1. In the semiconductor chip CP1, therefore, the pad electrodes P1a, the pad electrodes P1b, and the internal wirings NH connecting the pad electrodes P1a to the pad electrodes P1b are not electrically connected to any one of the circuits (control circuit CLC, power MOSFETQ1, sense MOSFETQ2, etc.) in the semiconductor chip CP1.

Outside the semiconductor device PKG, the terminals TE4 and TE5 connected to the pad electrodes P2 of the semiconductor chip CP2 are electrically connected to the terminals TE3 when necessary. For example, the semiconductor device PKG is mounted on a wiring substrate (mount substrate), where the terminals TE4 and TE5 of the semiconductor device PKG can be electrically connected to the terminals TE3 of the semiconductor device PKG via wirings of the wiring substrate. As a result, an internal circuit of the semiconductor chip CP2 can be electrically connected to the control circuit CLC of the semiconductor chip CP1 via wirings outside the semiconductor device PKG (e.g., wirings of the wiring substrate having the semiconductor device PKG mounted thereon). Hence the control circuit CLC of the semiconductor chip CP1 can be controlled by the internal circuit of the semiconductor chip CP2.

An internal circuit of the semiconductor chip CP1 means a circuit formed in the semiconductor chip CP1, and an internal circuit of the semiconductor chip CP2 means a circuit formed in the semiconductor chip CP2. Internal wirings of the semiconductor chip CP1 mean wirings formed in the semiconductor chip CP1, and internal wirings of the semiconductor chip CP2 mean wirings formed in the semiconductor chip CP2. The control circuit CLC, power MOSFETQ1, and sense MOSFETQ2 are all formed in the semiconductor chip CP1, and are therefore the internal circuits of the semiconductor chip CP1.

<Structure of Semiconductor Chip>

The structure of the semiconductor chip CP1 will then be described.

Figure 20:
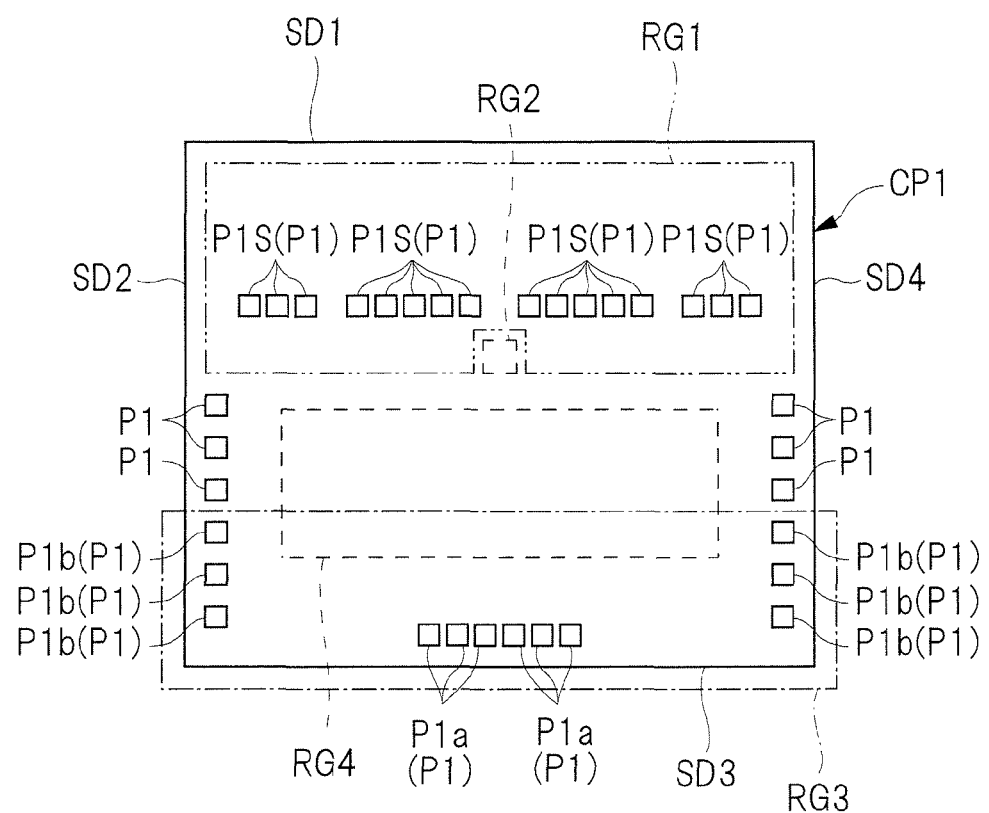
FIG. 20 is a plan view of a layout of the semiconductor chip used in the semiconductor device according to one embodiment of the present invention.
Figure 21:
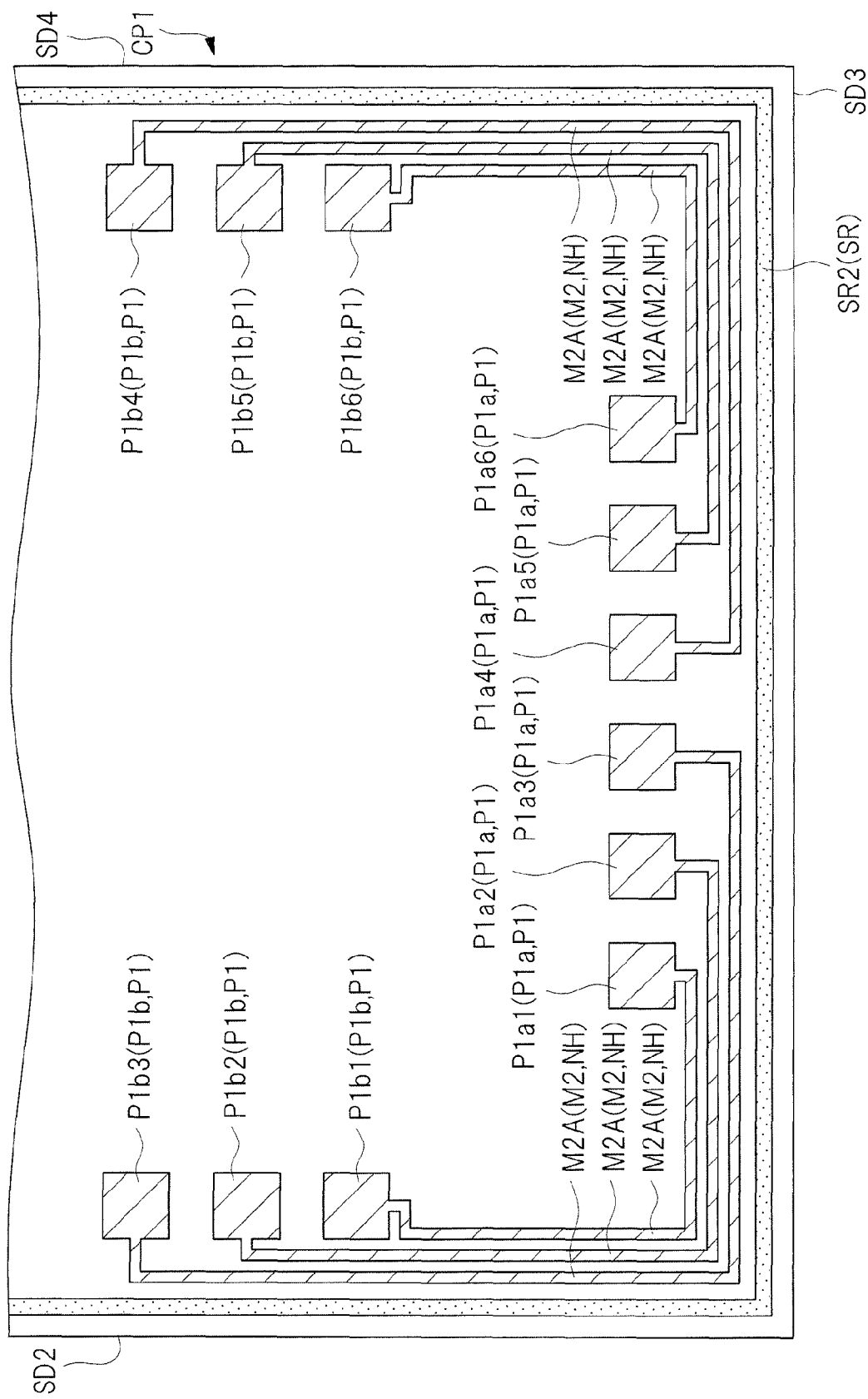
FIG. 21 is a partially enlarged plan view of the semiconductor chip shown in FIG. 20.
Figure 22:
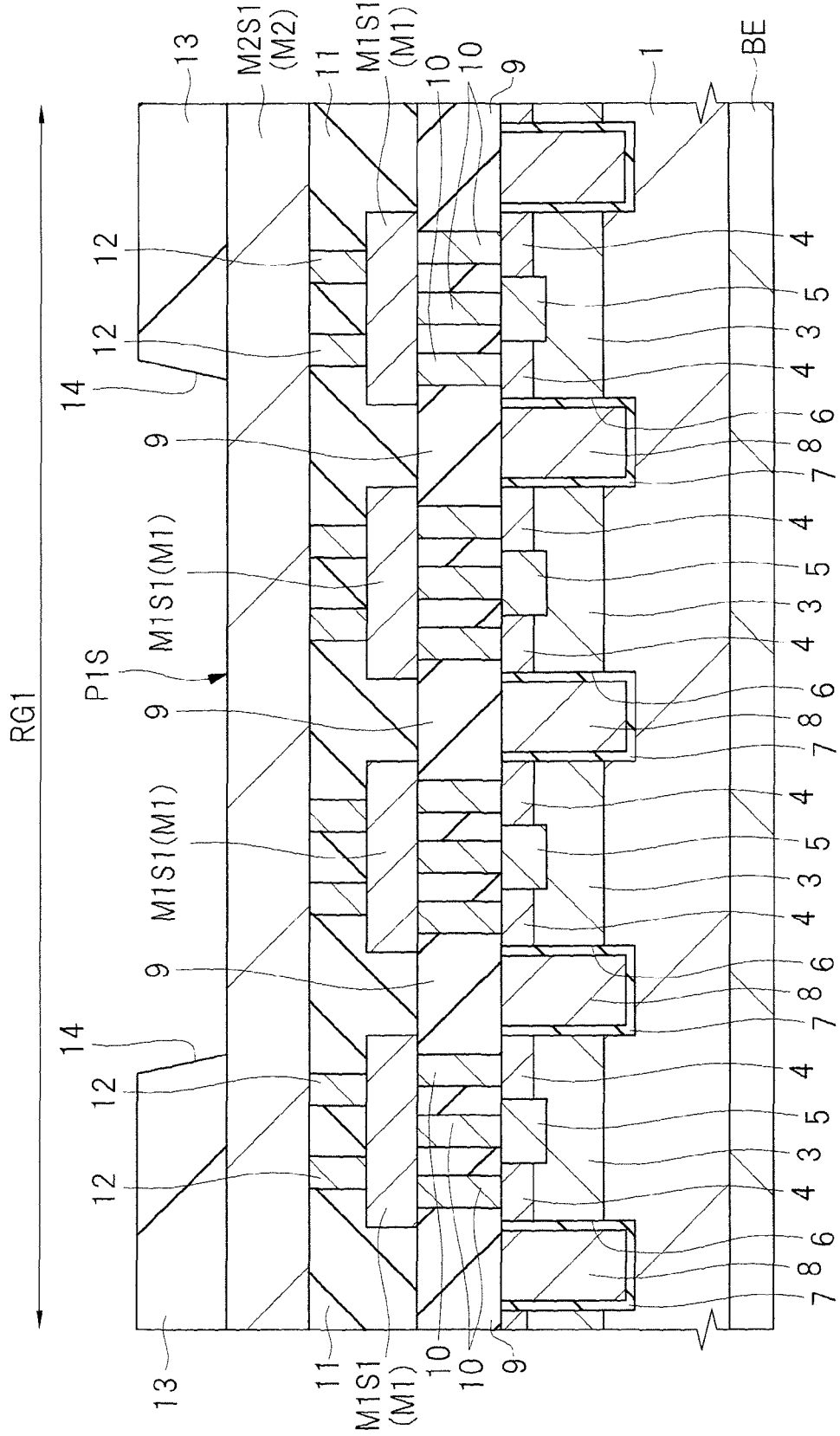
FIG. 22 is a cross-sectional view of main parts of the semiconductor chip shown in FIG. 20.
Figure 23:
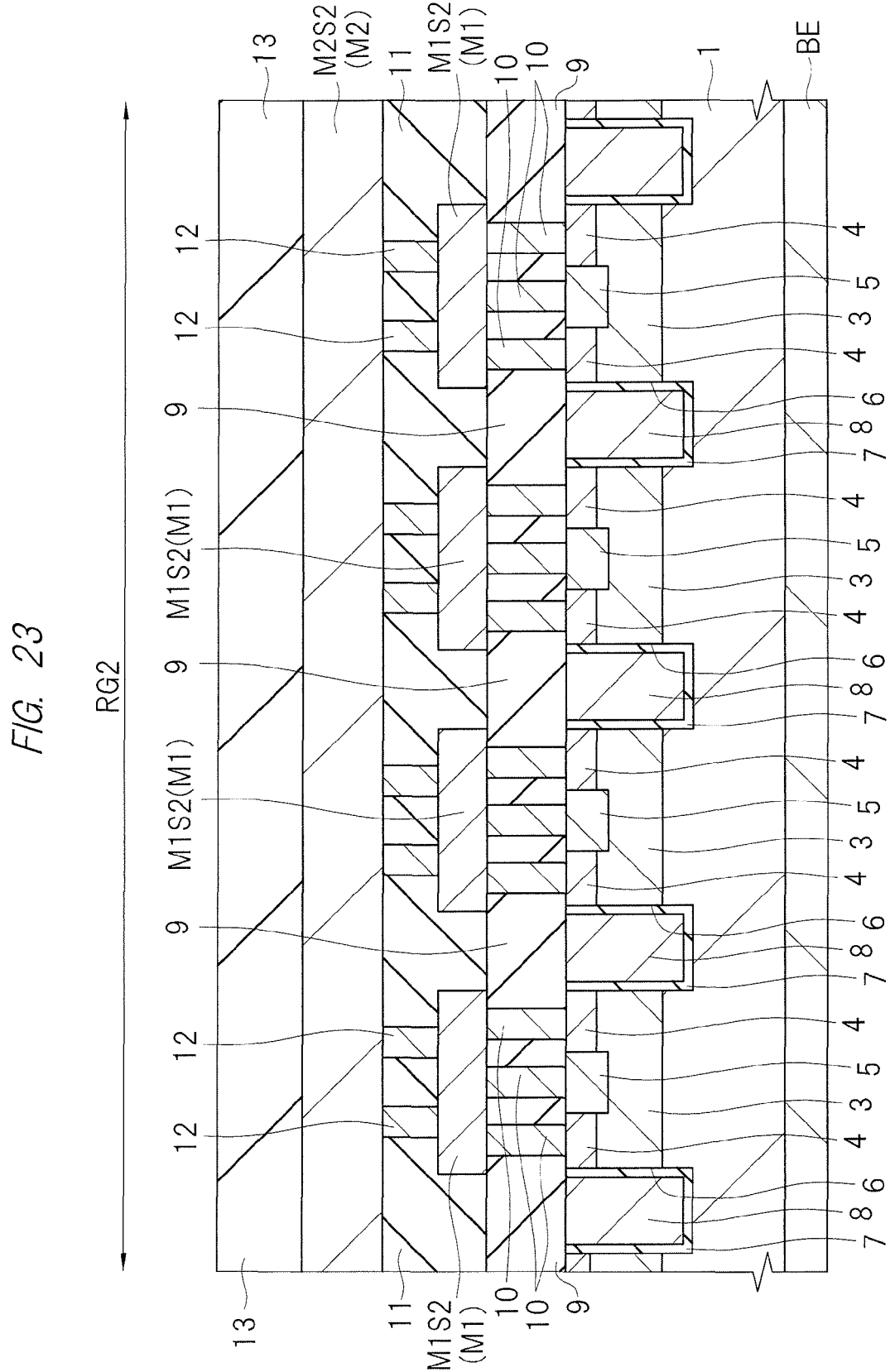
FIG. 23 is a cross-sectional view of main parts of the semiconductor chip shown in FIG. 20.
Figure 24:
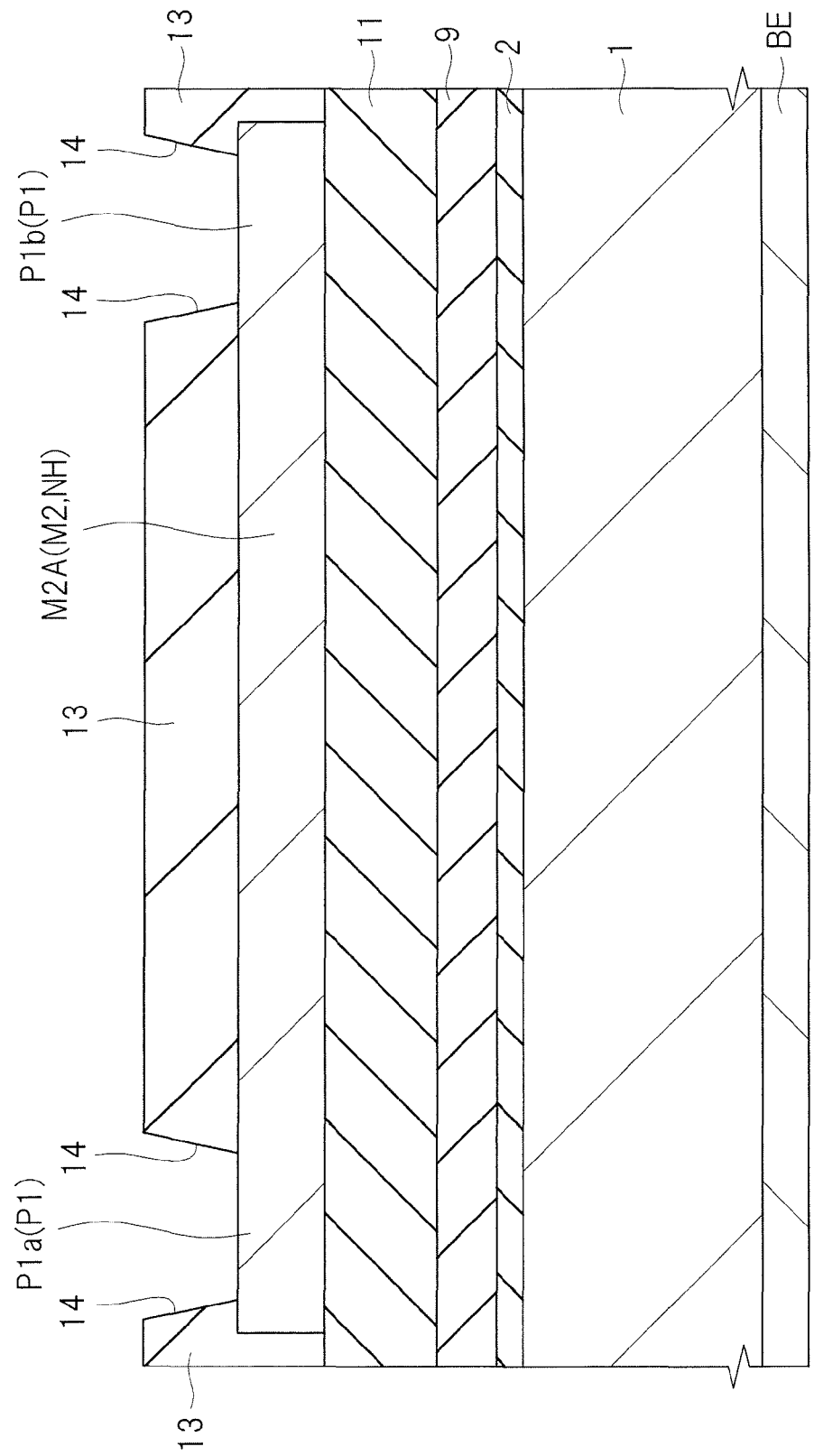
FIG. 24 is a cross-sectional view of main parts of the semiconductor chip shown in FIG. 20.

FIG. 20 is a plan view of a layout of the semiconductor chip CP1, FIG. 21 is a partially enlarged plan view (plan view of main parts) of the semiconductor chip CP1, and FIGS. 22 to 24 are cross-sectional views of main parts of the semiconductor chip CP1. FIG. 21 is a partially enlarged plan view of a region RG3 encircled with a single-dot chain line in FIG. 20, showing a plan layout of the pad electrodes P1, the internal wirings NH, and a seal ring SR. FIG. 22 is a cross-sectional view of main parts of a region in the semiconductor chip CP1 (power MOSFET forming region RG1) where transistors making up the above power MOSFETQ1 are formed. FIG. 23 is a cross-sectional view of main parts of a region in the semiconductor chip CP1 (sense MOSFET forming region RG2) where transistors making up the above sense MOSFETQ2 are formed. FIG. 24 is a cross-sectional view of the semiconductor chip CP1 that is taken along the pad electrodes P1a, pad electrodes P1b, and internal wirings NH connecting the pad electrodes P1a to the pad electrodes P1b.

The region (plane region) in the semiconductor chip CP1 where the transistors making up the power MOSFETQ1 are formed is referred to as power MOSFET forming region RG1. The region (plane region) in the semiconductor chip CP1 where the transistors making up the sense MOSFETQ2 are formed is referred to as sense MOSFET forming region RG2. A region (plane region) in the semiconductor chip CP1 where the control circuit CLC is formed is referred to as control circuit forming region RG4. In FIG. 20, the power MOSFET forming region RG1 is indicated by a two-dot chain line, and each of the sense MOSFET forming region RG2 and the control circuit forming region RG4 is indicated by a dotted line.

Comparing FIG. 20 with FIGS. 2, 3, and 9 reveals that the semiconductor chips CP1 and CP2 are arranged side by side such that the control circuit forming region RG4 is closer to the semiconductor chip CP2 than the power MOSFET forming region RG1 is. In other words, the semiconductor chips CP1 and CP2 are arranged side by side such that the power MOSFET forming region RG1 is more distant from the semiconductor chip CP2 than the control circuit forming region RG4 is. To put it another way, the semiconductor chips CP1 and CP2 are arranged side by side, and when seen in a plan view, the control circuit forming region RG4 formed in the semiconductor chips CP1 lies between the power MOSFET forming region RG1 formed in the semiconductor chips CP1 and the semiconductor chip CP2.

The structure of the region (plane region) in the semiconductor chip CP1 where the transistors making up the power MOSFETQ1 are formed will first be described.

The power MOSFETQ1 is formed on a main surface of a semiconductor substrate 1 making up the semiconductor chip CP1.

As shown in FIGS. 22 to 24, the semiconductor substrate 1 making up the semiconductor chip CP1 is made of n-type single-crystal silicon doped with an n-type impurity, such as arsenic (As). The semiconductor substrate 1 may be provided as a semiconductor substrate (so-called epitaxial wafer) where an epitaxial layer (semiconductor layer) made of n-type single-crystal silicon with lower impurity concentration if formed on a substrate body made of n-type single-crystal silicon.

A field insulating film (element isolation region) 2 made of, for example, silicon oxide is formed on the main surface of the semiconductor substrate 1. The field insulating film 2 is made of an insulator, such as silicon oxide, and functions as an element isolation region for defining (demarcating) an active region. The field insulating film 2 can be formed by using a LOCOS (Local Oxidization of Silicon) method, etc. The field insulating film 2 may be replaced with an element isolation insulating film formed by using an STI (Shallow Trench Isolation) method.

In the power MOSFET forming region RG1, a plurality of unit transistor cells making up the power MOSFETQ1 are formed in an active region encircled with the field insulating film 2. The power MOSFETQ1 is formed by having these unit transistor cells connected in parallel in the power MOSFET forming region RG1. In the sense MOSFETQ2 forming region RG2, a plurality of unit transistor cells making up the sense MOSFETQ2 are formed in an active region encircled with the field insulating film 2 and a p-type well PWL below the field insulating film 2. The sense MOSFETQ2 is formed by having these unit transistor cells connected in parallel in the sense MOSFET forming region RG2.

Each of the unit transistor cells formed in the power MOSFET forming region RG1 is basically identical in structure (configuration) with each of the unit transistor cells formed in the sense MOSFET forming region RG2. The power MOSFET forming region RG1, however, is different in area from the sense MOSFET forming region RG2. Specifically, the power MOSFET forming region RG1 is larger in area than the sense MOSFET forming region RG2. In other words, the sense MOSFET forming region RG2 is smaller in area than the power MOSFET forming region RG1. For this reason, the power MOSFET forming region RG1 is different in the number of connected unit transistor cells from the sense MOSFET forming region RG2. The number of unit transistor cells connected in parallel to make up the sense MOSFETQ2 is smaller the number of unit transistor cells connected in parallel to make up the power MOSFETQ1. If a source voltage to the sense MOSFETQ2 and a source voltage to the power MOSFETQ1 are the same, therefore, the sense MOSFETQ2 generates a current flow smaller than a current flow generated by the power MOSFETQ1. Each unit transistor cell in the power MOSFET forming region RG1 and the sense MOSFET forming region RG2 is formed as, for example, an n-channel MOSFET having a trench gate structure.

The semiconductor substrate 1 functions as the drain regions of the unit transistor cells. The whole back surface of the semiconductor substrate 1 (semiconductor chip CP1) is formed with the drain back surface electrode (back surface drain electrode or drain electrode) BE. This back surface electrode BE is formed by, for example, vertically stacking a titanium (Ti) layer, a nickel (Ni) layer, and a gold (Au) layer in increasing order on the back surface of the semiconductor substrate 1. In the semiconductor device PKG, the back surface BE of the semiconductor chip CP1 is bonded to the die pad DP via the bond BD1 and is therefore electrically connected to the die pad DP.

In the power MOSFET forming region RG1 and the sense MOSFET forming region RG2, a p-type semiconductor region 3 formed in the semiconductor substrate 1 functions as a region for forming the channels of the unit transistor cells. $N^+$-type semiconductor regions 4 formed on top of the p-type semiconductor region 3 function as the source regions of the unit transistor cells. The semiconductor regions 4, therefore, serve as source semiconductor regions. $P^+$-type semiconductor regions 5 are formed on top of the p-type semiconductor region 3, and each of the $p^+$-type semiconductor regions 5 is sandwiched between $n^+$-type semiconductor regions 4 adjacent to each other. The impurity concentration of the $p^+$-type semiconductor regions 5 is higher than that of the p-type semiconductor region 3.

In the power MOSFET forming region RG1 and the sense MOSFET forming region RG2, trenches 6 are formed on the semiconductor substrate 1 such that they extend in the thickness direction of the semiconductor substrate 1, from the main surface of the semiconductor substrate 1. Each trench 6 is formed such that it extends from the upper surface of the $n^+$-type semiconductor region 4, penetrates the $n^+$-type semiconductor region 4 and p-type semiconductor region 3, and terminates in the semiconductor substrate 1 under the $n^+$-type semiconductor region 4 and p-type semiconductor region 3. On the bottom and side surfaces of the trench 6, a gate insulating film 7 made of silicon oxide, etc. is formed. The trench 6 is filled with a gate electrode 8 via the gate insulating film 7. The gate electrode 8 is made of, for example, a polycrystal silicon film doped with an n-type impurity (e.g., phosphorus). The electrode 8 functions as the gate electrode of the unit transistor cell.

On the main surface of the semiconductor substrate 1, an interlayer insulating film 9 is formed so as to cover the gate electrodes 8. The interlayer insulating film 9 has contact holes (openings or through-holes) formed thereon, each of which is filled with a conductive plug (via) 10.

A wiring M1 is formed on the interlayer insulating film 9 that is filled with the plugs 10. The wiring M1 is a wiring on a first wiring layer.

On the interlayer insulating film 9, an interlayer insulating film 11 is formed so as to cover the wiring M1. The interlayer insulating film 11 has through-holes (openings) formed thereon, each of which is filled with a conductive plug (via) 12.

On the interlayer insulating film 11 that is filled with the plugs 12, a wiring M2 and the pad electrode (bonding pad) P1 are formed. The wiring M2 is a wiring on a second wiring layer.

The wiring M1 is made of a conductive film, specifically, made of a metal film, and should preferably be made of an aluminum film or aluminum alloy film. Likewise, each of the wiring M2 and the pad electrode P1 is made of a conductive film, specifically, made of a metal film, and should preferably be made of an aluminum film or aluminum alloy film.

Figure 25:
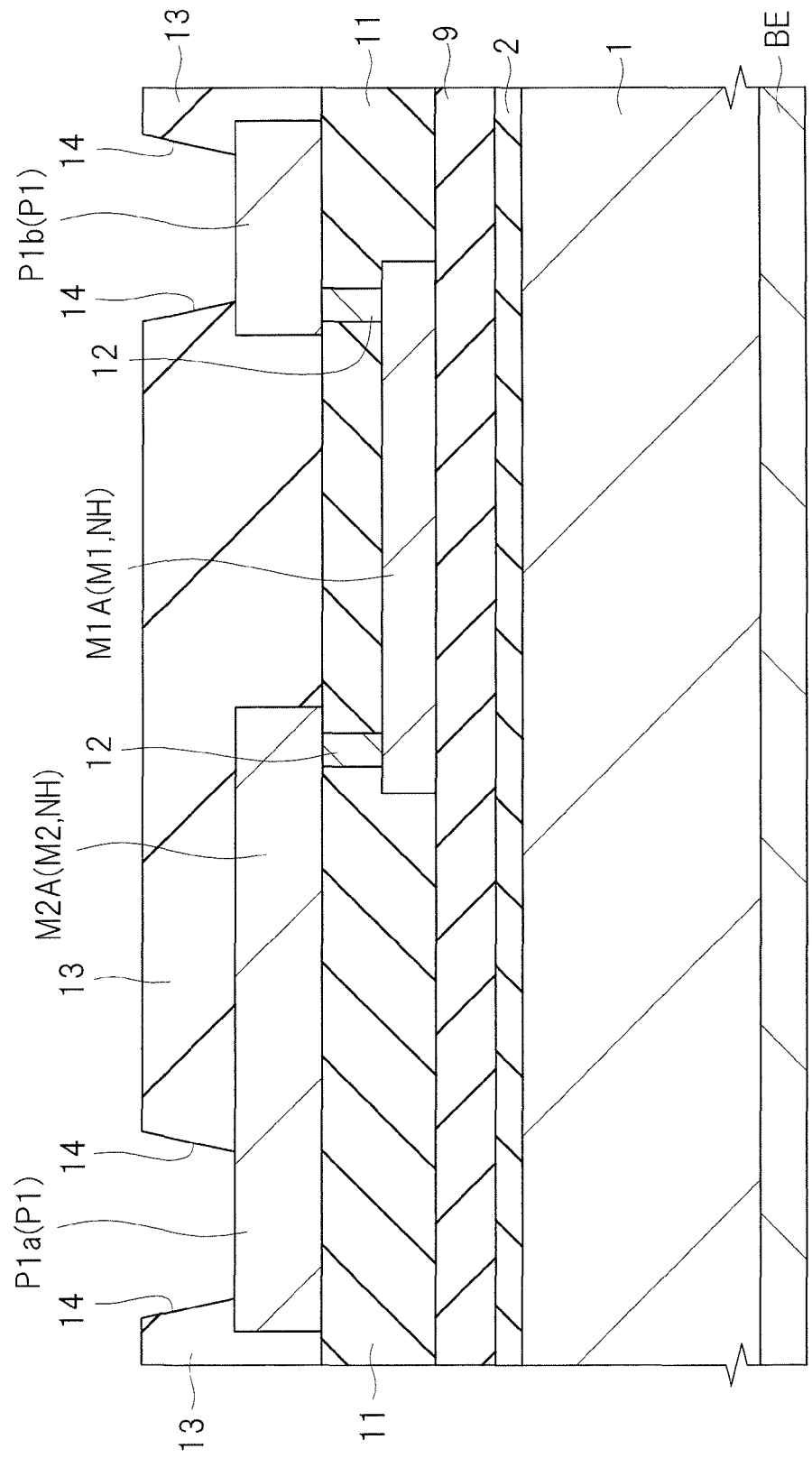
FIG. 25 is a cross-sectional view of main parts of the semiconductor chip showing a modification example of FIG. 24.
Figure 26:
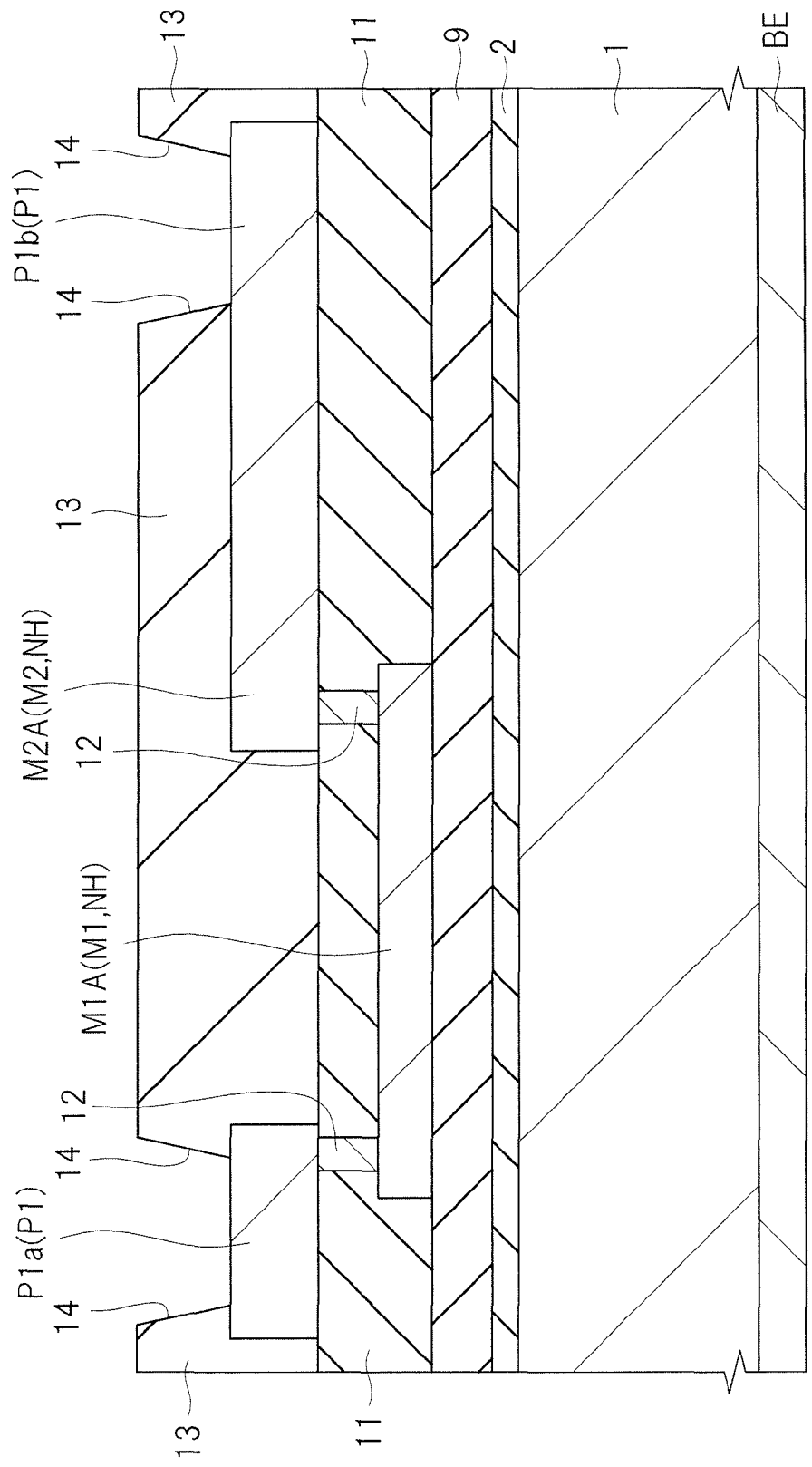
FIG. 26 is a cross-sectional view of main parts of the semiconductor chip showing a modification example of FIG. 24.

The wiring M1 includes a gate wiring (not shown), a source wiring M1S1, and a source wiring M1S2. As shown in FIGS. 25 and 26, which will be referred to later, the wiring M1 further includes a wiring M1A, which will be described later. The wiring M2 includes a gate wiring (not shown), a source wiring M2S1, a source wiring M2S2, and a wiring M2A. Of these wirings, the wirings M2A and M1A, which will be descried later, are wirings making up the above internal wirings NH, and are not formed in the power MOSFET forming region RG1 and the sense MOSFET forming region RG2. The source wirings M1S1 and M2S1, however, are formed in the power MOSFET forming region RG1 and the source wirings M1S2 and M2S2 are formed in the sense MOSFET forming region RG2.

In the power MOSFET forming region RG1, the source $n^+$-type semiconductor regions 4 are electrically connected to the source wiring M1S1 via the plugs 10 arranged on the semiconductor regions 4, and the $p^+$-type semiconductor region 5 is also electrically connected to the source wiring M1S1 via the plug 10 arranged on the semiconductor region 5. In the power MOSFET forming region RG1, therefore, the semiconductor regions 4 and the semiconductor region 5 adjacent to each other are electrically connected to the common source wiring M1S1 via the plugs 10, respectively. The M1S1 is electrically connected to the source wiring M2S1 via the plugs 12 arranged between the source wiring M1S1 and the source wiring M2S1. In the power MOSFET forming region RG1, the $p^+$-type semiconductor region 5 is the same in conductive type as the p-type semiconductor region 3 and is in contact with the semiconductor region 3, and is therefore electrically connected to the p-type semiconductor region 3. As a result, the source wiring M2S1 is electrically connected to the source $n^+$-type semiconductor regions 4 formed in the power MOSFET forming region RG1 and also to the p-type semiconductor region 3 for channel formation in the power MOSFET forming region RG1, through the plugs 12, source wiring M1S1, and plugs 10 that are formed in the power MOSFET forming region RG1. The source wiring M2S1 is formed to extend across almost the entire power MOSFET forming region RG1. The source wiring M2S1 has its part exposed from an opening 14 of the protective film 13, and the above source pad P1S is formed by this exposed part of the source wiring M2S1.

In the sense MOSFET forming region RG2, the source $n^+$-type semiconductor regions 4 are electrically connected to the source wiring M1S2 via the plugs 10 arranged on the semiconductor regions 4, and the $p^+$-type semiconductor region 5 is also electrically connected to the source wiring M1S2 via the plug 10 arranged on the semiconductor region 5. In the sense MOSFET forming region RG2, therefore, the semiconductor regions 4 and the semiconductor region 5 adjacent to each other are electrically connected to the common source wiring M1S2 via the plugs 10, respectively. The source wiring M1S2 is electrically connected to the source wiring M2S2 via the plugs 12 arranged between the source wiring M1S2 and the source wiring M2S2. In the sense MOSFET forming region RG2, the $p^+$-type semiconductor region 5 is the same in conductive type as the p-type semiconductor region 3 and is in contact with the semiconductor region 3, and is therefore electrically connected to the p-type semiconductor region 3. As a result, the source wiring M2S2 is electrically connected to the source $n^+$-type semiconductor regions 4 formed in the sense MOSFET forming region RG2 and also to the channel-forming p-type semiconductor region 3 in the sense MOSFET forming region RG2, through the plugs 12, source wiring M1S2, and plugs 10 that are formed in the sense MOSFET forming region RG2. The source wiring M2S2 is formed to extend across almost the entire sense MOSFET forming region RG2. The source wiring M2S2 is covered with the protective film 13.

The source wirings M1S2 and M2S2 are electrically connected to the control circuit CLC formed in the semiconductor chip CP1.

The gate electrodes 8 formed in the power MOSFET forming region RG1 and sense MOSFET forming region RG2 are electrically connected to each other and are electrically connected to the control circuit CLC formed in the semiconductor chip CP1, via the plugs 10, gate wiring (not shown) of the wiring M1, plugs 12, and gate wiring (not shown) of the wiring M2.

In this description, a case where the plugs 10 and the wiring M1 are formed as separate elements is shown and also a case where the plugs 12 and the wiring M2 are formed as separate elements is shown. In such a case, contact holes are formed on the interlayer insulating film 9, and the plugs 10 that fill up the contact holes are formed, and a conductive film (metal film) for the wiring M1 is formed on the interlayer insulating film 9 that is filled with the plugs 10, and then the conductive film is patterned to form the wiring M1. The wiring M1 is, therefore, formed by the patterned conductive film. In the same manner, through-holes are formed on the interlayer insulating film 11, and the plugs 12 that fill up the through-holes are formed, and a conductive film (metal film) having the functionality of the wiring M2 and pad electrode P1 is formed on the interlayer insulating film 11 that is filled with the plugs 12, and then the conductive film is patterned to form the wiring M2 and a conductor pattern making up the pad electrode P1. The wiring M2 and the conductor pattern making up the pad electrode P1 are, therefore, formed by the patterned conductive film.

In another case, the plugs 10 may be formed integrally with the wiring M1 and the plugs 12 may also be formed integrally with the wiring M2. In such a case, contact holes are formed on the interlayer insulating film 9, and a conductive film (metal film) for the wiring M1 is formed on the interlayer insulating film 9 including the contact holes, and then the conductive film is patterned to form the wiring M1. In this process, the contact holes of the interlayer insulating film 9 are filled with part of the wiring M1 (part of wiring M1 that is equivalent to the plugs 10). In the same manner, through-holes are formed on the interlayer insulating film 11, and a conductive film (metal film) having the functionality of the wiring M2 and pad electrode P1 is formed on the interlayer insulating film 11 including the through-holes, and then the conductive film is patterned to form the wiring M2 and a conductor pattern making up the pad electrode P1. In this process, the through-holes of the interlayer insulating film 11 are filled with part of the wiring M2 (part of wiring M2 that is equivalent to the plugs 12), or with part of the conductor pattern making up the pad electrode P1.

On the interlayer insulating film 11, the insulating protective film (insulating film) 13 is formed so as to cover the wiring M2 and the pad electrode P1. The protective film 13 is made up of, for example, a resin film, such as polyimide resin film, and is a film (insulating film) on the uppermost layer of the semiconductor chip CP1. The protective film 13 has a plurality of openings 14, through each of which part of the conductor pattern making up the pad electrode P1 or part of the source wiring M2S1 is exposed. The source pad electrode P1S is formed by the source wiring M2S1 exposed from the opening 14 of the protective film 13, while the pad electrode P1 other than the source pad electrode P1S is formed by a conductor pattern (conductor pattern for the pad electrode P1) formed on the same layer where the wiring M2 is formed. The conductor pattern making up the pad electrode P1 other than the source pad electrode P1S has the outer periphery covered with the protective film 13 and the central part exposed from the opening 14 of the protective film 13, and the wire BW can be connected to the central part.

The conductor pattern making up the pad electrode P1 other than the source pad electrode P1S is formed on the same layer where the wiring M2 is formed, by the same process by which the wiring M2 is formed, and has, for example, a rectangular plane shape. In this manner, during the manufacturing process for the semiconductor chip CP1, the conductive film formed on the interlayer insulating film 11 is patterned to form the wiring M2 including the source wirings M2S1 and M2S2 and wiring M2A and the conductor pattern making up the pad electrode P1 other than the source pad electrode P1S.

In FIG. 20, the plurality of source pad electrodes P1S serving as the source pad electrodes for the power MOSFETQ1 are separated from each other via the protective film 13 on the uppermost layer, but are electrically connected through the source wirings M2S1 and M1S1.

The surface of each of the pad electrodes P1 (including the source pad electrodes P1S) exposed from the openings 14 may be have a metal layer (not shown) formed thereon by plating. The metal layer is provided as, for example, a stacked film constructed by vertically stacking a copper (Cu) film, a nickel (Ni) film, and a gold (Au) film in increasing order, or as a stacked film constructed by vertically stacking a titanium (Ti) film, a nickel (Ni) film, and a gold (Au) film in increasing order.

According to the semiconductor chip CP1 configured in the above manner, the working current of each unit transistor making up the power MOSFETQ1 and sense MOSFETQ2 flows in the thickness direction of the semiconductor substrate 1 between the drain n-type semiconductor substrate 1 and the source n$^+$-type semiconductor region 4 along the side surfaces of the gate electrode 8 (i.e., side surfaces of the trench 6). This means that the channel is formed in the thickness direction of the semiconductor chip CP1.

As indicated above, the semiconductor chip CP1 is a semiconductor chip including vertical MOSFETs having a trench gate structure. Each of the power MOSFETQ1 and the sense MOSFETQ2 is composed of trench gate type MISFETs. The vertical MOSFET refers to a MOSFET in which source-drain current flows in the thickness direction of the semiconductor substrate (i.e., direction almost perpendicular to the main surface of the semiconductor substrate).

The wiring M2A is a wiring making up the internal wiring NH. As described above, in the semiconductor chip CP1, the pad electrode P1a is electrically connected to the pad electrode P1b via the internal wiring NH of the semiconductor chip CP1. In the case of FIGS. 21 and 24, the internal wiring NH is formed by the wiring M2A, which is included in the wiring M2 on the second wiring layer. The wiring M2A serves as the wiring that electrically connects the pad electrode P1a to the pad electrode P1b.

In the case of FIGS. 21 and 24, the internal wiring NH connecting the pad electrode P1a to the pad electrode P1b is formed by the wiring M2A. In the semiconductor chip CP1, therefore, the pad electrode P1a is connected to the pad electrode P1b via the wiring M2A. In the case of FIGS. 21 and 24, one end of the wiring M2A is connected integrally to the pad electrode P1a while the other end of the same is connected integrally to the pad electrode P1b, as a result of which the pad electrode P1a and the pad electrode P1b are electrically connected through the wiring M2A formed on the same layer where the pad electrodes P1a and P1b are formed. In the case of FIGS. 21 and 24, therefore, the wiring M2A electrically connects the pad electrode P1a to the pad electrode P1b, while the wiring M1 makes no contribution to connecting the pad electrode P1a to the pad electrode P1b.

The semiconductor chip CP1 includes the plurality of pad electrodes P1a and the plurality of pad electrodes P1b. These pad electrodes P1a and pad electrodes P1b are electrically connected to each other via the internal wirings NH of the semiconductor chip CP1. In the case of FIG. 21, the pad electrodes P1a included in the semiconductor chip CP1 include six pad electrodes P1a1, P1a2, P1a3, P1a4, P1a5, and P1a6, and the pad electrodes P1b included in the semiconductor chip CP1 include six pad electrodes P1b1, P1b2, P1b3, P1b4, P1b5, and P1b6. The pad electrode P1a1 and the pad electrode P1b1 are electrically connected to each other through the wiring M2A linking both pad electrodes, the pad electrode P1a2 and the pad electrode P1b2 are electrically connected to each other through the wiring M2A linking both pad electrodes, and the pad electrode P1a3 and the pad electrode P1b3 are electrically connected to each other through the wiring M2A linking both pad electrodes. Likewise, the pad electrode P1a4 and the pad electrode P1b4 are electrically connected to each other through the wiring M2A linking both pad electrodes, the pad electrode P1a5 and the pad electrode P1b5 are electrically connected to each other through the wiring M2A linking both pad electrodes, and the pad electrode P1a6 and the pad electrode P1b6 are electrically connected to each other through the wiring M2A linking both pad electrodes. The wiring M2A is the wiring for electrically connecting the pad electrode P1a to the pad electrode P1b, and is not electrically connected to any circuit formed in the semiconductor chip CP1.

In the case of FIGS. 21 and 24, the pad electrode P1a and the pad electrode P1b are linked by the wiring M2A, through which the pad electrode P1a and the pad electrode P1b are electrically connected. However, as shown in FIGS. 25 and 26, the pad electrode P1a may be electrically connected to the pad electrode P1b via the wiring M2A and the wiring M1A. FIGS. 25 and 26 correspond to a modification example of the semiconductor chip of FIG. 24. The wiring M2A included in the wiring M2 on the second wiring layer is the wiring for electrically connecting the pad electrode P1a to the pad electrode P1b, and the wiring M1A included in the wiring M1 on the first wiring layer is also the wiring for electrically connecting the pad electrode P1a to the pad electrode P1b. Although the wiring M2A and the wiring M1A are formed on different wiring layers, respectively, both of them serve as the wirings for electrically connecting the pad electrode P1a to the pad electrode P1b, and are therefore not electrically connected to any circuit formed in the semiconductor chip CP1.

In the case of FIGS. 25 and 26, the internal wiring NH connecting the pad electrode P1a to the pad electrode P1b is formed by the wiring M2A and the wiring M1A. In the semiconductor chip CP1, therefore, the pad electrode P1a is connected to the pad electrode P1b via the wiring M2A and the wiring M1A.

In the case of FIG. 25, one end of the wiring M2A is connected integrally to the pad electrode P1a, while the other end of the same is electrically connected to one end of the wiring M1A via the plug 12 (which is arranged between the wiring M1A and the wiring M2A), and the other end of the wiring M1A is connected to the pad electrode P1b via the plug 12 (which is arranged between the wiring M1A and the pad electrode P1b). In this manner, the pad electrode P1a is electrically connected to the pad electrode P1b via the wiring M2A and plug 12 (which is arranged between the wiring M1A and the wiring M2A) and the wiring M1A and plug 12 (which is arranged between the wiring M1A and the pad electrode P1*b*).

In the case of FIG. 26, one end of the wiring M2A is connected integrally to the pad electrode P1*b*, while the other end of the same is electrically connected to one end of the wiring M1A via the plug 12 (which is arranged between the wiring M1A and the wiring M2A), and the other end of the wiring M1A is connected to the pad electrode P1*a* via the plug 12 (which is arranged between the wiring M1A and the pad electrode P1*a*). In this manner, the pad electrode P1*a* is electrically connected to the pad electrode P1*b* via the wiring M2A and plug 12 (which is arranged between the wiring M1A and the wiring M2A) and the wiring M1A and plug 12 (which is arranged between the wiring M1A and the pad electrode P1*a*).

In the case of FIG. 24, the pad electrode P1*a* is electrically connected to the pad electrode P1*b* by linking the pad electrode P1*a* and the pad electrode P1*b* by the wiring M2A. In the case of FIGS. 25 and 26, the wiring M2A and the wiring M1A contribute to electrically connecting the pad electrode P1*a* to the pad electrode P1*b*.

In the above manner, in the semiconductor chip CP1, the pad electrode P1*a* is electrically connected to the pad electrode P1*b* via the internal wiring NH of the semiconductor chip CP1, which internal wiring NH can be formed by one or both of the wiring M2A and the wiring M1A. In other words, the internal wiring NH electrically connecting the pad electrode P1*a* to the pad electrode P1*b* can be formed by a single layer of wiring or a plurality of layers of wiring.

In FIGS. 25 and 26, the plugs (vias) 12 arranged between the wiring M1A and the wiring M2A and electrically connecting the wiring M1A to the wiring M2A may be regarded as part of the wiring. In FIG. 26, the plug (via) 12 arranged between the wiring M1A and the pad electrode P1*a* and electrically connecting the wiring M1A to the pad electrode P1*a* may be regarded as part of the wiring. In FIG. 25, the plug (via) 12 arranged between the wiring M1A and the pad electrode P1*b* and electrically connecting the wiring M1A to the pad electrode P1*b* may be regarded as part of the wiring. In other words, the plugs (vias) 12 function as via wirings and therefore can be regarded as part of the wiring. The internal wiring NH electrically connecting the pad electrode P1*a* to the pad electrode P1*b*, therefore, can include such via wirings as plugs 12. The via wirings are made of the conductor filling up the through-holes (holes) formed on the interlayer insulating film.

Figure 27:
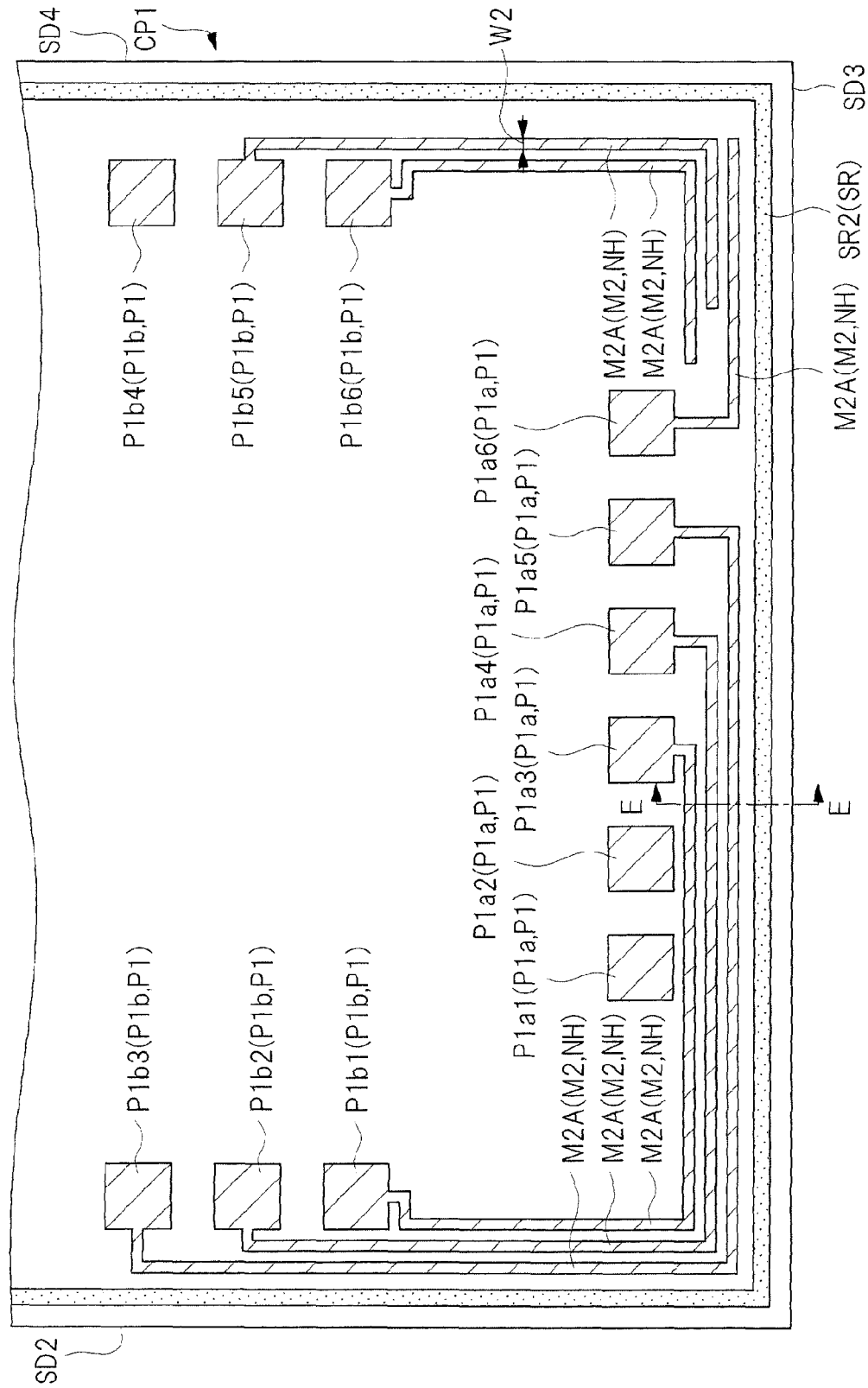
FIG. 27 is a partially enlarged plan view of the semiconductor chip showing a modification example of FIG. 21.
Figure 28:
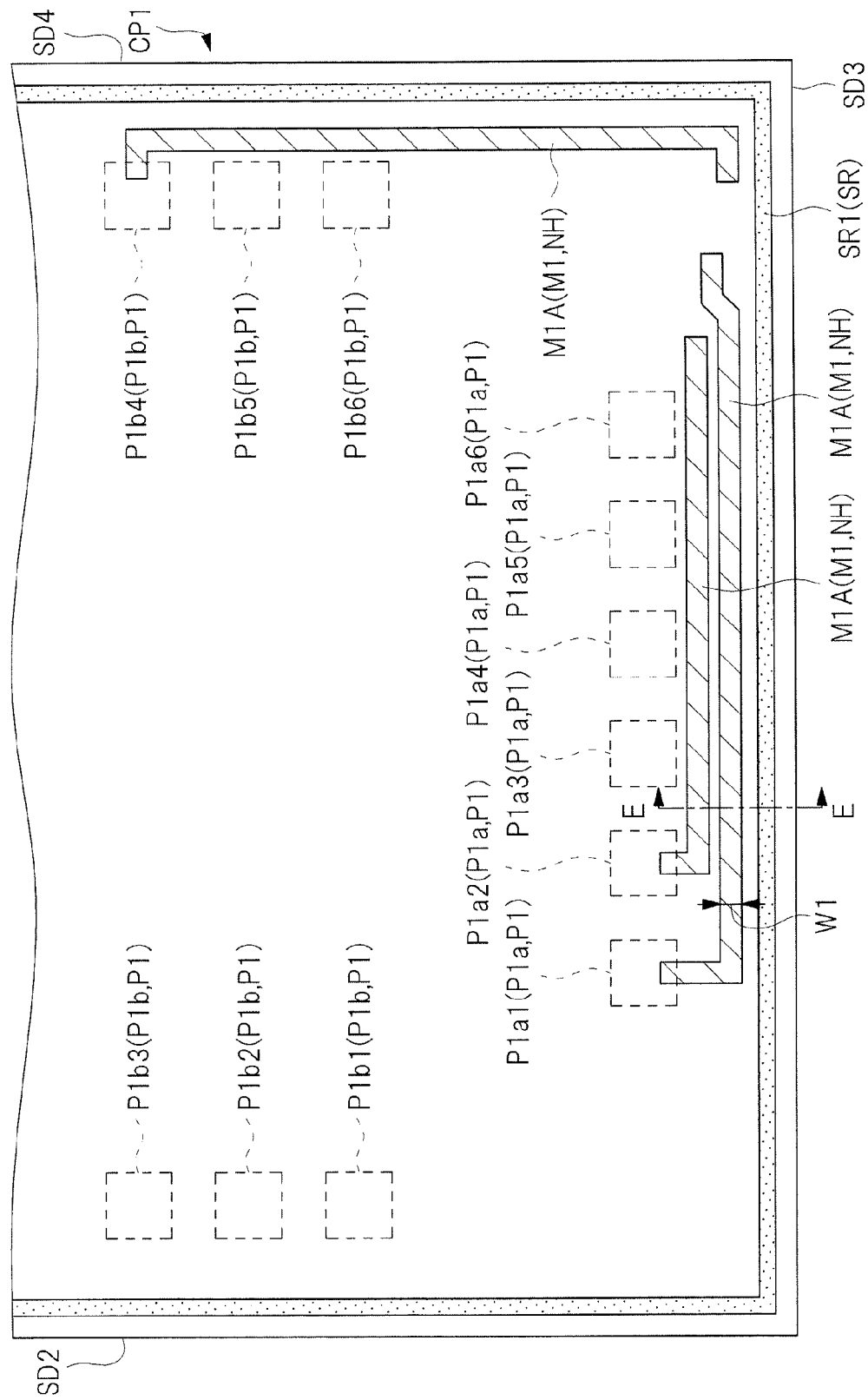
FIG. 28 is a partially enlarged plan view of the semiconductor chip showing a modification example of FIG. 21.

FIGS. 27 and 28 correspond to a modification example of the semiconductor chip of FIG. 21. FIG. 27 shows patterns formed on the same layer where the wiring M2 is formed, and FIG. 28 shows patterns formed on the same layer where the wiring M1 is formed.

In the case of FIGS. 27 and 28, the pad electrode P1*a*1 is electrically connected to the pad electrode P1*b*5 via the wiring M1A and the wiring M2A. This connection relation corresponds to the connection relation indicated in FIG. 26. The pad electrode P1*a*2 is electrically connected to the pad electrode P1*b*6 via the wiring M1A and the wiring M2A. This connection relation corresponds to the connection relation indicated in FIG. 26. The pad electrode P1*a*3 is electrically connected to the pad electrode P1*b*1 via the wiring M2A. This connection relation corresponds to the connection relation indicated in FIG. 24. The pad electrode P1*a*4 is electrically connected to the pad electrode P1*b*2 via the wiring M2A. This connection relation corresponds to the connection relation indicated in FIG. 24. The pad electrode P1*a*5 is electrically connected to the pad electrode P1*b*3 via the wiring M2A. This connection relation corresponds to the connection relation indicated in FIG. 24. The pad electrode P1*a*6 is electrically connected to the pad electrode P1*b*4 via the wiring M2A and the wiring M1A. This connection relation corresponds to the connection relation indicated in FIG. 25.

Figure 29:
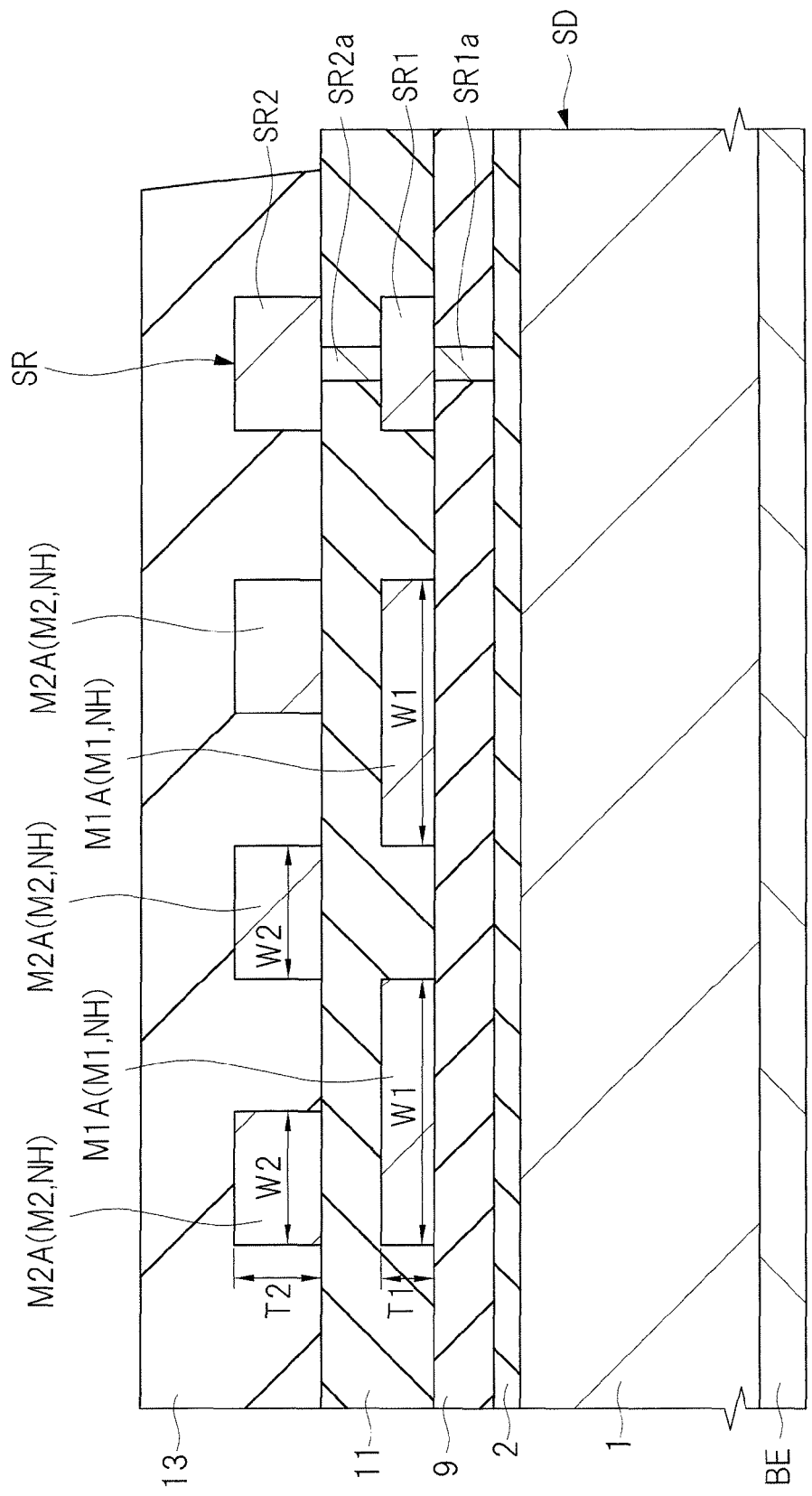
FIG. 29 is a cross-sectional view taken along an E-E line of FIGS. 27 and 28.

FIG. 29 is a cross-sectional view taken along an E-E line of FIGS. 27 and 28. When the pad electrode P1*a* is electrically connected to the pad electrode P1*b* via the wiring M1A and wiring M2A, it is preferable to determine the width W1 of the wiring M1A to be larger than the width W2 of the wiring M2A (W2<W1), as is clearly understood by observing FIGS. 27 to 29. In other words, it is preferable to determine the width W2 of the wiring M2A to be smaller than the width W1 of the wiring M1A. The width W1 of the wiring M1A is the width (dimension) in the direction parallel to the main surface of the semiconductor substrate 1 and almost perpendicular to the direction of extension of the wiring M1. The width W2 of the wiring M2A is the width (dimension) in the direction parallel to the main surface of the semiconductor substrate 1 and almost perpendicular to the direction of extension of the wiring M2.

Determining the width W1 of the wiring M1A to be larger than the width W2 of the wiring M2A (W2<W1) is preferable for the following reasons. The wiring M2 is thicker than the wiring M1. The thicker wiring M2 leads to the thicker conductor pattern making up the pad electrode P1 formed on the same layer where the wiring M2 is formed, in which case the wire BW can be connected more accurately to the pad electrode P1. Hence the thickness (T2) of the wiring M2A is determined to be larger than the thickness (T1) of the wiring M1A (T1<T2). In other words, the thickness (T1) of the wiring M1A is determined to be smaller than the thickness (T2) of the wiring M2A. The wirings M1A and M2A are the wirings for electrically connecting the pad electrode P1*a* to the pad electrode P1*b*, and the resistance (wiring resistance) of the wirings M1A and M2A should desirably be reduced to some extent. The wiring M2A has the larger thickness (T2) and therefore its wiring resistance is reduced easily. The wiring M1A, on the other hand, has the smaller thickness than the thickness of the wiring M2A and therefore tends to show greater wiring resistance. In this case, the wiring resistance of the wiring M1A is reduced by increasing the width W1 of the wiring M1A. According to this embodiment, the wiring M1A smaller in thickness than the wiring M2A is increased in its width W1 to suppress its resistance (wiring resistance) of the wirings M1A. The wiring M2A larger in thickness than the wiring M1A, in contrast, is reduced in its width W2 to reduce the area of a plane region in which the wiring M2A is placed. As a result, the pad electrode P1*a* can be connected to the pad electrode P1*b* through the wiring with lower resistance, and the semiconductor chip CP1 can be reduced in size (area).

The semiconductor chip CP1 may have the seal ring SR, which may be referred to as guard ring. As shown in FIGS. 21 and 27 to 29, the seal ring SR is formed on the outer periphery of the semiconductor chip CP1. Specifically, when seen in a plan view, the seal ring SR is formed so as to be looped along the outer periphery of the semiconductor chip CP1. Thus, when seen in a plan view, the seal ring SR is formed into a circular shape (ring shape) along the outer periphery of the semiconductor chip CP1, but in order to match the seal ring SR to the almost rectangular outline of the semiconductor chip CP1, the outline of the seal ring is made into an almost rectangular shape, or a rectangular shape with rounded corners, or a rectangular shape with removed corners. In the semiconductor chip CP1, various circuits are formed in an area encircled with the seal ring SR when seen in a plan view. Specifically, in the semiconductor chip CP1, the control circuit CLC, the power MOSFET forming region RG1 (transistors making up the power MOSFETQ1), the sense MOSFET forming region RG2 (transistors making up the sense MOSFETQ2), the wirings M1 and M2, and the conductor pattern for the pad electrode P1 are formed (arranged) in the area encircled with the seal ring SR when seen in a plan view.

The seal ring SR is composed of metal patterns SR1a, SR1, SR2a, and SR2 (see FIG. 29). The seal ring metal pattern SR1 is formed on the same layer where the wiring M1 is formed, by the same process by which the wiring M1 is formed, using the same material as the material making up the wiring M1. The seal ring metal pattern SR2 is formed on the same layer where the wiring M2 is formed, by the same process by which the wiring M2 is formed, using the same material as the material making up the wiring M2. The seal ring metal pattern SR1a is formed on the same layer where the plug 10 is formed, by the same process by which the plug 10 is formed, using the same material as the material making up the plug 10. The seal ring metal pattern SR2a is formed on the same layer where the plug 12 is formed, by the same process by which the plug 12 is formed, using the same material as the material making up the plug 12. In FIG. 29, SD denotes a side surface of the semiconductor chip CP1.

The seal ring SR is made out of these seal ring metal patterns SR1a, SR1, SR2a, and SR2 and formed into a metal wall. Specifically, the seal ring SR is formed into the metal wall by vertically lining up the seal ring metal patterns SR1a, SR1, SR2a, and SR2. More specifically, the seal ring metal patterns SR1a, SR1, SR2a, and SR2 are formed on different layers, respectively, and are stacked up vertically in increasing order to form the seal ring SR as a whole. Hence, when seen in a plan view, the seal ring metal patterns SR1a, SR1, SR2a, and SR2 are formed so as to be looped along the outer periphery of the semiconductor chip CP1, respectively.

Providing the seal ring SR offers an advantage that when a dicing blade causes a crack on a cutting face during a dicing process (cutting process) of the manufacturing process for the semiconductor chip CP1, the sealing ring SR prevents the crack from growing larger. The seal ring SR also prevents water from penetrating through a cutting face (i.e., a side surface) of the semiconductor chip CP1.

The seal ring metal patterns SR1a, SR1, SR2a, and SR2 are formed not for connecting elements or circuits to each other, not for connecting the pad electrode P1 to a circuit, or not for connecting the pad electrodes P1 to each other, but for forming the seal ring SR.

In the semiconductor chip CP1, the wirings M1 and M2 and a plurality of transistors making up the control circuit CLC are formed in the control circuit forming region RG4 but are not shown or described herein.

In the semiconductor chip CP1, the internal wirings NH, i.e., wirings M1A and M2A, electrically connecting the pad electrodes P1a to the pad electrodes P1b are formed along the outer periphery of the semiconductor chip CP1. When the seal ring SR is formed in the semiconductor chip CP1, the internal wirings NH, i.e., wirings M1A and M2A, electrically connecting the pad electrodes P1a to the pad electrodes P1b are formed inside and along the seal ring SR in the semiconductor chip CP1. In semiconductor chip CP1, therefore, the wirings M2A making up the internal wirings NH are formed inside and along the metal pattern SR2 making up the seal ring SR. The wirings M2A and the metal pattern SR2 are, however, separated from each other. In semiconductor chip CP1, the wirings M1A making up the internal wirings NH are formed inside and along the metal pattern SR1 making up the seal ring SR. The wirings M1A and the metal pattern SR1 are, however, separated from each other. This arrangement suppresses an increase in the area of the semiconductor chip CP1 which results from providing the semiconductor chip CP1 with the pad electrodes P1a and P1b and with the internal wirings NH electrically connecting the pad electrodes P1a to the pad electrodes P1b, thus allowing a reduction in the size (area) of the semiconductor chip CP1.

Figure 30:
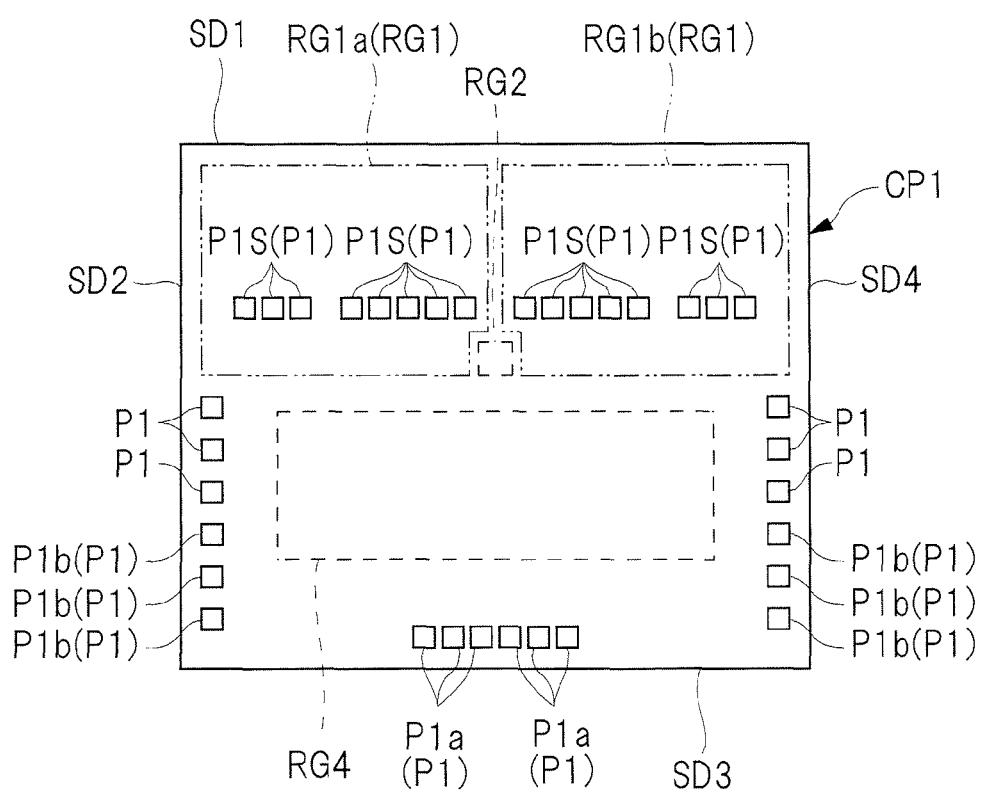
FIG. 30 is a plan view of a layout of the semiconductor chip showing a modification example of FIG. 20.

The semiconductor chip CP1 may include a plurality of the power MOSFETQ1 incorporated therein. In such a case, the semiconductor chip CP1 has a plurality of the power MOSFET forming regions RG1. For example, in the case of FIG. 30, the semiconductor chip CP1 has power MOSFET forming regions RG1a and RG1b that are equivalent to the power MOSFET forming regions RG1. FIG. 30 corresponds to a modification example of the semiconductor chip of FIG. 20. In FIG. 30, a plurality of unit transistor cells arranged in the power NOSFET forming region RG1a are connected in parallel to form the power MOSFET. Likewise, a plurality of unit transistor cells arranged in the power MOSFET forming region RG1b are connected in parallel to form the power MOSFET. The power MOSFET formed in the power MOSFET forming region RG1a and the power MOSFET formed in the power MOSFET forming region RG1b are controlled by the control circuit CLC formed in the semiconductor chip CP1. A load (equivalent to the above load LOD) is connected to (the source of) the power MOSFET formed in the power MOSFET forming region RG1a and to (the source of) the power MOSFET formed in the power MOSFET forming region RG1b.

<Examination Example>

Figure 31:
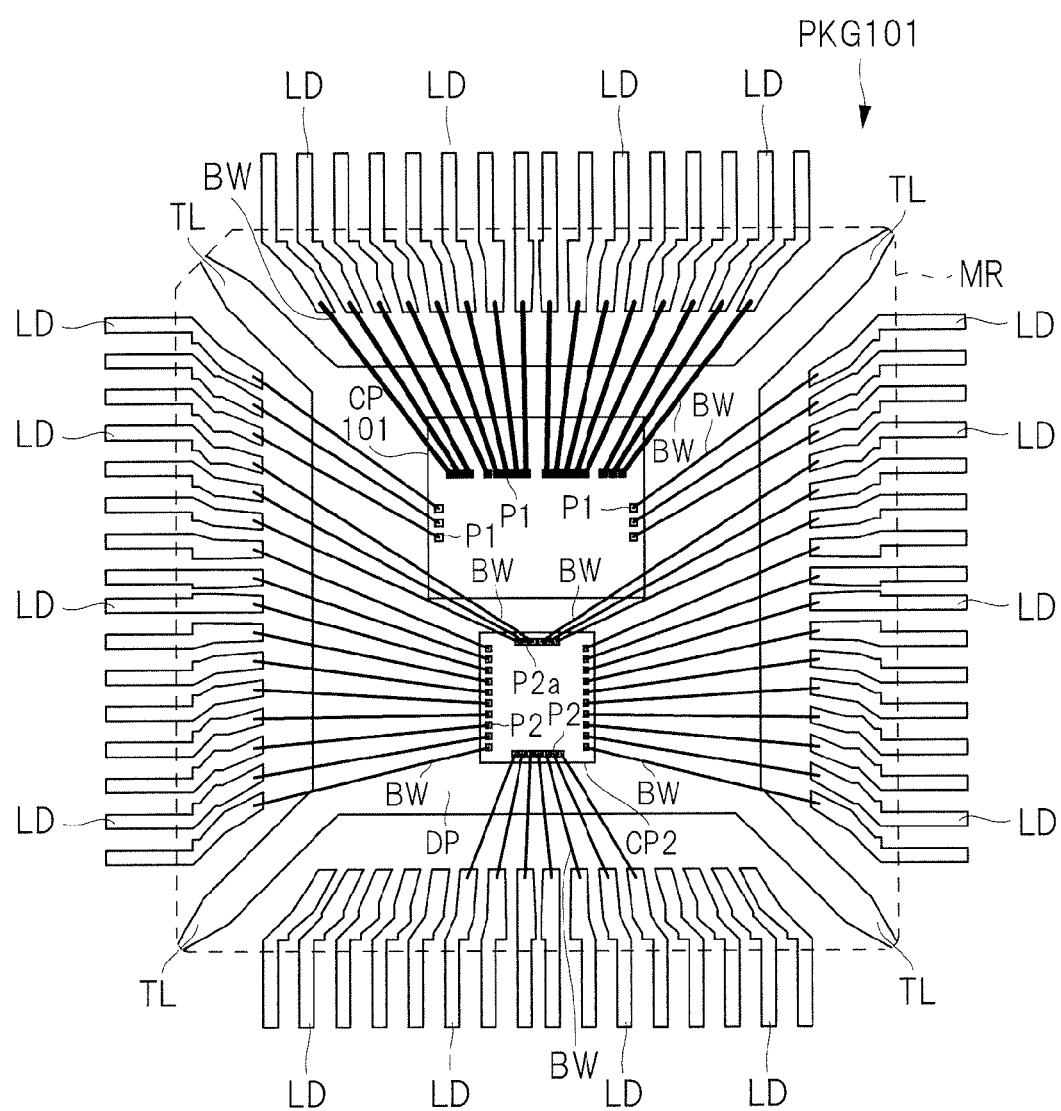
FIG. 31 is a plan perspective view of a semiconductor device of an examination example.

FIG. 31 is a plan perspective view of a semiconductor device PKG101 that is an examination example studied by the inventors, corresponding to FIG. 2 of this embodiment.

The semiconductor device PKG101 of FIG. 31 is different from the semiconductor device PKG of this embodiment in the following aspects.

That is to say, the semiconductor device PKG101 of an examination example of FIG. 31 includes a semiconductor chip CP101 in place of the semiconductor chip CP1, which semiconductor chip CP101 is mounted together with the semiconductor chip CP2 on the die pad DP. The semiconductor chip CP101 has the same built-in circuits (the control circuit CLC, power MOSFETQ1, etc.) as the semiconductor chip 1 has. The semiconductor chip CP101 has a plurality of the pad electrodes P1 but does not have pad electrodes equivalent to the pad electrodes P1a and P1b of this embodiment. The semiconductor chip CP101, therefore, does not have wirings equivalent to the internal wirings NH (wirings M1A and M2A) electrically connecting the pad electrodes P1a to the pad electrodes P1b. In terms of the configuration of the semiconductor chip CP2, however, the semiconductor device PKG101 of the examination example of FIG. 31 is basically the same as the semiconductor device PKG of this embodiment.

According to the semiconductor device PKG101 of the examination example of FIG. 31, the pad electrodes P2a of the semiconductor chip CP2 are not connected to the pad electrodes P1 of the semiconductor chip CP1 via the wires BW but are connected directly to the leads LD via the wires BW. According to the semiconductor device PKG101 of the examination example of FIG. 31, therefore, the other end of each wire EN having its one end connected to the pad electrode P2a of the semiconductor chip CP2 is connected not to the pad electrode P1 of the semiconductor chip CP1 but to the lead LD. Thus, in this configuration, the pad electrodes P2a of the semiconductor chip CP2 are electrically connected to the leads LD via the wires BW.

Figure 32:
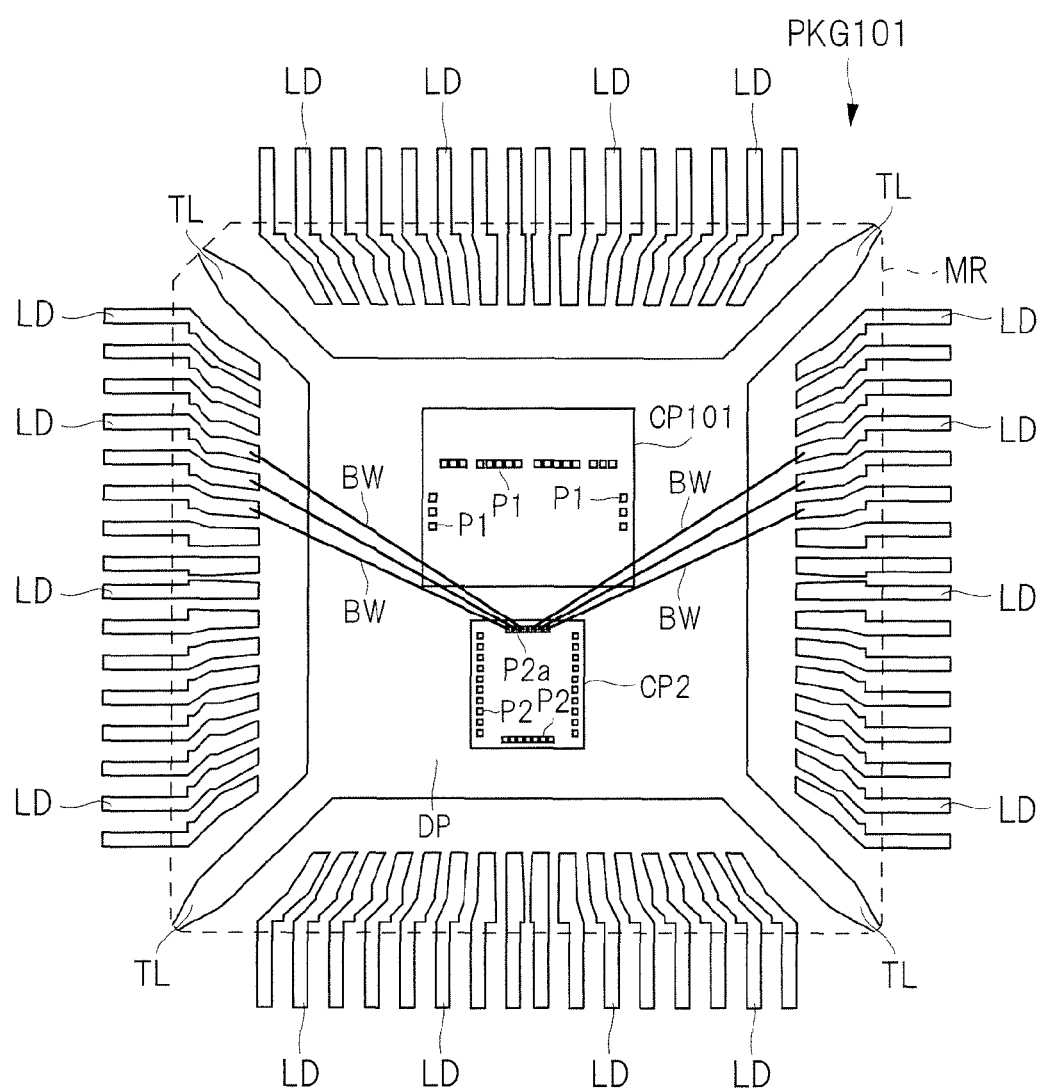
FIG. 32 is an explanatory diagram of the semiconductor device of the examination example.

FIG. 32 is an explanatory diagram of the semiconductor device PKG101 of the examination example, and shows the semiconductor device PKG101 in which the wires BW other than the wires BW connecting the pad electrodes P2a of the semiconductor chip CP2 to the leads LD are omitted from FIG. 31.

As shown in FIGS. 31 and 32, when the pad electrodes P2a of the semiconductor chip CP2 are connected directly to the leads LD via the wires BW, some of the wires BW connecting the pad electrodes P2a of the semiconductor chip CP2 to the leads LD overlap the semiconductor chip CP101 when seen in a plan view, which raises a concern that the overlapping wires BW may come in contact with the semiconductor chip CP101 and cause a short circuit. Such a case leads to a decline in the reliability of the semiconductor device PKG101. If the distance (space) between the semiconductor chip CP101 and the semiconductor chip CP2 is increased, it makes easier to prevent the wires BW connecting the pad electrodes P2a of the semiconductor chip CP2 to the leads LD from overlapping the semiconductor chip CP101. Increasing the distance (space) between the semiconductor chip CP101 and the semiconductor chip CP2, however, leads to an increase in the plane dimensions of the semiconductor device PKG101, thus inviting an increase in the size of the semiconductor device PKG101.

As shown in FIGS. 31 and 32, when the pad electrodes P2a of the semiconductor chip CP2 are connected directly to the leads LD via the wires BW, the wires BW connecting the pad electrodes P2a of the semiconductor chip CP2 to the leads LD come to have a substantial length. The longer wires BW frequently leads to wire displacement by the resin material flow (which is referred to as "wire displacement") during the molding process (the above step S5) for forming the sealing portion MR, which lowers the connection reliability of the wires BW. The wire displacement phenomenon is highly likely to cause various problems, such as short circuit between wires, a broken wire, and a wire detached from the pad electrode or lead. This leads to a decline in the reliability of the semiconductor device PKG101. For these reasons, an increase in the length of the wires BW is not desirable.

<Main Features and Effect>

Figure 33:
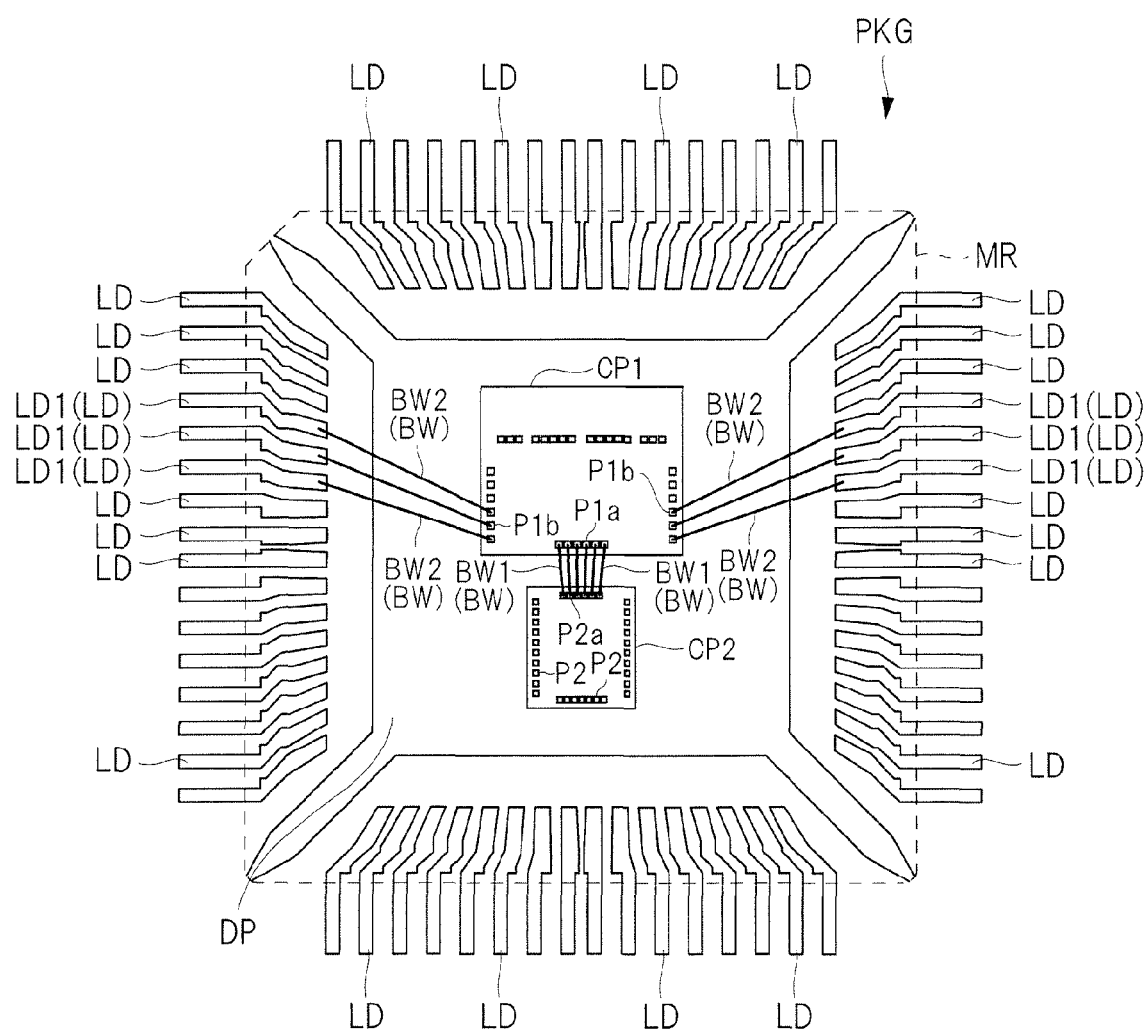
FIG. 33 is an explanatory diagram of the semiconductor device according to one embodiment.
Figure 34:
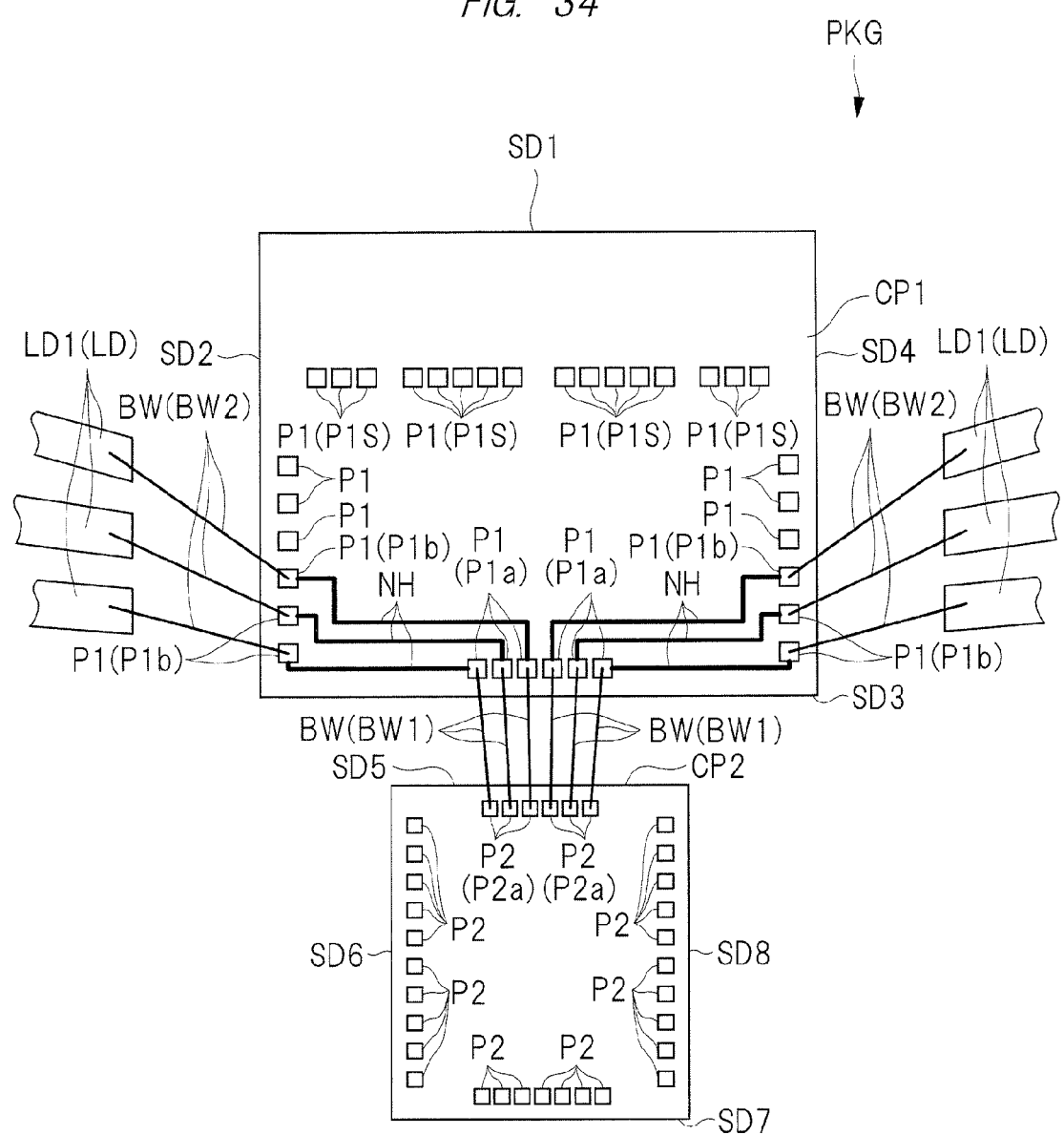
FIG. 34 is a partially enlarged plan view showing a part of FIG. 33 in an enlarged manner.

FIG. 33 is an explanatory diagram of the semiconductor device PKG of this embodiment, corresponding to a diagram of the semiconductor device PKG in which the wires (wires BW1) connecting the pad electrodes P2a of the semiconductor chip CP2 to the pad electrodes P1a of the semiconductor chip CP1 and the wires (wires BW2) connecting the pad electrodes P1b of the semiconductor chip CP1 to the leads LD are remained, as in FIG. 2, while the other wires BW are omitted from FIG. 2. FIG. 34 is a partially enlarged plan view showing a part of FIG. 33 in an enlarged manner. Of the entire leads LD included in the semiconductor device PKG, the leads LD connected to the pad electrode P1b of the semiconductor chip CP1 via the wires BW2 are denoted as LD1 and are therefore referred to as leads LD1. In FIG. 34, the front ends of the leads LD1 are shown but the other leads LD are not shown.

The semiconductor device PKG of this embodiment includes the semiconductor chip CP1 (first semiconductor chip), the semiconductor chip CP2 (second semiconductor chip), the plurality of leads LD, the plurality of wires BW, and the sealing portion (sealing body) MR sealing therein those components. Each of the leads LD included in the semiconductor device PKG has one part sealed in the sealing portion MR and the other part exposed from the sealing portion MR.

The semiconductor chip CP1 has the pad electrodes P1a (first pads), the pad electrodes P1b (second pads), and the internal wirings NH (first wirings) electrically connecting the pad electrodes P1a to the pad electrodes P1b. The semiconductor chip CP2 has the pad electrodes P2a (third pads). The pad electrodes P2a of the semiconductor chip CP2 are electrically connected to the pad electrodes P1a of the semiconductor chip CP1 via the wires BW1 (first wires) among the entire wires included in the semiconductor device PKG. The pad electrodes P1b of the semiconductor chip CP1 are electrically connected to the leads LD1 (first leads) among the entire leads LD included in the semiconductor device PKG, via the wires BW2 (second wires) among the entire wires BW included in the semiconductor device PKG. The distance between the leads LD1 and the semiconductor chip CP1 is smaller than the distance between the leads LD1 and the semiconductor chip CP2, and the pad electrodes P1a, pad electrodes P1b, and internal wirings NH are not electrically connected to any circuit formed in the semiconductor chip CP1.

The main features of this embodiment include first, second, and third features. The first feature is that the semiconductor chip CP1 has the pad electrodes P1a and P1b and the internal wirings NH electrically connecting the pad electrodes P1a and P1b, and that the pad electrodes P2a of the semiconductor chip CP2 are electrically connected to the pad electrode P1a of the semiconductor chip CP1 via the wires BW1 while the pad electrodes P1b of the semiconductor chip CP1 are electrically connected to the leads LD1 via the wires BW2. The second feature is that the pad electrodes P1a, pad electrodes P1b, and internal wirings NH are not electrically connected to any circuit formed in the semiconductor chip CP1. The third feature is that the distance between the leads LD1 and the semiconductor chip CP1 is smaller than the distance between the leads LD1 and the semiconductor chip CP2.

According to this embodiment, as the first feature, the semiconductor chip CP1 has the pad electrodes P1a and P1b and the internal wirings NH electrically connecting the pad electrodes P1a and P1b, and the pad electrodes P2a of the semiconductor chip CP2 are electrically connected to the pad electrodes P1a of the semiconductor chip CP1 via the wires BW1 while the pad electrodes P1b of the semiconductor chip CP1 are electrically connected to the leads LD1 via the wires BW2. As a result, the pad electrodes P2a of the semiconductor chip CP2 are electrically connected to the leads LD1 via the wires BW1, pad electrodes P1a of the semiconductor chip CP1, internal wirings NH, pad electrodes P1b, and wires BW2. In this configuration, respective lengths of the wires BW1 and BW2 are made smaller than the length of the wires BW connecting the pad electrodes P2a of the semiconductor chip CP2 directly to the leads LD1 (corresponding to the examination example of FIGS. 31 and 32).

That is, when the pad electrodes P2a of the semiconductor chip CP2 are connected directly to the leads LD1 via the wires BW (corresponding to the examination example of FIGS. 31 and 32), the wires BW connecting the pad electrodes P2a of the semiconductor chip CP2 to the leads LD1 come to have a substantial length.

In contrast, according to this embodiment, the pad electrodes P2a of the semiconductor chip CP2 are connected not to the leads LD but to the pad electrodes P1a of the semiconductor chip CP1 via the wires BW1, the pad electrodes P1b of the semiconductor chip CP1 are connected to the leads LD1 via the wires BW2, and the pad electrodes P1a and P1b of the semiconductor chip CP1 are connected via the internal wirings NH of the semiconductor chip CP1. Each pad electrode P2a is, therefore, electrically connected to the lead LD1 not using a signal wire but using two wires, i.e., wires BW1 and BW2, and the pad electrodes P1a and P1b are electrically connected via the internal wirings NH of the semiconductor chip CP1. As a result, respective lengths of the wires BW1 and BW2 are made smaller, which means that respective lengths of two groups of wires BW (BW1 and BW2) shown in FIG. 33 (this embodiment) are made smaller than the length of the wires BW shown in FIG. 32 (examination example).

According to this embodiment, respective lengths of the wires BW1 and BW2 are made smaller because of the third feature that the distance between the leads LD1 and the semiconductor chip CP1 is smaller than the distance between the leads LD1 and the semiconductor chip CP2. In other words, the leads LD1 are located closer to the semiconductor chip CP1 than to the semiconductor chip CP2.

In the structure of the examination example of FIGS. 31 and 32, when the pad electrodes P2a of the semiconductor chip CP2 are need to be electrically connected to the leads LD located closer to the semiconductor chip CP101 than to the semiconductor chip CP2, the length of the wires BW of FIG. 32 that connect the leads LD located closer to the semiconductor chip CP101 to the pad electrodes P2a of the semiconductor chip CP2 turns out to be substantially long.

According to this embodiment, in contrast, the pad electrodes that are connected to the leads LD1 located closer to the semiconductor chip CP1 than to the semiconductor chip CP2 via the wires BW are not the pad electrodes P2a of the semiconductor chip CP2 located farther from the leads LD1, but are the pad electrodes P1b of the semiconductor chip CP1 located closer to the leads LD1. According to this embodiment, therefore, the length of the wires BW (wires BW2) connecting the leads LD1, which are located closer to the semiconductor chip CP1 than to the semiconductor chip CP2, to the pad electrodes P1b of the semiconductor chip CP1 is made smaller.

Thus, according to this embodiment, the pad electrodes P2a of the semiconductor chip CP2 are electrically connected to the leads LD1 located closer to the semiconductor chip CP1 than to the semiconductor chip CP2, via the wires BW1, pad electrodes P1a of the semiconductor chip CP1, internal wirings NH, pad electrodes P1b, and wires BW2. As a result, according to this embodiment, respective lengths of the wires BW (BW1 and BW2) electrically connecting the pad electrodes P2a of the semiconductor chip CP2 to the leads LD1 are made smaller than the length of the wires BW connecting the pad electrodes P2a of the semiconductor chip CP2 directly to the leads LD1 (corresponding to the examination example of FIGS. 31 and 32).

In this manner, according to this embodiment, the leads LD1 connected to the pad electrode P2a of the semiconductor chip CP2 via the wires BW1 and BW2, pad electrodes P1a and P1b, and internal wirings NH are located closer to the semiconductor chip CP1 than to the semiconductor chip CP2. This corresponds to the third feature. Specifically, the distance between the leads LD1 and the semiconductor chip CP1 is smaller than the distance between the leads LD1 and the semiconductor chip CP2. In other words, the distance between the leads LD1 and the semiconductor chip CP2 is larger than the distance between the leads LD1 and the semiconductor chip CP1.

The distance between the leads LD1 and the semiconductor chip CP2 means the distance (space) between the front ends of inner leads of the leads LD1 and the semiconductor chip CP2, corresponding to the shortest distance (minimum space) between the front ends of inner leads of the leads LD1 and the semiconductor chip CP2. The distance between the leads LD1 and the semiconductor chip CP1 means the distance (space) between the front ends of inner leads of the leads LD1 and the semiconductor chip CP1, corresponding to the shortest distance (minimum space) between the front ends of the inner leads of the leads LD1 and the semiconductor chip CP1.

The semiconductor device PKG having a fourth feature in place of the third feature also offers an effect of this embodiment. Now attention is paid to the conduction path leading from the pad electrode P2a of the semiconductor chip CP2 through the wire BW1, pad electrode P1a of the semiconductor chip CP1, internal wiring NH, pad electrode P1b, and wire BW2 to the lead LD1. The fourth feature is that in this conduction path, the distance (space) between the location of connection of the wire BW2 to the lead LD1 and the pad electrode P2a of the semiconductor chip CP2 is larger than the distance between the pad electrode P2a of the semiconductor chip CP2 and the pad electrode P1a of the semiconductor chip CP1 and also larger than the distance between the location of connection of the wire BW2 to the lead LD1 and the pad electrode P1b of the semiconductor chip CP1. Herein, the distance (space) defined above is the linear distance (i.e., the length of a virtual straight line connecting two points).

When the fourth feature is realized, respective lengths of the wires BW1 and BW2 of this embodiment are made smaller than the length of the wires BW connecting the pad electrodes P2a of the semiconductor chip CP2 directly to the leads LD1 (corresponding to the examination example of FIGS. 31 and 32). That is, the length of the wires BW (BW1 and BW2) shown in FIG. 33 (this embodiment) are made smaller than the length of the wires BW shown in FIG. 32 (examination example). The semiconductor device PKG having the fourth feature in place of the third feature, therefore, offers the effect of this embodiment.

Another feature may also be realized in place of the third feature that when the front ends of inner leads of the leads LD1 are located closer to the side surface MRc1 (side indicated by the arrow YG) of the semiconductor device PKG than the extension line ES of the side SD3 of the semiconductor chip CP1 when seen in a plan view. This case also offers the effect of this embodiment (see FIG. 3). In FIG. 3, when the pad electrodes P2a of the semiconductor chip CP2 are electrically connected to the leads LD located closer to the upside of FIG. 3 (side indicated by the arrow YG) than the extension line ES, via the wires BW1, pad electrodes P1a of the semiconductor chip CP1, internal wirings NH, pad electrodes P1b, and wires BW2, the effect of this embodiment is achieved. In this case, as in the case of the third feature, respective lengths of the wires BW1 and BW2 of this embodiment are made smaller than the length of the wires BW connecting the pad electrode P2a of the semiconductor chip CP2 directly to the leads LD1 (in the examination example of FIGS. 31 and 32). That is, the length of the wires BW (BW1 and BW2) shown in FIG. 33 (this embodiment) is made smaller than the length of the wires BW shown in FIG. 32 (examination example).

According to this embodiment, the pad electrodes P1a and P1b and internal wirings NH of the semiconductor chip CP1 are formed as the conduction path for electrically connecting the pad electrodes P2a of the semiconductor chip CP2 to the leads LD1. Thus, the pad electrodes P1a and P1b and internal wirings NH are not electrically connected to any circuit formed in the semiconductor chip CP1 as the second feature.

According to this embodiment, specifically, the pad electrodes P1a and P1b and the internal wirings NH electrically connecting the pad electrodes P1a and P1b are formed intentionally in the semiconductor chip CP1, as the conductive path for electrically connecting the pad electrodes P2a of the semiconductor chip CP2 to the leads LD1. The pad electrodes P1a and P1b and the internal wirings NH electrically connecting the pad electrodes P1a and P1b are, therefore, components that the semiconductor chip CP1 can dispense with from the viewpoint of circuit configuration, and are therefore not connected to any circuit formed in the semiconductor chip CP1. According to this embodiment, the pad electrodes P2a of the semiconductor chip CP2 and the leads LD1 are not connected directly to each other via the wires BW but are connected through the bypass in the semiconductor chip CP1. For this reason, the pad electrodes P1a and P1b and the internal wirings NH, which are considered to be unnecessary from the viewpoint of circuit configuration, are formed intentionally in the semiconductor chip CP1. To put it another way, a part of the semiconductor chip CP1 (pad electrodes P1a and P1b and the internal wirings NH) is used as an interposer for electrically connecting the pad electrodes P2a of the semiconductor chip CP2 to the leads LD1. Hence the pad electrodes P2a of the semiconductor chip CP2 are electrically connected to the leads LD1 via the pad electrodes P1a and P1b and the internal wirings NH, in which case respective lengths of the wires BW1 and BW2 are made smaller than the length of the wires BW connecting the pad electrode P2a of the semiconductor chip CP2 directly to the leads LD1. That is, the length of the wires BW (BW1 and BW2) shown in FIG. 33 (this embodiment) is made smaller than the length of the wires BW shown in FIG. 32 (examination example).

As shown in FIGS. 31 and 32, when the pad electrodes P2a of the semiconductor chip CP2 are connected directly to the leads LD via the wires BW, the wires BW come to have a substantial length. The longer wires BW frequently leads to wire displacement by the resin material flow (which is referred to as "wire displacement") during the molding process (the above step S5) for forming the sealing portion MR. This lowers the connection reliability of the wires BW, thus leading to a decline in the reliability of the semiconductor device. For this reason, an increase in the length of the wires BW is not desirable.

According to this embodiment, in contrast, the length of the wires BW (BW1 and BW2) used to electrically connect the pad electrodes P2a of the semiconductor chip CP2 to the leads LD1 is made smaller than the length of the wires BW connecting the pad electrode P2a of the semiconductor chip CP2 directly to the leads LD1 (corresponding to the examination example of FIGS. 31 and 32). As a result, the wire displacement by the resin material flow during the molding process (the above step S5) for forming the sealing portion MR hardly occurs, which improves the connection reliability of the wires BW, thereby improves the reliability of the semiconductor device PKG.

As in the examination example of FIGS. 31 and 32, when the pad electrodes P2a of the semiconductor chip CP2 are connected directly to the leads LD via the wires BW, some of the wires BW connecting the pad electrodes P2a of the semiconductor chip CP2 to the leads LD overlap the semiconductor chip CP101 when seen in a plan view, which raises a concern that the overlapping wires BW may come in contact with the semiconductor chip CP101 and cause a short circuit. Such a case leads to a decline in the reliability of the semiconductor device.

According to this embodiment, in contrast, each pad electrode P2a of the semiconductor chip CP2 is not electrically connected directly to the lead LD1 by using a single wire but is electrically connected thereto via the wire BW, pad electrode P1a of the semiconductor chip CP1, internal wiring NH, pad electrode P1b, and wire BW2. Of the wires BW1 and BW2 necessary for electrically connecting the pad electrode P2a of the semiconductor chip CP2 to the lead LD1, the wire BW1 connects the pad electrode P2a of the semiconductor chip CP2 to the pad electrode P1a of the semiconductor chip CP1 and the wire BW2 connects the pad electrode P1b of the semiconductor chip CP1 to the lead LD1. According to this embodiment, therefore, the wire BW connecting the pad electrode P2a of the semiconductor chip CP2 directly to the lead LD1 is not used for electrically connecting the pad electrode P2a of the semiconductor chip CP2 to the lead LD1. This prevents a case where the wire connecting the pad electrodes P2a of the semiconductor chip CP2 directly to the lead LD1 overlaps the semiconductor chip CP1 when seen in a plan view, thus certainly preventing a case where a wire not supposed to be connected to the semiconductor chip CP1 comes in contact with the semiconductor chip CP1 and causes a short circuit. As a result, the reliability of the semiconductor device PKG is improved.

It is more preferable that this embodiment further include the following features.

It is preferable that on the surface (main surface) of the semiconductor chip CP1, the pad electrodes P1a are arranged on the side SD3 facing the semiconductor chip CP2 and that on the surface (main surface) of the semiconductor chip CP2, the pad electrodes P2a are arranged on the side SD5 facing the semiconductor chip CP1. It is preferable, specifically, that on the outer periphery of the surface (main surface) of the semiconductor chip CP1, the pad electrodes P1a are arranged on the side SD3 facing the semiconductor chip CP2 and that on the outer periphery of the surface (main surface) of the semiconductor chip CP2, the pad electrodes P2a are arranged on the side SD5 facing the semiconductor chip CP1. As a result of this arrangement, the pad electrodes P1a of the semiconductor chip CP1 are arranged so as to face the pad electrodes P2a of the semiconductor chip CP2, which facilitates connection of the pad electrodes P1a of the semiconductor chip CP1 to the pad electrodes P2a of the semiconductor chip CP2 via the wires BW1. Hence the pad electrodes P1a of the semiconductor chip CP1 are connected easily and accurately to the pad electrodes P2a of the semiconductor chip CP2 via the wires BW1.

It is preferable that on the surface (main surface) of the semiconductor chip CP1, the pad electrodes P1b are arranged on a side other than the side SD3 facing the semiconductor chip CP2. It is preferable, specifically, that on the outer periphery of the surface (main surface) of the semiconductor chip CP, the pad electrodes P1b are arranged on the side other than the side SD3 facing the semiconductor chip CP2. It is therefore preferable that on the surface (main surface) of the semiconductor chip CP1, the pad electrodes P1b are arranged not on the side SD3 but on any one of the sides SD1, SD2, and SD4. This facilitates connection of the pad electrodes P1b of the semiconductor chip CP1 to the leads LD1 via the wires BW2. Hence the pad electrodes P1b of the semiconductor chip CP1 are connected easily and accurately to the leads LD1 via the wires BW2. In the cases of FIGS. 2, 3, 9, and 20, groups of the pad electrodes P1b are arranged on the sides SD2 and SD4 on the surface (main surface) of the semiconductor chip CP1, respectively.

It is therefore more preferable that on the surface (main surface) of the semiconductor chip CP1, the pad electrodes P1a are arranged on the side SD3 facing the semiconductor chip CP2 while the pad electrodes P1b are arranged on a side other than the side SD3, and that on the surface (main surface) of the semiconductor chip CP2, the pad electrodes P2a are arranged on the side SD5 facing the semiconductor chip CP1. In this configuration, the pad electrodes P2a of the semiconductor chip CP2 are connected easily and accurately to the leads LD1 via the wires BW1, pad electrodes P1a of the semiconductor chip CP1, internal wirings NH, pad electrodes P1b, and wires BW2.

It is preferable that the pad electrodes P1b arranged on the side SD2 of the semiconductor chip CP1 are electrically connected to the leads LD1 arranged on the side surface (side) MRc2 of the sealing portion MR, via the wires BW2. It is also preferable that the pad electrodes P1b arranged on the side SD4 of the semiconductor chip CP1 are electrically connected to the leads LD1 arranged on the side surface (side) MRc4 of the sealing portion MR, via the wires BW2. If any pad electrode P1b is arranged on the side SD1 of the semiconductor chip CP1, the pad electrode P1b should preferably be electrically connected to the lead LD1 arranged on the side surface (side) MRc1 of the sealing portion MR, via the wire BW2. This means that the pad electrodes P1b and leads LD1 electrically connected to each other via the wires BW2 should preferably be arranged such that each lead LD1 is located on the side surface (side) of the sealing portion MR that extends along (faces) the side of semiconductor chip CP1 along which the pad electrode P1b to be connected to the lead LD1 is arranged. This arrangement facilitates connection of the pad electrodes P1b of the semiconductor chip CP1 to the leads LD1 via the wires BW2. Hence the pad electrodes P1b of the semiconductor chip CP1 are connected easily and accurately to the leads LD1 via the wires BW2.

The semiconductor device PKG of this embodiment includes at least one conduction path composed of the pad electrode P2a, wire BW1, pad electrode P1a, internal wiring NH, pad electrode P1b, wire BW2, and lead LD1, and may include a plurality of such conductive paths. In such a case, the pad electrodes P1b may be arranged along a plurality of sides (sides SD2 and SD4 in this embodiment) of the semiconductor chip CP1, respectively. By arranging the pad electrodes P1b in such a manner, the leads LD1 are arranged along a plurality of side surfaces of the semiconductor device PKG (side surfaces MRc2 and MRc4 in this embodiment), respectively.

According to this embodiment, it is preferable that in the semiconductor chip CP1, the internal wirings NH electrically connecting the pad electrodes P1a and P1b are formed along the outer periphery of the semiconductor chip CP1. It is also preferable that the sealing ring SR is formed on the semiconductor chip CP1. In the case of forming the sealing ring SR on the semiconductor chip CP1, the internal wirings NH electrically connecting the pad electrodes P1a and P1b should preferably be formed inside and along the seal ring SR on the semiconductor chip CP1 (see FIGS. 21, 27, and 28).

The above configuration prevents a case where when various circuits (control circuit CLC, power MOSFETQ1, and sense MOSFETQ2 in this embodiment) are formed on the semiconductor chip CP1, the internal wirings NH electrically connecting the pad electrodes P1a and P1b become an obstacle to the formation of the circuits. This suppresses an increase in the area of the semiconductor chip CP1 which results from providing the semiconductor chip CP1 with the pad electrodes P1a and P1b and with the internal wirings NH electrically connecting the pad electrodes P1a and P1b, thus allowing a reduction in the size (area) of the semiconductor chip CP1. As a result, a reduction in the size of the semiconductor device PKG is realized. The reduction in the size (area) of the semiconductor chip CP1 allows a reduction in the manufacturing cost of the semiconductor chip CP1, thus leading to a reduction in the manufacturing cost of the semiconductor device PKG.

In the semiconductor chip CP1, when the internal wiring NH (first wiring) electrically connecting the pad electrodes P1a and P1b includes the wiring M2A (third wiring) and the wiring M1A (fourth wiring) on the layer below the wiring M2A, it is preferable that the thickness (T2) of the wiring M2A is larger than the thickness (T1) of the wiring M1A and that the width (W1) of the wiring M1A is larger than the width (W2) of the wiring M2A (see FIGS. 27 to 29). The wiring M2A is formed on the same layer where the pad electrode P1a or P1b is formed. The wiring M1A smaller in thickness than the wiring M2A is increased in its width Ni to suppress its resistance (wiring resistance). The wiring M2A larger in thickness than the wiring M1A, in contrast, is reduced in its width W2 to reduce the area of a plane region in which the wiring M2A is placed. As a result, the pad electrode P1a can be electrically connected to the pad electrode P1b through the wiring with lower resistance, and the semiconductor chip CP1 can be reduced in size (area).

<Modification Example>

A modification example of the semiconductor device PKG of this embodiment will then be described.

Figure 35:
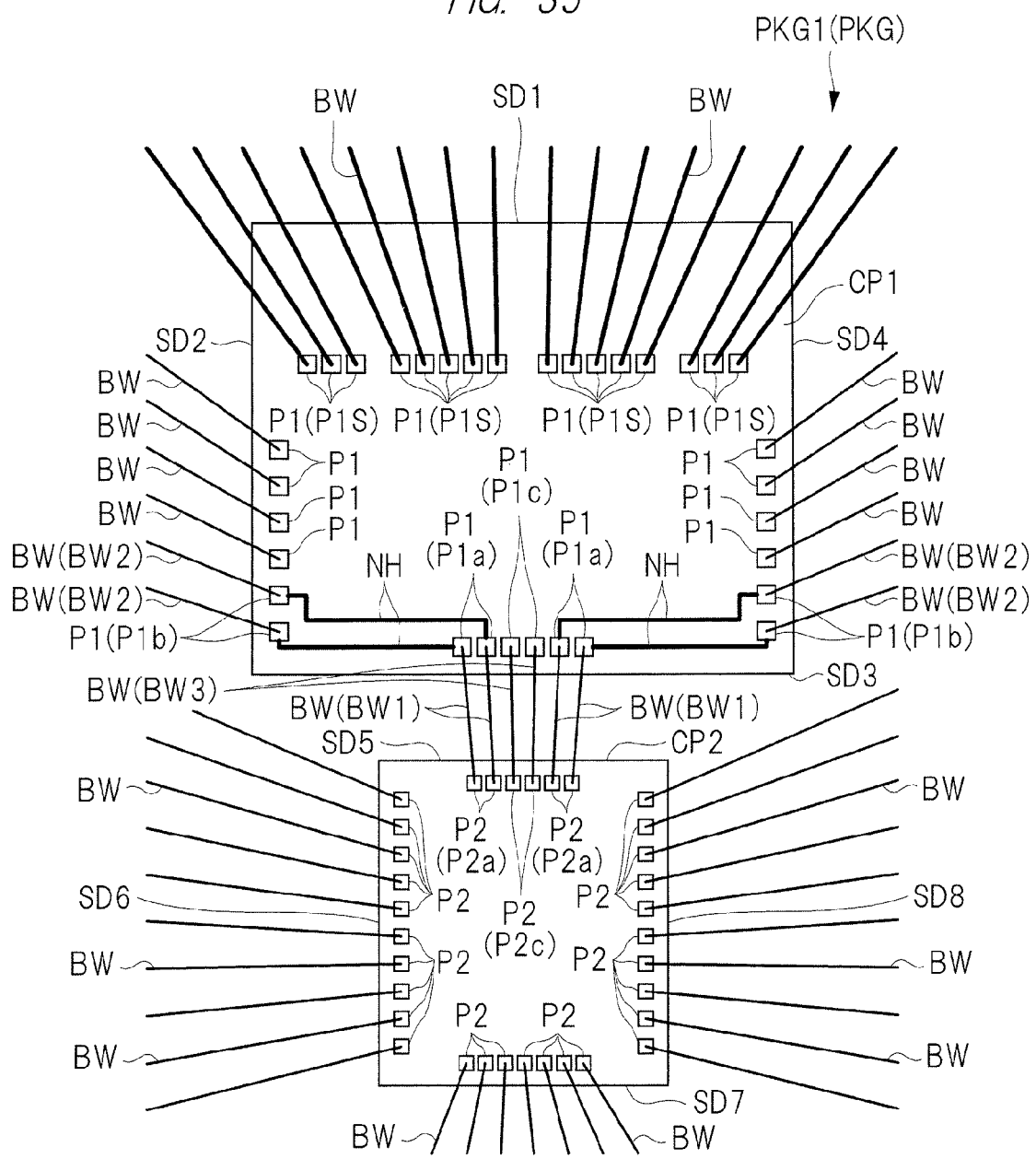
FIG. 35 is a partially enlarged plan perspective view showing a modification example of the semiconductor device according to one embodiment of the present invention.
Figure 36:
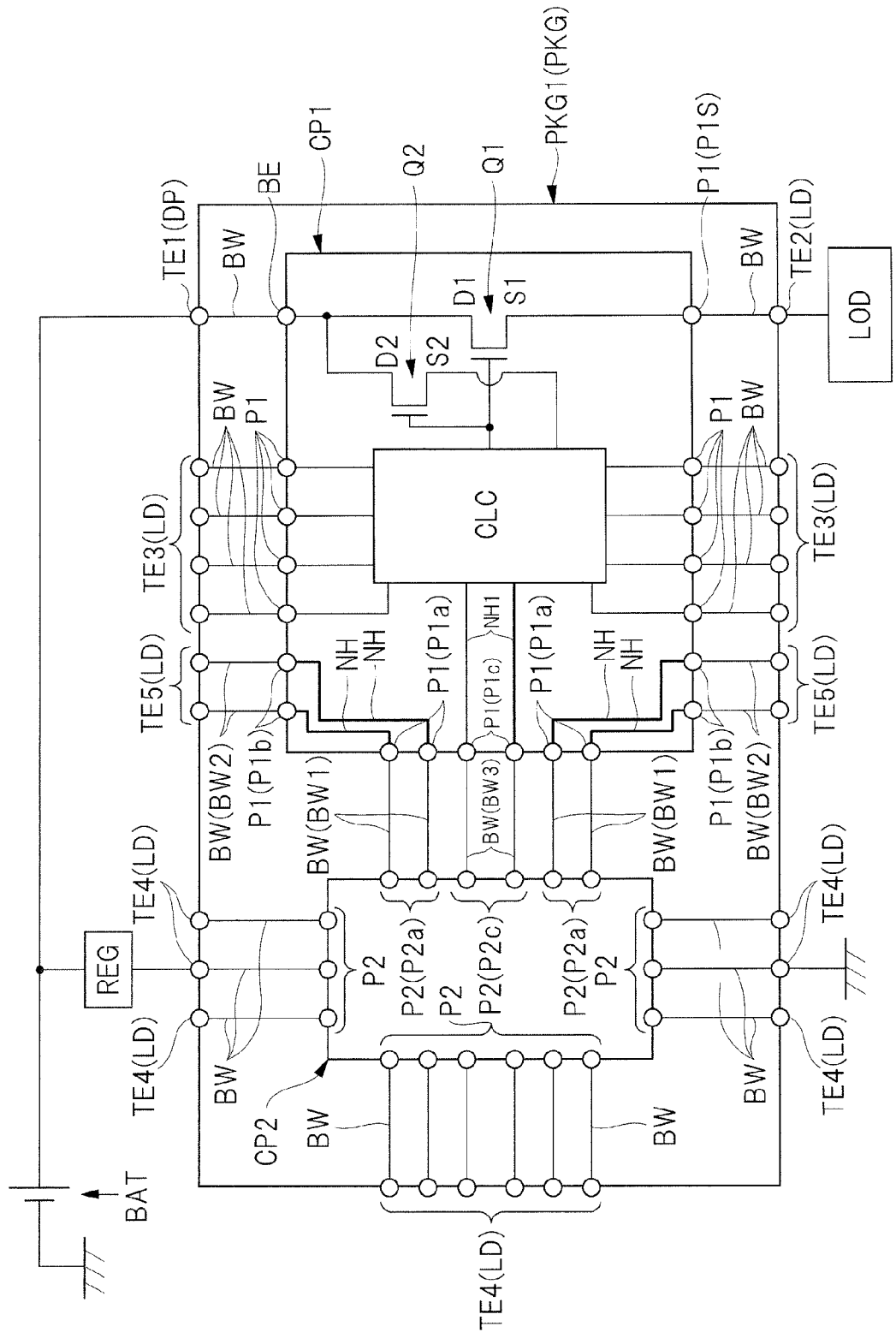
FIG. 36 is a circuit diagram showing a modification example of the semiconductor device according to one embodiment of the present invention.

FIG. 35 is a partially enlarged plan perspective view showing a modification example of the semiconductor device PKG of this embodiment, corresponding to FIG. 9. FIG. 36 is a circuit diagram (circuit: block diagram) showing the modification example of the semiconductor device PKG of this embodiment, corresponding to FIG. 19. The modification example of the semiconductor device PKG of FIGS. 35 and 36 will hereinafter be denoted by PKG1 and therefore be referred to as a semiconductor device PKG1.

The semiconductor device PKG1 in the modification example of FIGS. 35 and 36 is different from the above-described semiconductor device PKG in the following aspects.

According to the semiconductor device PKG, of the entire pad electrodes P1 of the semiconductor chip CP1, all the pad electrodes P1 electrically connected to the pad electrodes P2 of the semiconductor chip CP2 via the wires BW are the pad electrodes P1a, which are not electrically connected to a circuit in the semiconductor chip CP1 but are electrically connected to the leads LD1 via the internal wirings NH, pad electrodes P1b, and wires BW2.

In contrast, according to the semiconductor device PKG1 in the modification example of FIGS. 35 and 36, of the entire pad electrodes P1 of the semiconductor chip CP1, the pad electrodes P1 electrically connected to the pad electrodes P2 of the semiconductor chip CP2 via the wires BW include the pad electrodes P1a and also include pad electrodes P1c. The pad electrodes P1a are electrically connected to the pad electrodes P1b via the internal wirings NH of the semiconductor chip CP1, but the pad electrodes P1c are electrically connected to any one of circuits (control circuit CLC in this embodiment) formed in the semiconductor chip CP1 via internal wirings (NH1) of the semiconductor chip CP1. In the semiconductor chip CP1, the internal wirings (NH1) electrically connecting the pad electrodes P1c to the circuit (control circuit CLC in this embodiment) in the semiconductor chip CP1 are formed by the wirings M1 and M2.

Of the entire pad electrodes P2 of the semiconductor chip CP2, the pad electrodes P2 electrically connected to the pad electrodes P1a of the semiconductor chip CP1 via the wires BW (BW1) correspond to the pad electrodes P2a, and the pad electrodes P2 electrically connected to the pad electrodes P1c of the semiconductor chip CP1 via wires BW (BW3) correspond to pad electrodes P2c. Of the entire wires BW, the wires BW electrically connecting the pad electrodes P2a of the semiconductor chip CP2 to the pad electrodes P1a of the semiconductor chip CP1 correspond to the wires BW1, and the wires BW electrically connecting the pad electrodes P2c of the semiconductor chip CP2 to the pad electrodes P1c of the semiconductor chip CP1 correspond to the wires BW3.

That is, according to the semiconductor device PKG1 in the modification example of FIGS. 35 and 36, the pad electrodes P2a of the semiconductor chip CP2 are electrically connected to the pad electrodes P1a of the semiconductor chip CP1 via the wires BW1, further to the pad electrodes P1b of the semiconductor chip CP1 via the internal wirings NH of the semiconductor chip CP1, and further to the leads LD1 via the wires BW2. The semiconductor device PKG1 in the modification example thus includes at least one conduction path composed of the pad electrode P2a, wire BW1, pad electrode P1a, internal wiring NH, pad electrode P1b, wire BW2, and lead LD1, and the semiconductor device PKG1 shown in FIGS. 35 and 36 includes four of such conductive paths.

According to the semiconductor device PKG1 in the modification example, the pad electrodes P2c of the semiconductor chip CP2 are electrically connected to the pad electrodes P1c of the semiconductor chip CP1 via the wires BW3, and further to the circuit (control circuit CLC in this embodiment) in the semiconductor chip CP1 via the internal wirings (NH1) of the semiconductor chip CP1. The semiconductor device PKG1 in the modification example, thus includes at least one conduction path leading from the pad electrode P2c of the semiconductor chip CP2 through the wire BW3, pad electrode P1c, and internal wiring (NH1) of the semiconductor chip CP1 to the circuit (control circuit CLC in this embodiment) in the semiconductor chip CP1, and the semiconductor device PKG1 shown in FIGS. 35 and 36 includes two of such conductive paths.

In other words, the semiconductor device PKG of the above-described embodiment further includes additional conduction paths each of which leads from the pad electrode P2c of the semiconductor chip CP2 through the wire BW3 connecting the pad electrodes P2c and P1c, pad electrode P1c of the semiconductor chip CP1, and internal wiring (NH1) of the semiconductor chip CP1 to the circuit (control circuit CLC in this embodiment) in the semiconductor chip CP1, and the semiconductor device PKG including such additional conduction paths is equivalent to the semiconductor device PKG1 of the modification example.

The semiconductor device PKG1 in the modification example is almost identical with the semiconductor device PKG in other configurations.

Similar to the semiconductor device PKG, the semiconductor device PKG1 in the modification example includes the conduction paths each of which leads from the pad electrode P2a of the semiconductor chip CP2 through the wire BW1, pad electrode P1a of the semiconductor chip CP1, internal wiring NH, pad electrode P1b, and wire BW2 to the lead LD1, and therefore offers the effect almost the same as the effect offered by the semiconductor device PKG.

In the foregoing, the invention made by the inventors of the present invention has been concretely described based on the embodiments. However, it is needless to say that the present invention is not limited to the foregoing embodiments and various modifications and alterations can be made within the scope of the present invention.

Part of the descriptive contents of the above-described embodiment will be noted below.

[Additional Note 1]

A manufacturing method for a semiconductor device comprising the steps of:

(a) arranging a first semiconductor chip and a second semiconductor chip side by side on a chip mounting portion, the first semiconductor chip having a first pad, a second pad, and a first wiring electrically connecting the first and second pads, and the second semiconductor chip having a third pad;

(b) electrically connecting the third pad of the second semiconductor chip to the first pad of the first semiconductor chip via a first wire and electrically connecting the second pad of the first semiconductor chip to a first lead via a second wire; and (c) forming a sealing body sealing the first and second semiconductor chips, part of the first lead, and the first and second wires, wherein a distance between the first lead and the first semiconductor chip is smaller than a distance between the first lead and the second semiconductor chip, and the first pad, the second pad, and the first wiring are not connected to any circuit formed in the first semiconductor chip.

[Additional Note 2]

The manufacturing method for the semiconductor device according to additional note 1, wherein the first semiconductor chip has a back surface electrode, and at the step (a), the back surface electrode of the first semiconductor chip is bonded to the chip mounting portion via a conductive first bond, and a back surface of the second semiconductor chip is bonded to the chip mounting portion via an insulating second bond.

[Additional Note 3]

The manufacturing method for the semiconductor device according to additional note 2, wherein, at the step (a), the back surface electrode of the first semiconductor chip is bonded to the chip mounting portion via the first bond and then the back surface of the second semiconductor chip is bonded to the chip mounting portion via the second bond.

[Additional Note 4]

The manufacturing method for the semiconductor device according to additional note 3, wherein the first semiconductor chip includes a power transistor and a control circuit that controls the power transistor, and the second semiconductor chip is a semiconductor chip that controls the first semiconductor chip.

What is claimed is:

1. A semiconductor device comprising:
   a first semiconductor chip having a main surface and a back surface opposite the main surface;
   a second semiconductor chip having a main surface and a back surface opposite the main surface;
   a plurality of leads;
   a plurality of wires; and
   a sealing body sealing the first and second semiconductor chips, part of each of the plurality of leads, and the plurality of wires, wherein a first pad, a second pad, and a first wiring electrically connected to the first and second pads are formed on the main surface of the first semiconductor chip, a third pad is formed on the main surface of the second semiconductor chip, the third pad of the second semiconductor chip is electrically connected to the first pad of the first semiconductor chip via a first wire among the plurality of wires, the second pad of the first semiconductor chip is electrically connected to a first lead among the plurality of leads via a second wire among the plurality of wires, in a plan view, a distance between an end portion of the first lead and a side of the first semiconductor chip facing the end portion of the first lead is smaller than a distance between the end portion of the first lead and a side of the second semiconductor chip facing the end portion of the first lead, and the first pad, the second pad, and the first wiring are not connected to any circuit formed in the first semiconductor chip, wherein the first wiring is formed along an outer periphery of the first semiconductor chip, wherein the first wiring includes a third wiring and a fourth wiring formed on a layer below the third wiring, wherein the third wiring has a substantially uniform thickness and width throughout, and the fourth wiring has a substantially uniform thickness and width throughout, wherein, in a direction perpendicular to the main surface of the first semiconductor chip, the third wiring is larger in thickness than the fourth wiring, and in a direction parallel to the main surface of the first semiconductor chip, the fourth wiring is larger in width than the third wiring, and wherein the third wiring is formed on the same layer where the first pad or second pad is formed.

2. The semiconductor device according to claim 1, further comprising:

a chip mounting portion mounting the first and second semiconductor chips thereon, wherein the first and second semiconductor chips are arranged side by side on the chip mounting portion, the sealing body seals therein part of the chip mounting portion, and the plurality of leads are arranged along a periphery of the chip mounting portion.

3. The semiconductor device according to claim 2, wherein the first semiconductor chip includes a plurality of circuits, and the second semiconductor chip is a semiconductor chip that controls the first semiconductor chip.

4. The semiconductor device according to claim 2, wherein the first semiconductor chip includes a power transistor and a control circuit that controls the power transistor, and the second semiconductor chip controls the first semiconductor chip.

5. The semiconductor device according to claim 1, further comprising:

a chip mounting portion mounting the first and second semiconductor chips thereon, wherein a back surface electrode is formed on the back surface of the first semiconductor chip, the back surface electrode of the first semiconductor chip is bonded to the chip mounting portion via a conductive first bond, and the back surface of the second semiconductor chip is bonded to the chip mounting portion via an insulating second bond.

6. The semiconductor device according to claim 1, wherein, in a plan view from the main surface of the first semiconductor chip, the first pad is arranged on a first side facing the second semiconductor chip, and in a plan view from the main surface of the second semiconductor chip, the third pad is arranged on a second side facing the first semiconductor chip.

7. The semiconductor device according to claim 6, wherein, in the plan view from the main surface of the first semiconductor chip, the second pad is arranged on a third side other than the first side.

8. The semiconductor device according to claim 7, wherein the first lead is arranged on a first side surface of the sealing body, the first side surface extending along the third side of the first semiconductor chip.

9. The semiconductor device according to claim 1, wherein a fourth pad is formed on the main surface of the first semiconductor chip, a fifth pad is formed on the main surface of the second semiconductor chip, the fifth pad of the second semiconductor chip is electrically connected to the fourth pad of the first semiconductor chip via a third wire among the plurality of wires, and the fourth pad of the first semiconductor chip is electrically connected to a circuit in the first semiconductor chip via a second wiring formed in the first semiconductor chip.

10. The semiconductor device according to claim 1, wherein the first semiconductor chip has a seal ring formed thereon, and in the first semiconductor chip, the first wiring is formed inside and partially along the seal ring.

* * * * *